United States Patent
Colleran et al.

(10) Patent No.: US 11,790,144 B2
(45) Date of Patent: Oct. 17, 2023

(54) FAST, EFFICIENT REAL-TIME ELECTRO-MAGNETIC SYSTEMS SIMULATOR THAT DYNAMICALLY ACCEPTS USER INPUT

(71) Applicant: Elloveo, Inc., Los Angeles, CA (US)

(72) Inventors: David M. Colleran, Altadena, CA (US); Carlos Manuel Godino Fernandez, Pasadena, CA (US)

(73) Assignee: Elloveo, Inc., Los Angeles, CA (US)

( * ) Notice: Subject to any disclaimer, the term of this patent is extended or adjusted under 35 U.S.C. 154(b) by 476 days.

(21) Appl. No.: 16/159,660

(22) Filed: Oct. 13, 2018

(65) Prior Publication Data

US 2020/0117767 A1    Apr. 16, 2020

(51) Int. Cl.
*G06F 30/367* (2020.01)
*G06Q 50/20* (2012.01)
*G06F 3/0482* (2013.01)

(52) U.S. Cl.
CPC .......... *G06F 30/367* (2020.01); *G06F 3/0482* (2013.01); *G06Q 50/20* (2013.01)

(58) Field of Classification Search
CPC .............................. G06F 30/367; G06F 3/0482
See application file for complete search history.

(56) References Cited

U.S. PATENT DOCUMENTS 5,642,087 A    6/1997   Crow
6,269,277 B1   7/2001   Hershenson et al.
(Continued)

FOREIGN PATENT DOCUMENTS

CN    101727653 A    6/2010
CN    102855797 A    1/2013
(Continued)

OTHER PUBLICATIONS

Dalzell, "Cycloidal Path of a Charged Particle in Uniform Perpendicular Electric and Magnetic Fields" (Jan. 2012), p. 1 [retrieved from https://demonstrations.wolfram.com/CycloidalPathOfAChargedParticleInUniformPerpendicularElectri/].*
(Continued)

*Primary Examiner* — Brian W Wathen
(74) *Attorney, Agent, or Firm* — Compass IP Law PC

(57) ABSTRACT

A method is described. The method includes calculating electric and/or magnetic fields in free space in response to: i) respective positions and motions of one or more charges and/or one or more current loops in the free space; ii) charges on nodes in the electrical circuit in the free space; iii) charge motions in the electrical circuit. The method includes calculating new respective positions and motions of the one or more charges and/or one or more current loops in the free space in response to respective forces applied to the one or more charges and/or the one or more current loops by the electric and/or magnetic fields. The method includes calculating new charges on nodes within the electrical circuit and new charge motions within the electrical circuit in response to the new positions and motions of the one or more charges and/or one or more current loops in free space, the charges on the nodes in the electrical circuit and the charge motions in the electrical circuit. The method includes concurrently rendering on a display of the computing system respective images of the one or more charges and/or one or more current loops according to the new respective positions and motions and the new charge motions within the electrical circuit. The method includes repeating the above to fluidly render on the display respective inter-active behaviors of the one or more charges and/or the one or more magnetic current loop in the free space and the charge motions in the electrical circuit.

42 Claims, 36 Drawing Sheets

(56) References Cited

U.S. PATENT DOCUMENTS

| | | | |
|---|---|---|---|
| 6,954,921 | B2 | 10/2005 | Hassibi et al. |
| 7,065,727 | B2 | 6/2006 | Hershenson et al. |
| 7,093,205 | B2 | 8/2006 | Heydler et al. |
| 7,299,459 | B1 | 11/2007 | Boyd et al. |
| 7,304,544 | B2 | 12/2007 | Colleran et al. |
| 7,458,041 | B2 | 11/2008 | Hershenson et al. |
| 7,703,050 | B2 | 4/2010 | Hershenson et al. |
| 7,783,996 | B2 | 8/2010 | Hershenson et al. |
| 8,307,309 | B1 | 11/2012 | Hershenson et al. |
| 8,407,651 | B2 | 3/2013 | Hershenson et al. |
| 8,635,564 | B2 | 1/2014 | Hershenson et al. |
| 8,886,497 | B1 | 11/2014 | Vold |
| 8,910,088 | B2 | 12/2014 | Hershenson et al. |
| 8,924,911 | B2 | 12/2014 | Colleran et al. |
| 10,163,236 | B1 * | 12/2018 | Pratt ..................... G06T 11/206 |
| 2002/0042698 | A1 | 4/2002 | Meuris et al. |
| 2009/0012759 | A1 * | 1/2009 | Meuris .................... G06F 17/13 703/2 |
| 2011/0270593 | A1 * | 11/2011 | Meuris .................... G06F 17/13 703/2 |
| 2012/0022833 | A1 | 1/2012 | Sasaki |
| 2013/0231879 | A1 * | 9/2013 | Ichishima ............... G01R 33/00 702/57 |
| 2015/0127283 | A1 * | 5/2015 | Miyazaki ............... G01N 27/72 702/65 |

FOREIGN PATENT DOCUMENTS

| | | |
|---|---|---|
| CN | 103440163 A | 12/2013 |
| CN | 104299493 B | 1/2017 |
| CN | 106484804 A | 3/2017 |
| EP | 1168191 A1 | 1/2002 |
| JP | 2002149715 A | 5/2002 |
| JP | 2012037321 A | 2/2012 |
| KR | 1020160095224 A | 8/2016 |

OTHER PUBLICATIONS

International Search Report and Written Opinion for PCT Patent Application No. PCT/US2019/55719, dated Feb. 5, 2020, 10 pages.

Tambade, Popat S., "Trajectory of Charged Particle in Combined Electric and Magnetic Fields Using Interactive Spreadsheets", European Journal of Physics Education, vol. 2, No. 2, 2011, The Learning and Technology Library, https://www.learntechlib.org.

Australian First Examination Report for Patent Application No. 2019357720, dated Mar. 16, 2022, 2 pages.

Colleran, David, "Review of Electro-Magnetic Real Time Simulators", Oct. 12, 2018, 3 pages, Elloveo, Inc.

Ohannessian, Mesrob I., "Simulation and Visualization of Fields and Energy Flows in Electric Circuits with Idealized Geometries", Jun. 2005, 64 pages, Department of Civil and Environmental Engineering, Massachusetts Institute of Technology.

Extended European Search Report for Patent Application No. 19871109.5, dated Jun. 10, 2022, 9 pages.

Tambade Popat S: "Trajectory of Charged Particle in Combined Electric and Magnetic Fields Using Interactive Spreadsheets", European Journal of Physics Education, vol. 2, No. 2, Apr. 2, 2011 (Apr. 2, 2011), pp. 49-59, XP055804565, ISSN: 1309-7202 * pp. 50-54 *.

English Translation of the Response to Second Notice of Preliminary Rejection for Korean Patent Application No. 10-2021-7010944, dated Jan. 13, 2023, 7 pages.

English Translation of the Second Notice of Preliminary Rejection for Korean Patent Application No. 10-2021-7010944, dated Jan. 13, 2023, 4 pages.

Australian Notice of Allowance for Patent Application No. 2019357720, dated Nov. 10, 2022, 3 pages.

Chinese and English translation of Notice of Allowance for Chinese Patent Application No. 201980067512.0, dated Oct. 26, 2022, 13 pages.

Response to the EPO communication pursuant to Rules 70(2) and 70a(2) EPC dated Jun. 28, 2022 filed on Dec. 29, 2022 for European Patent Application No. 19871109.5, 16 pages.

Bhargava, B A, et al., "A Charged Particle in Perpendicular Electric and Magnetic Fields", Resonance—Journal of Science Education, vol. 21, Issue 11, Think it Over, Nov. 2016, 3 pages.

Lewins, J.D., "On the Motion of Charged Particles in a Varying Magnetic Field", International Journal of Engineering Science, vol. 33, No. 10, pp. 1491-1505, 1995.

Yanlei, Liu, et al., "MATLAB Simulation of Electric Field Lines and Equipotential Surfaces of Point Charge System", Science and Technology Innovation Herald, 2012 No. 15, 8 pages.

Korean and English Translation of Korean Final Office Action for Patent Application No. 10-2021-7010944), dated Jul. 4, 2023, 9 pages.

* cited by examiner

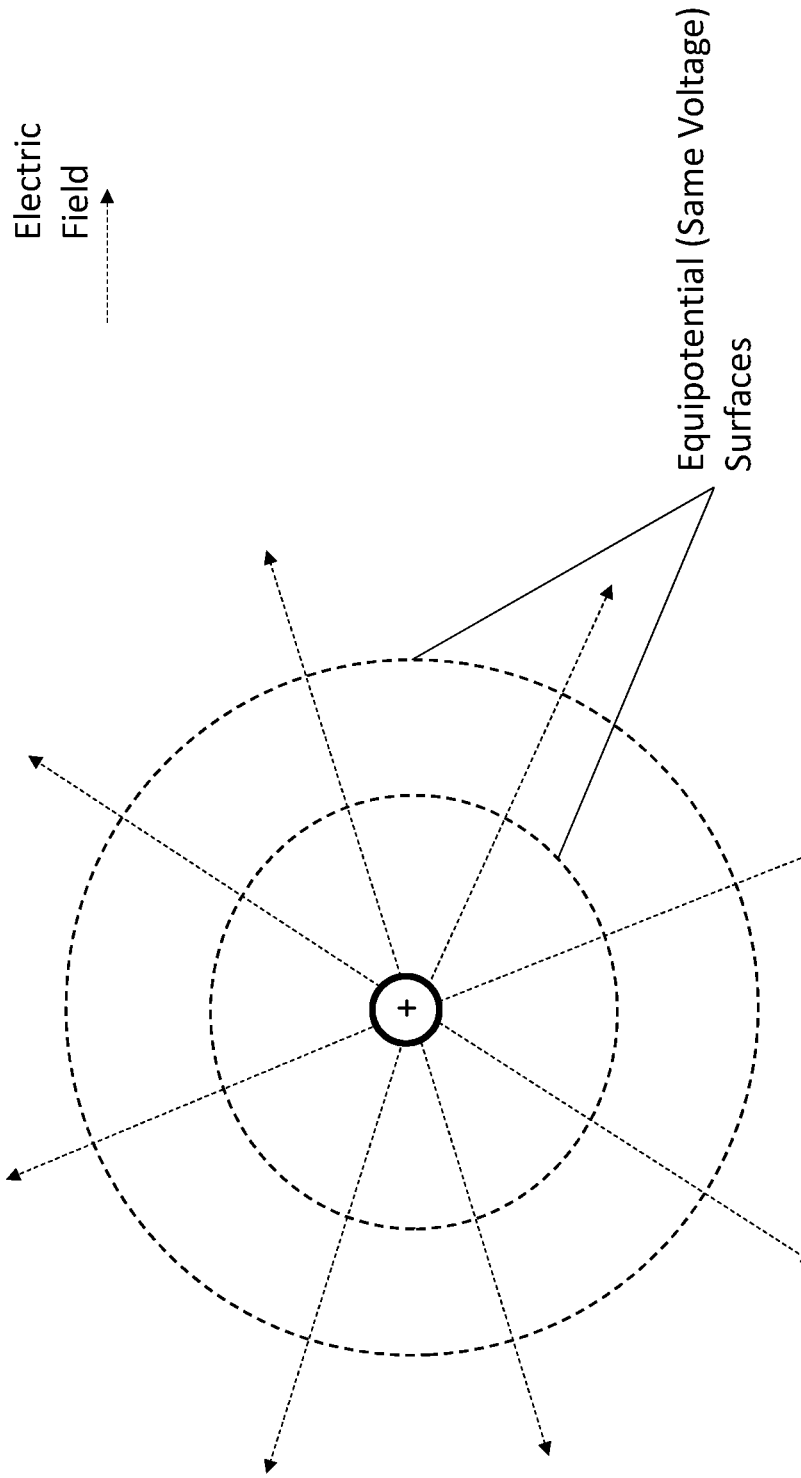

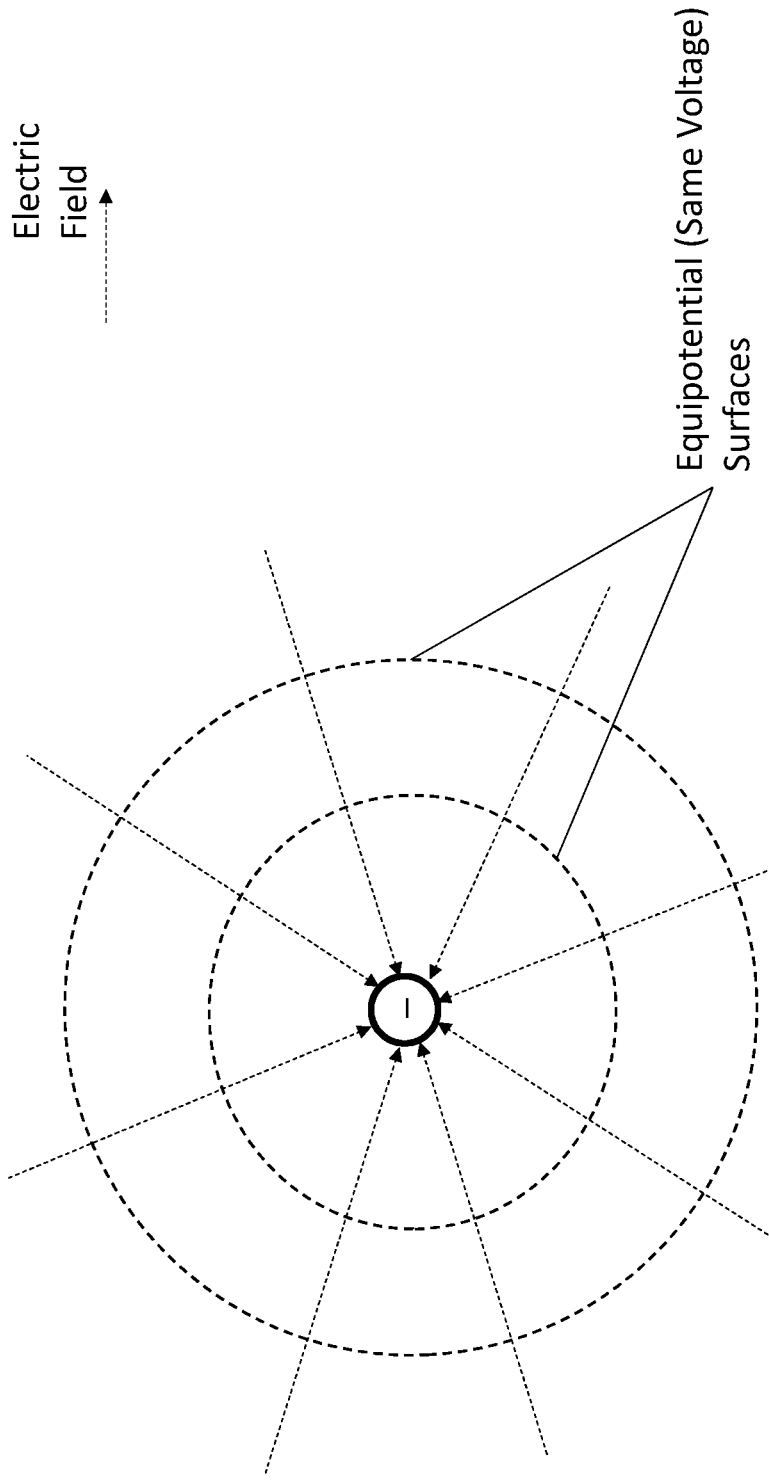

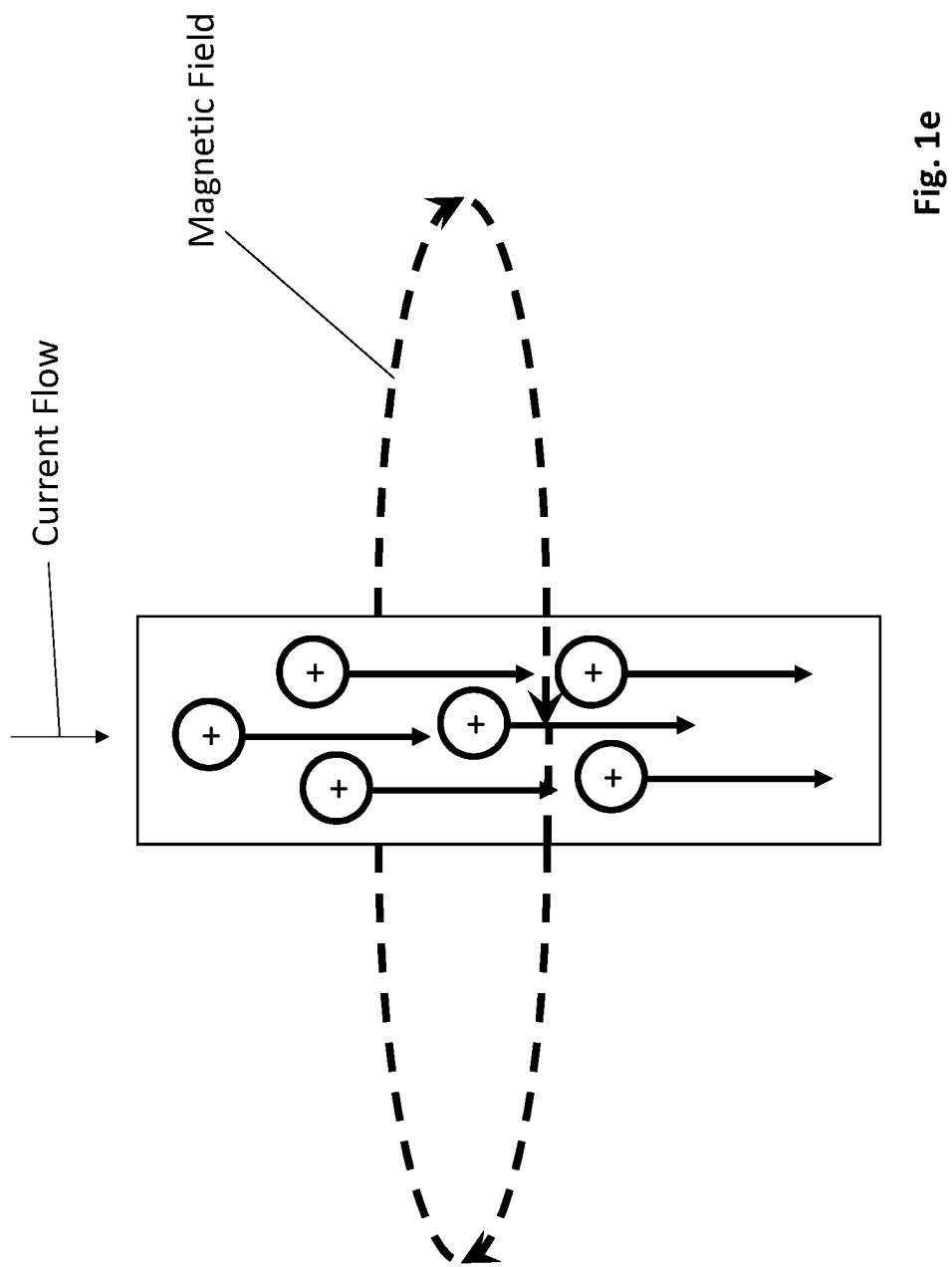

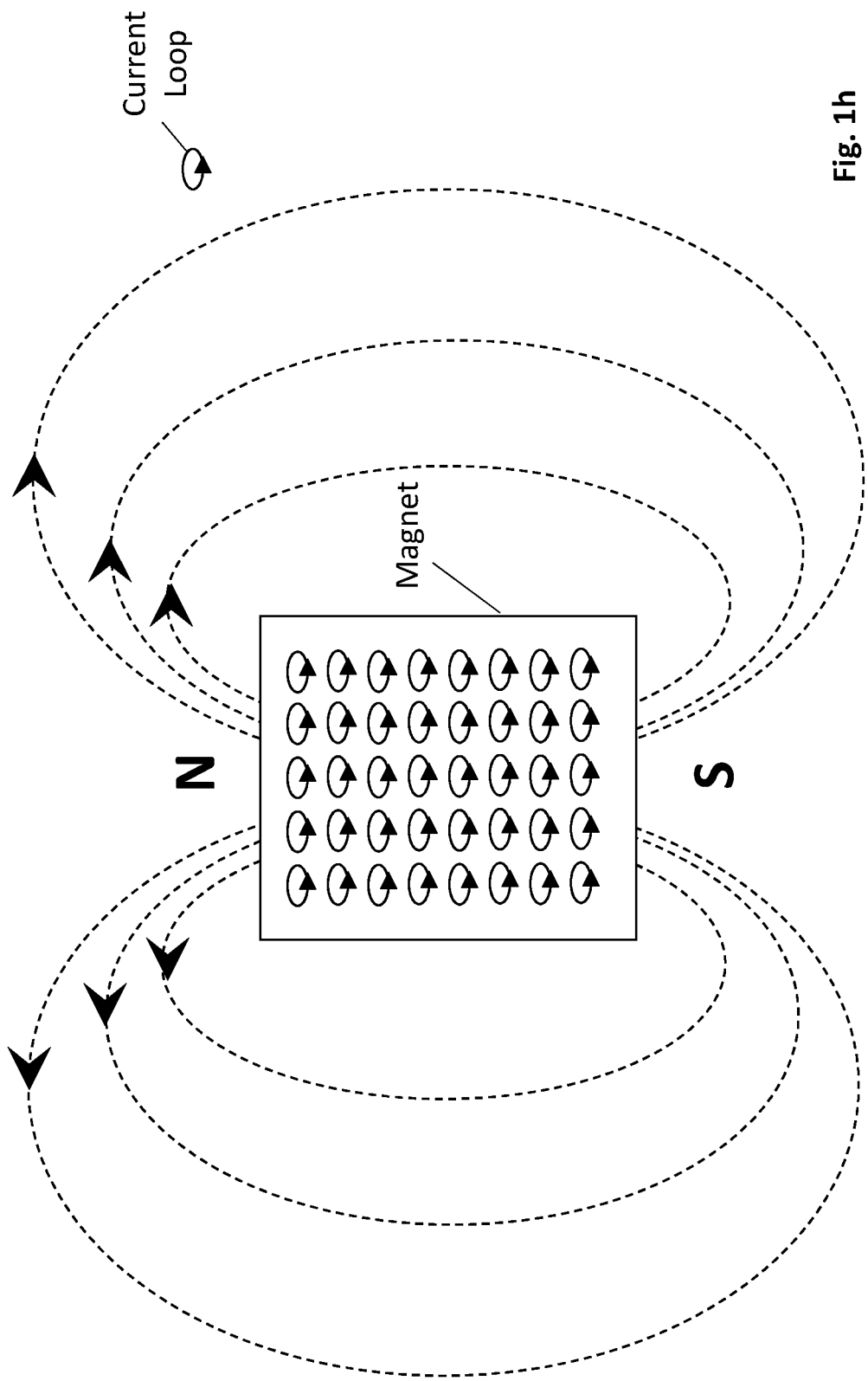

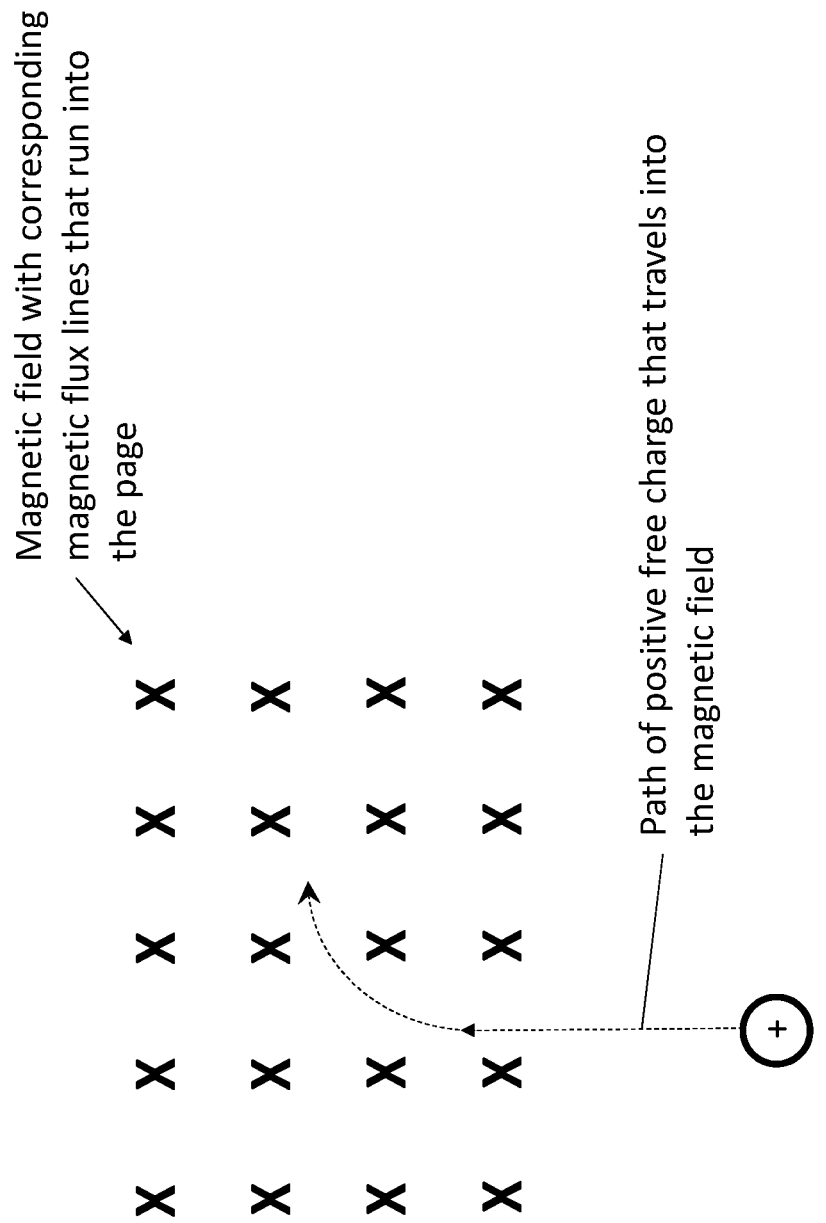

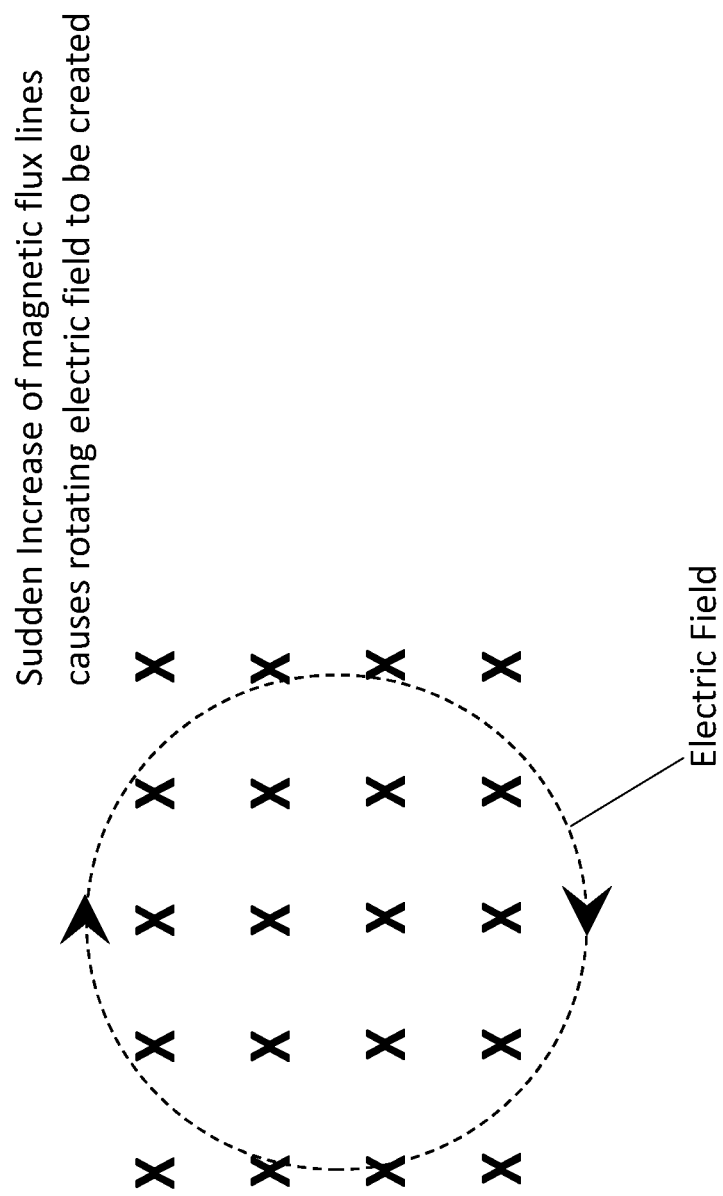

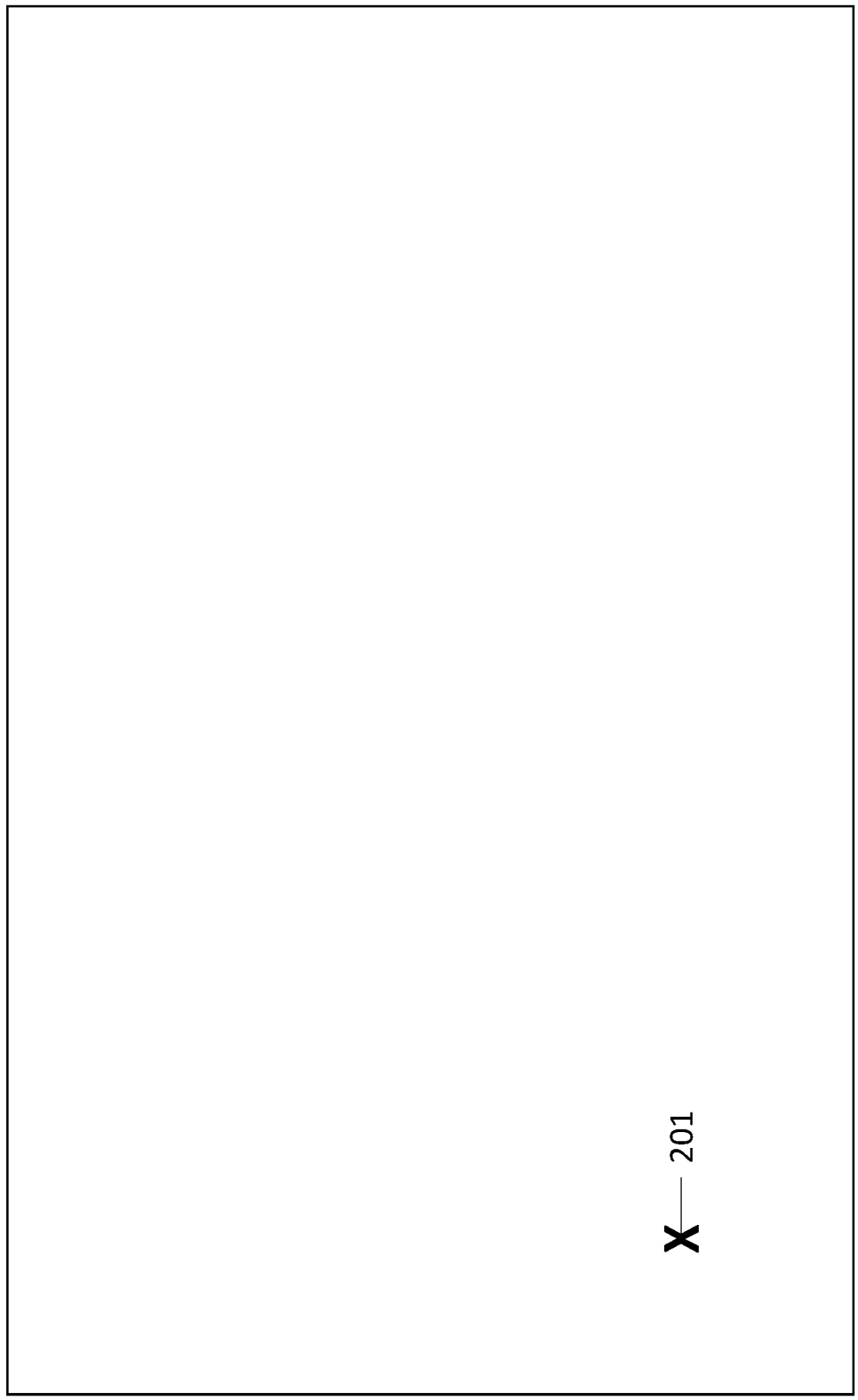

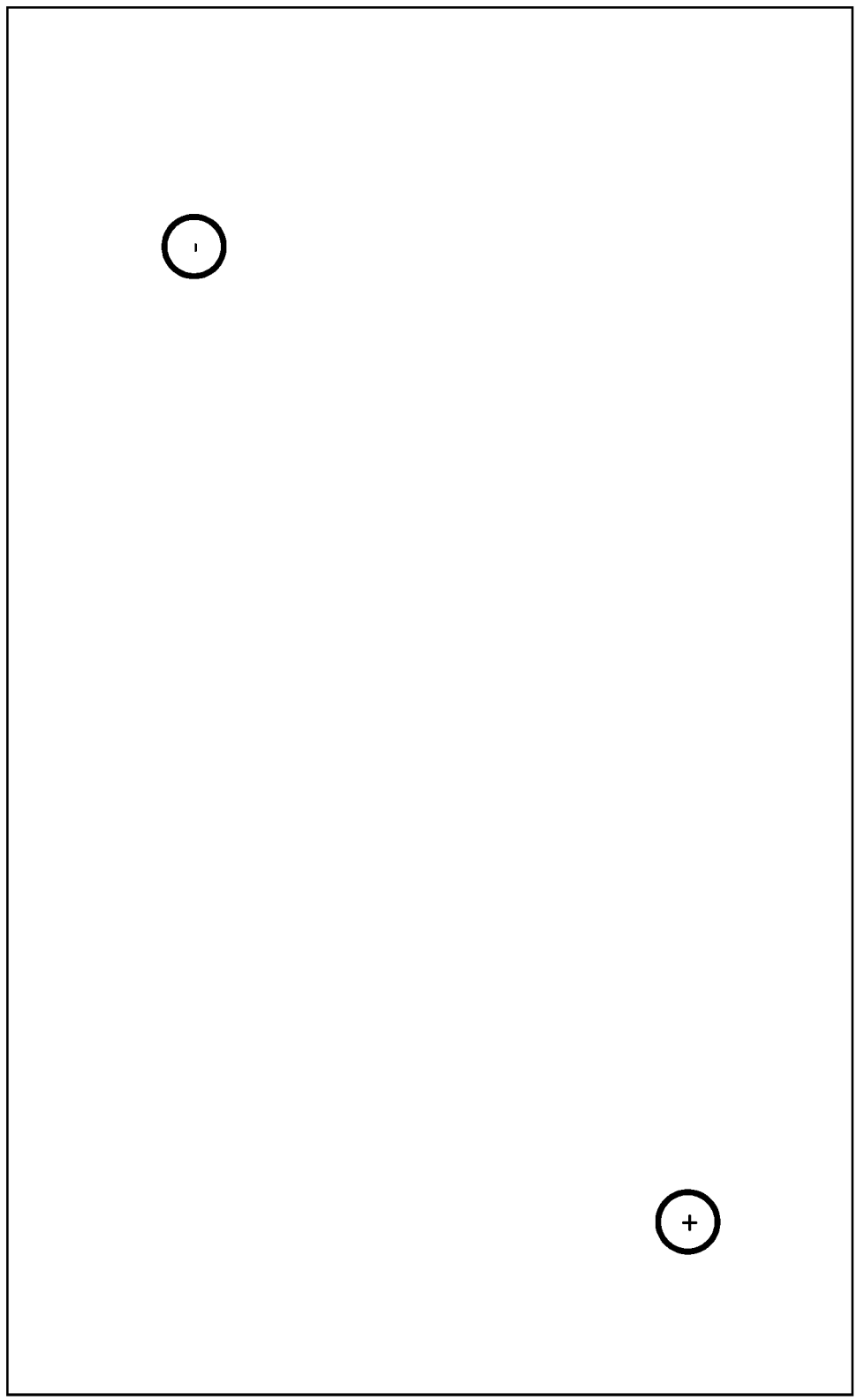

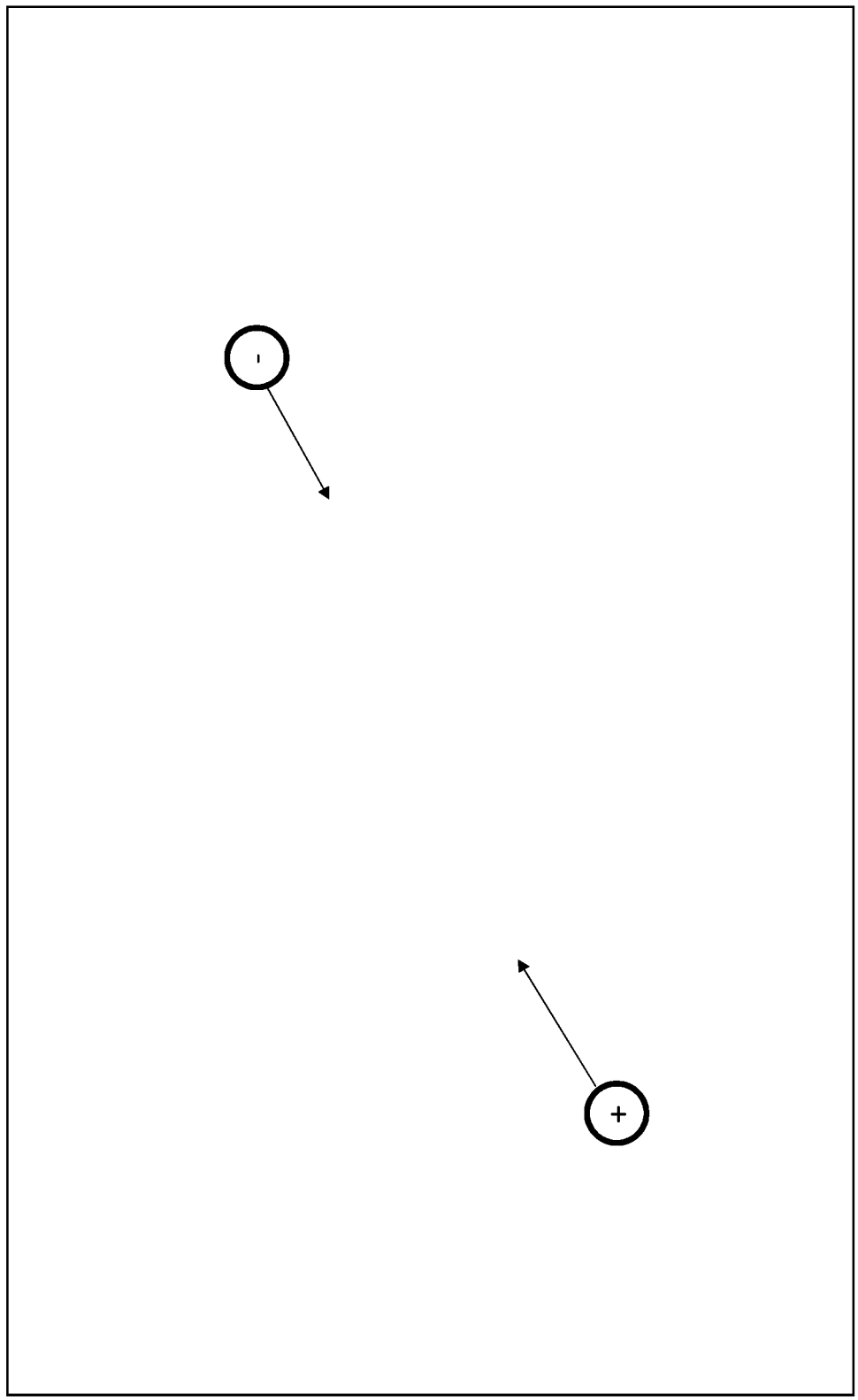

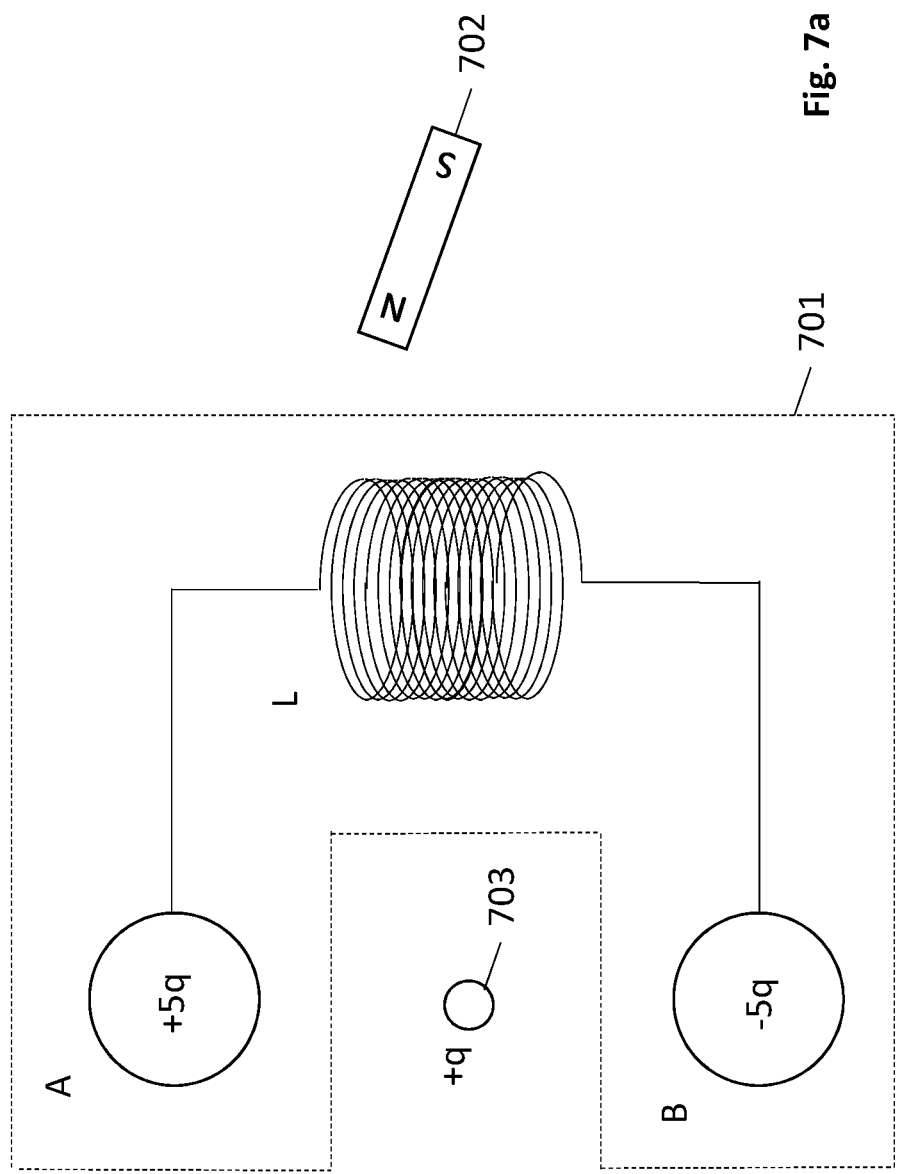

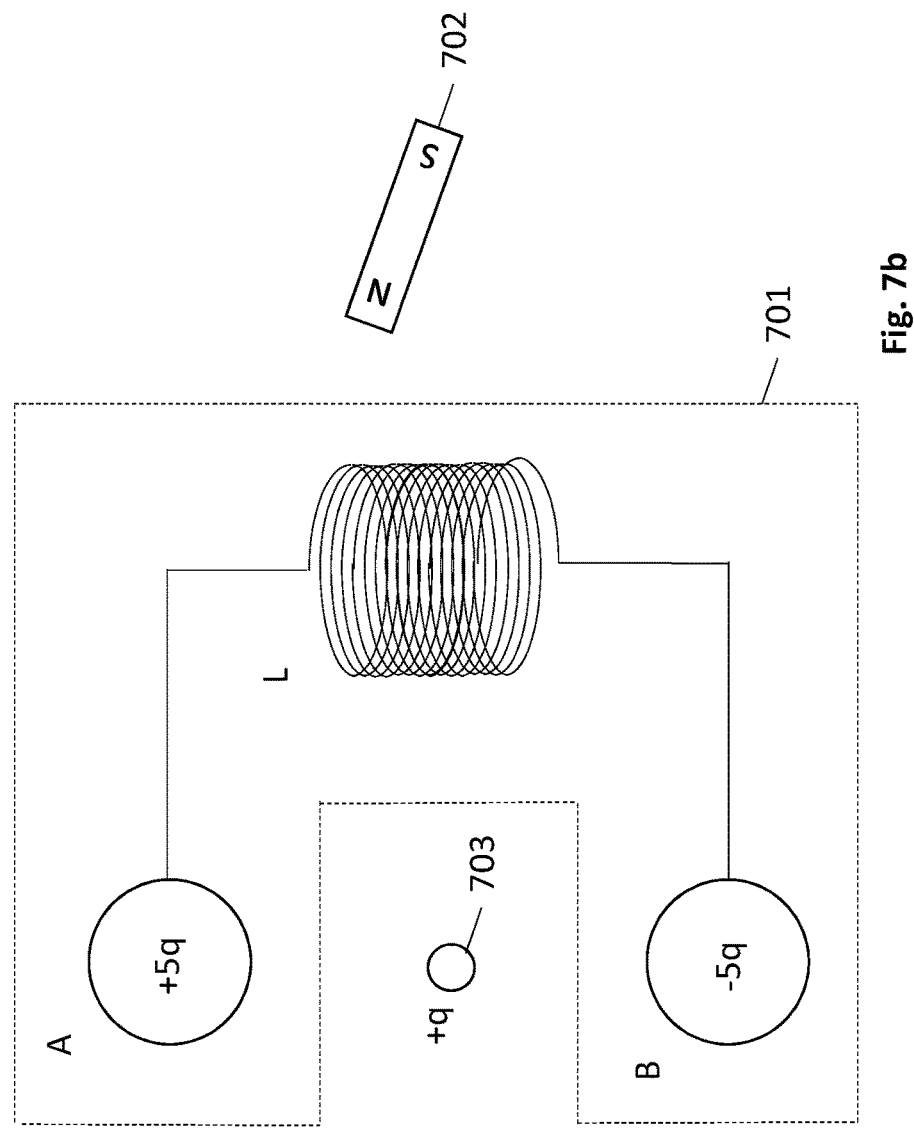
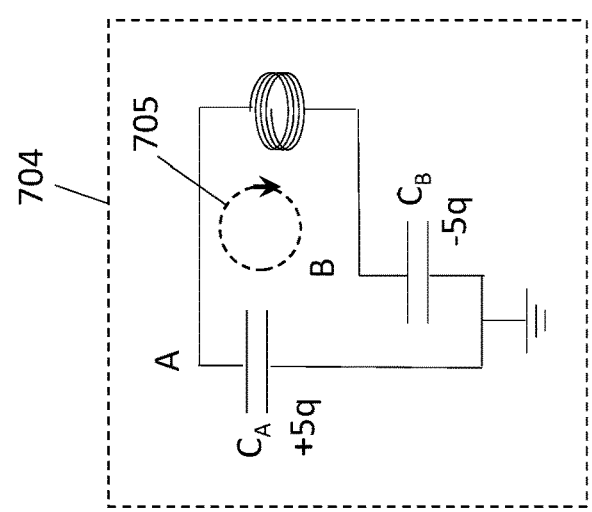
Fig. 7b

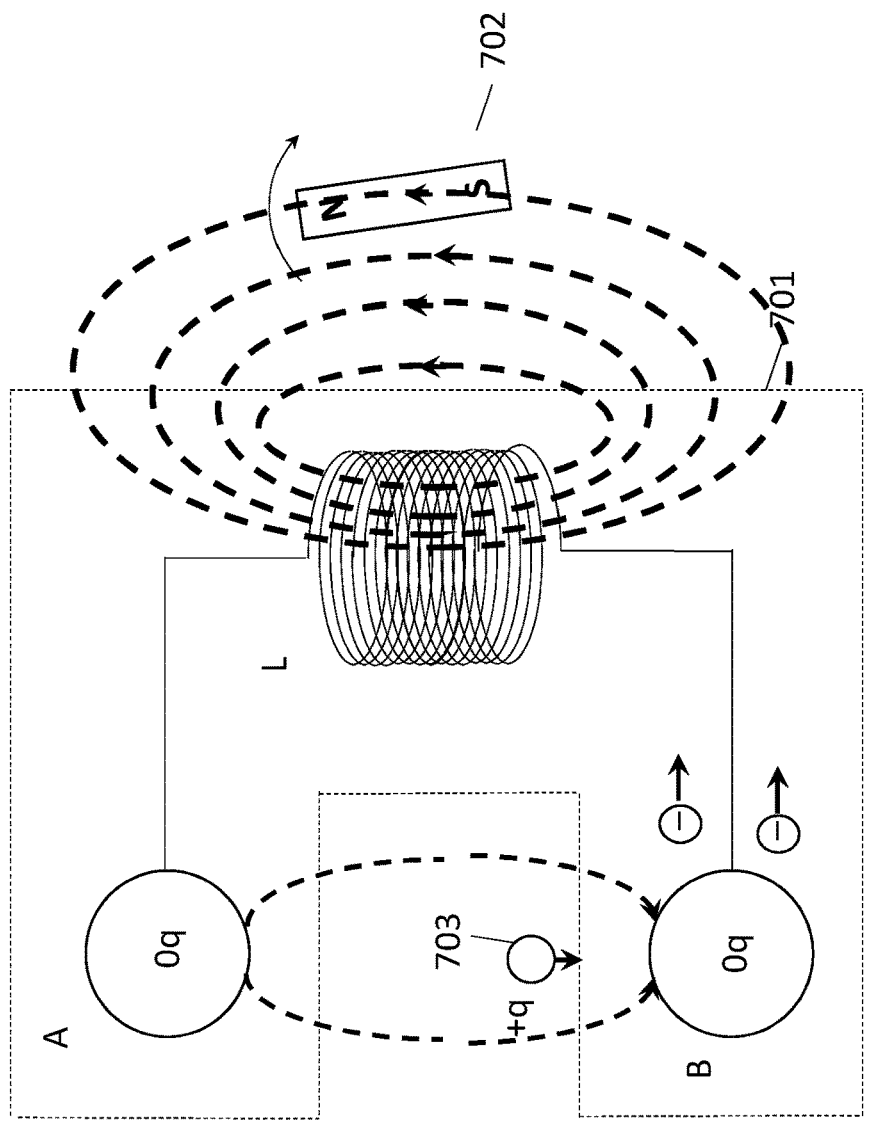
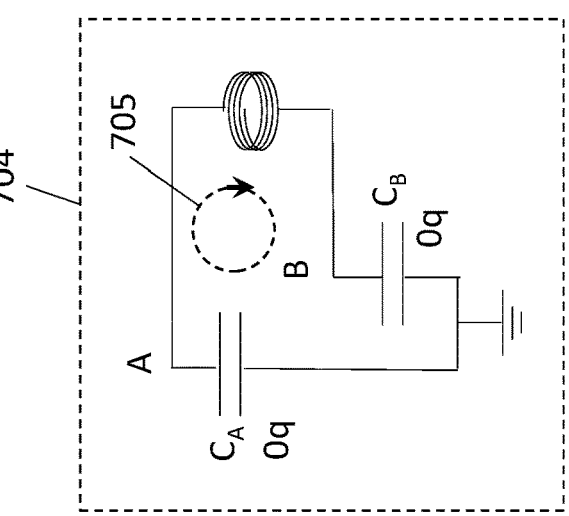
Fig. 7d

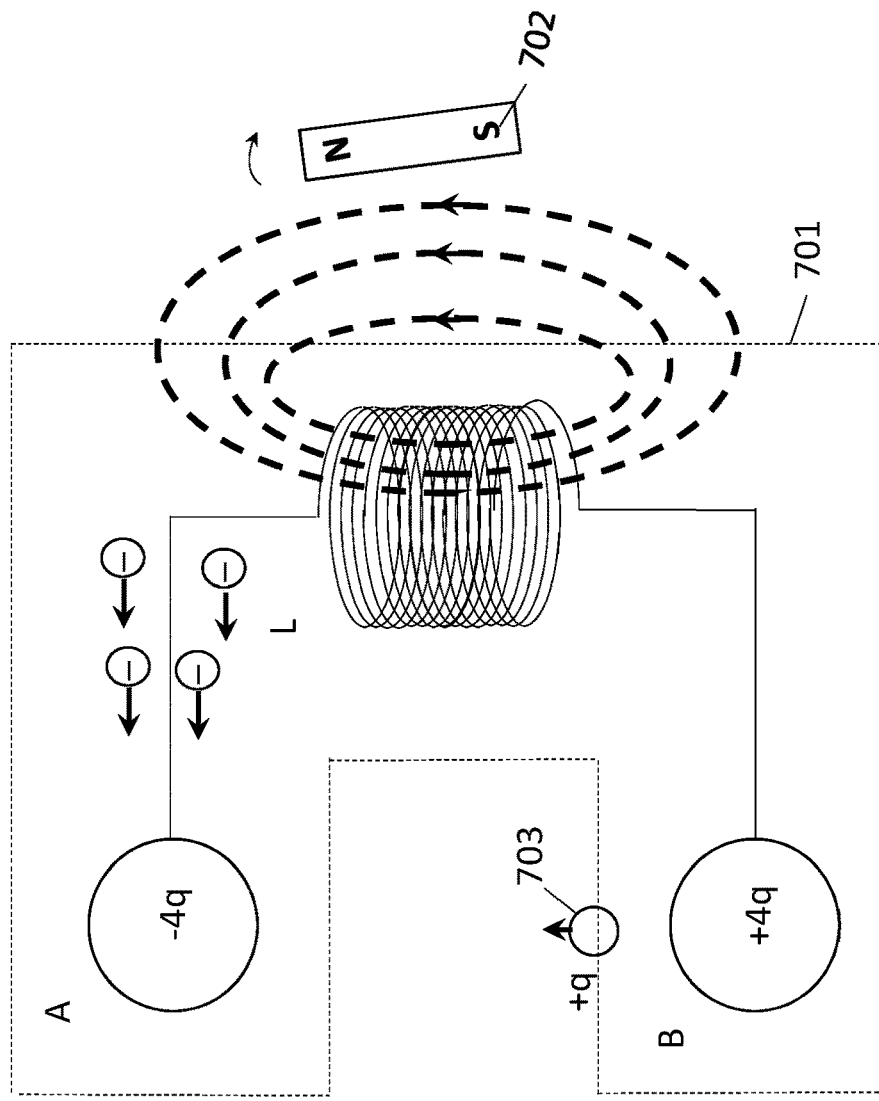
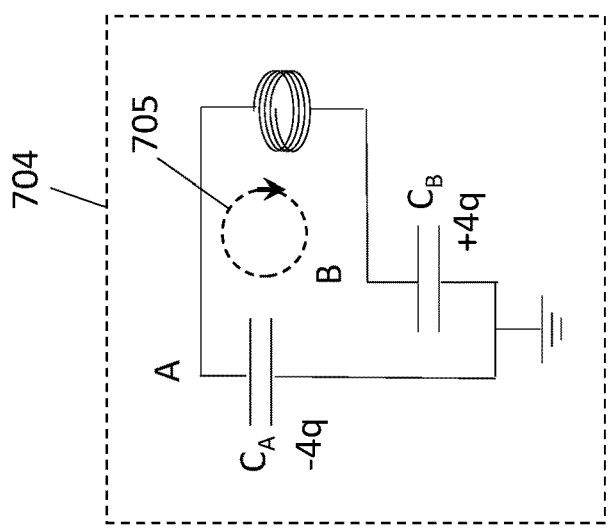
Fig. 7e

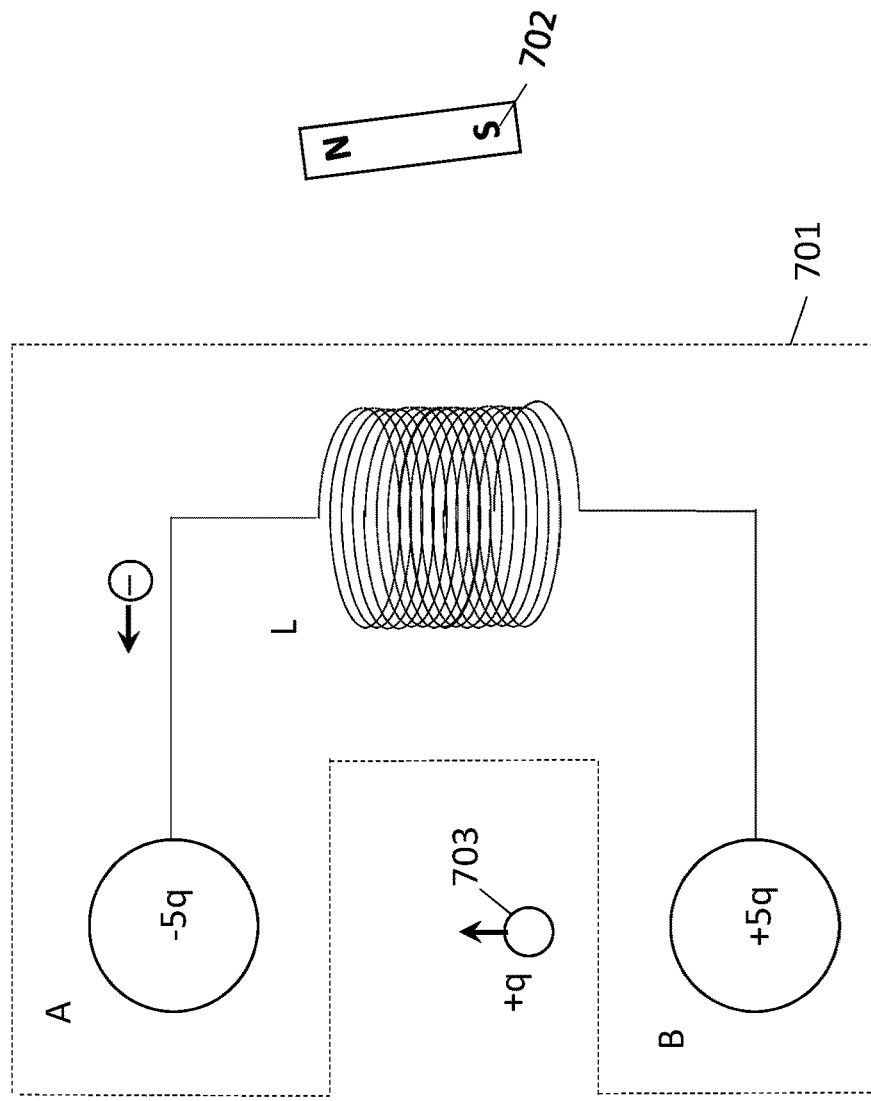
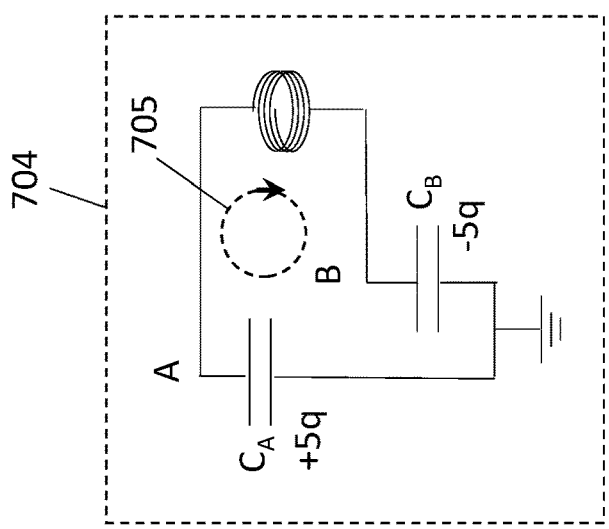
Fig. 7f

FAST, EFFICIENT REAL-TIME ELECTRO-MAGNETIC SYSTEMS SIMULATOR THAT DYNAMICALLY ACCEPTS USER INPUT

STATEMENT OF GOVERNMENT RIGHTS

This invention was made with United States government support under grant/contract number 1927081 awarded by the National Science Foundation. The U.S. government therefore has certain rights in the invention.

FIELD OF INVENTION

The field of invention pertains generally to the computing sciences, and, more specifically, to a fast, efficient real-time electro-magnetic systems simulator that dynamically accepts user input.

BACKGROUND

Electro-magnetic systems are extremely complex. Comprehension of the behavior of electro-magnetic systems can be particularly elusive for both students who are learning electro-magnetics or engineers who are designing electro-magnetic systems. Additionally, owing to the complexity of such systems, present day simulators are cumbersome and require abnormally long amounts of time to fully simulate even simple electro-magnetic systems/environments.

FIGURES

A better understanding of the present invention can be obtained from the following detailed description in conjunction with the following drawings, in which:

FIGS. 1a through 1k demonstrate basic electro-magnetic fields and their sources;

FIGS. 2a through 2m demonstrate an exemplary free space simulation;

FIG. 2n displays a conducting disk;

FIGS. 7a through 7f depict an exemplary combined circuit and free space simulation;

DETAILED DESCRIPTION

A simulator that is able to dynamically accept user input defining an electro-magnetic system and visually render the behavior of the system in real time can help, e.g., a student more easily comprehend, learn, and perhaps develop an intuitive feel for the physical processes that transpire within electro-magnetic systems.

1.0 Basic Units of Electricity and Magnetism

FIGS. 1a through 1k depict basic units of electricity, basic units of magnetism, the forces they create and their response to these forces. Although the discussion of FIGS. 1a-1k is essentially an overview of basic, well-known physics, it also serves as an introduction to the underlying calculations performed by the aforementioned simulator, which is described more thoroughly below. The physical arrangements that may be simulated include, for example, free space or other two-dimensional or three-dimensional space; and/or, an electronic circuit structure having one more electrical components including one or more conductors (e.g., wires, wire segments, conducting plates, etc.), capacitors, inductors, resistors and/or batteries.

Figure 1C:
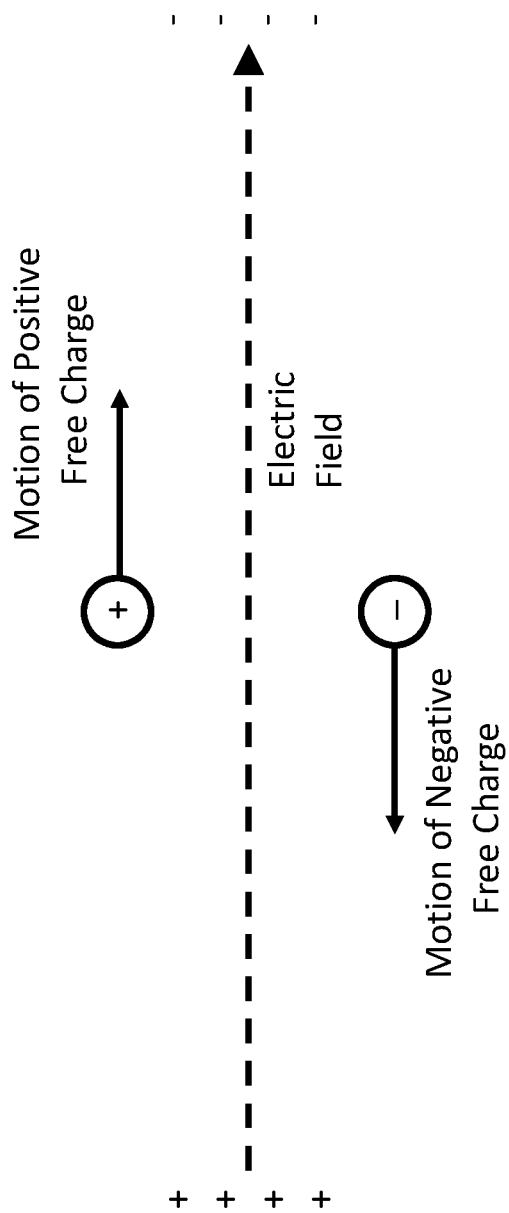

In general, the systems that are simulated by the simulator can include stationary objects (e.g., wires, magnets, conducting plates, resistors, batteries, etc.) and objects that are capable of motion. Referring to FIGS. 1a and 1b, a fundamental object capable of motion is an electronic point charge (or "free charge") which can be assigned positive electrical charge or negative electrical charge. Here, as is known from basic physics, referring to FIG. 1a, a positive point charge spherically radiates outgoing electric fields from itself and, referring to FIG. 1b, a negative point charge spherically sinks/terminates incoming electric fields upon itself. Additionally, in the presence of an electric field, as observed in FIG. 1c, a positive charge will experience an applied force that causes the positive charge to move in the direction of the field, whereas, a negative charge will experience an applied force that causes the negative charge to move in a direction opposite to the field.

The classic expression for the electric field created by a point charge is $$\vec{E} = \frac{kq}{r^2}\vec{r} \qquad \text{Eqn. 1}$$

where k is a constant that involves the permittivity of the space that surrounds the charge, q is the magnitude of the point charge's charge, r is the radial distance from the point charge, and $\vec{r}$ is the unit vector in the radial direction. The expression is a vector expression in that a positive charge produces outgoing (positive) radial fields and a negative charge produces inward/sinking (negative) radial fields.

Figure 1D:
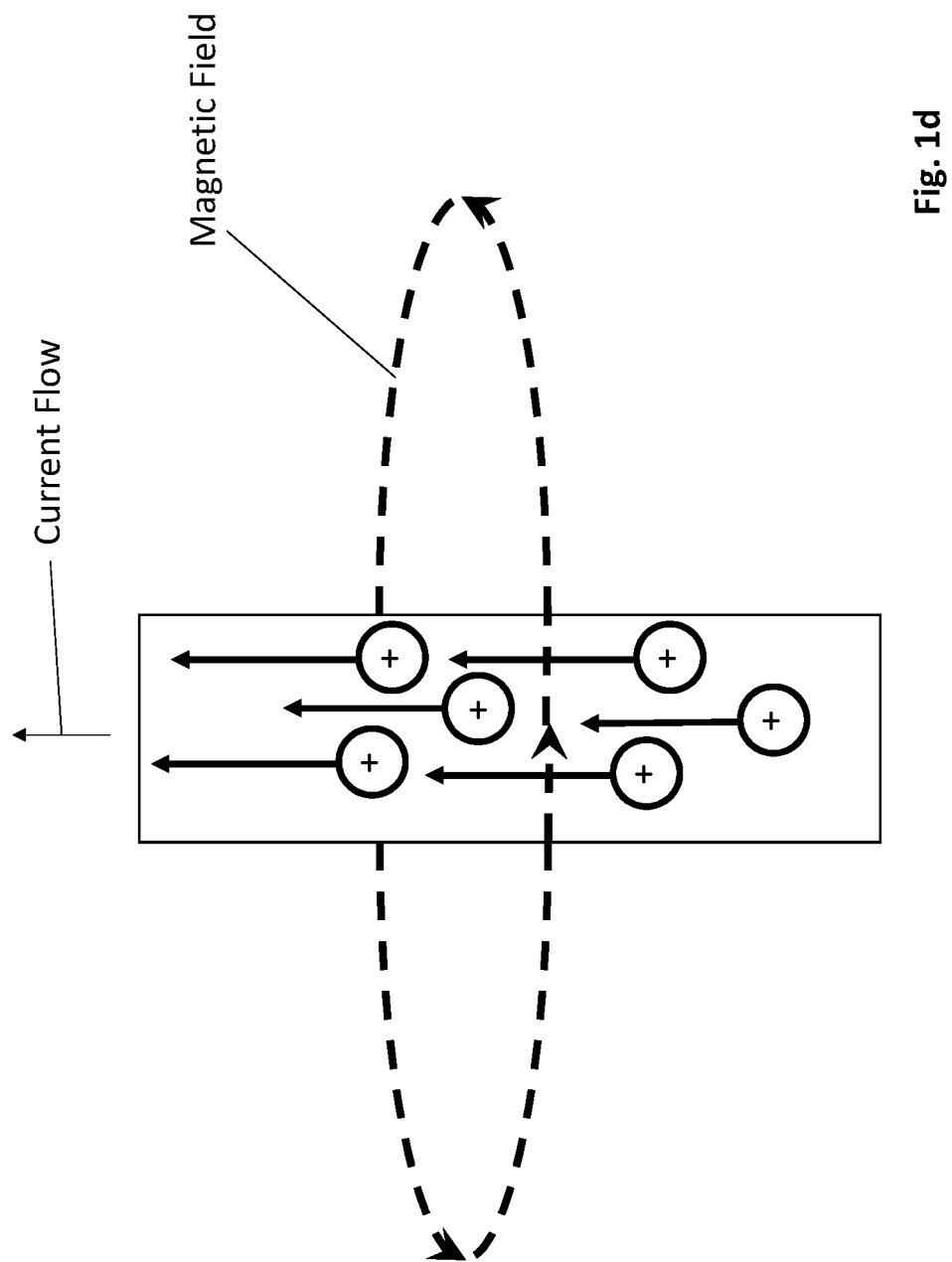

Moving electrical point charges, as observed in FIGS. 1d trough 1g, create a magnetic field. That is, whereas electric fields can be created from point charges, by contrast, in strict theory, point charges for magnetic fields do not exist. When an electrical current flows, e.g., through a straight line wire, as depicted in FIGS. 1d and 1e, a radial magnetic field is created that circulates around the current flow. The direction of the magnetic field depends on the direction of the current flow.

Figure 1F:
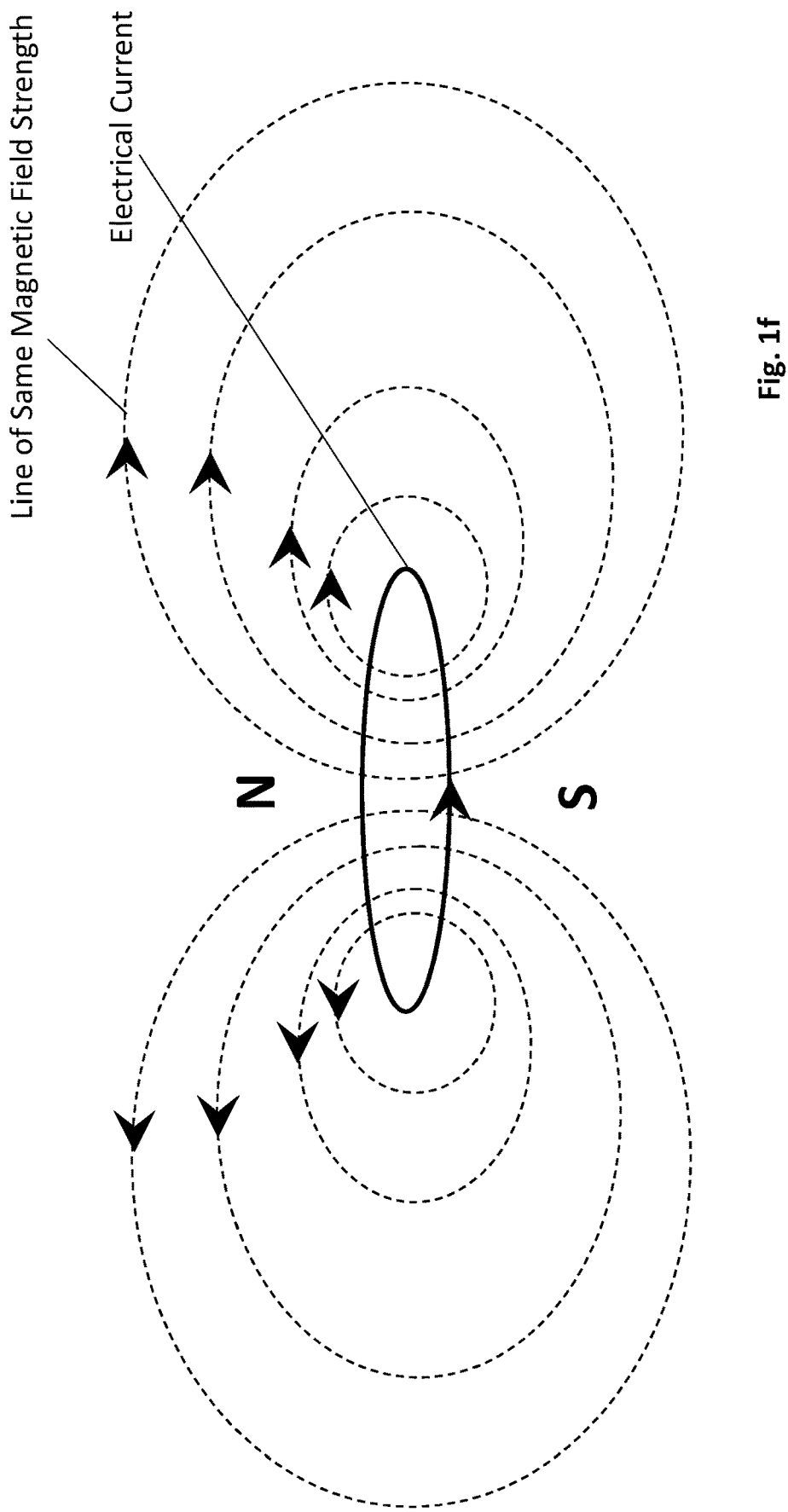
Figure 1G:
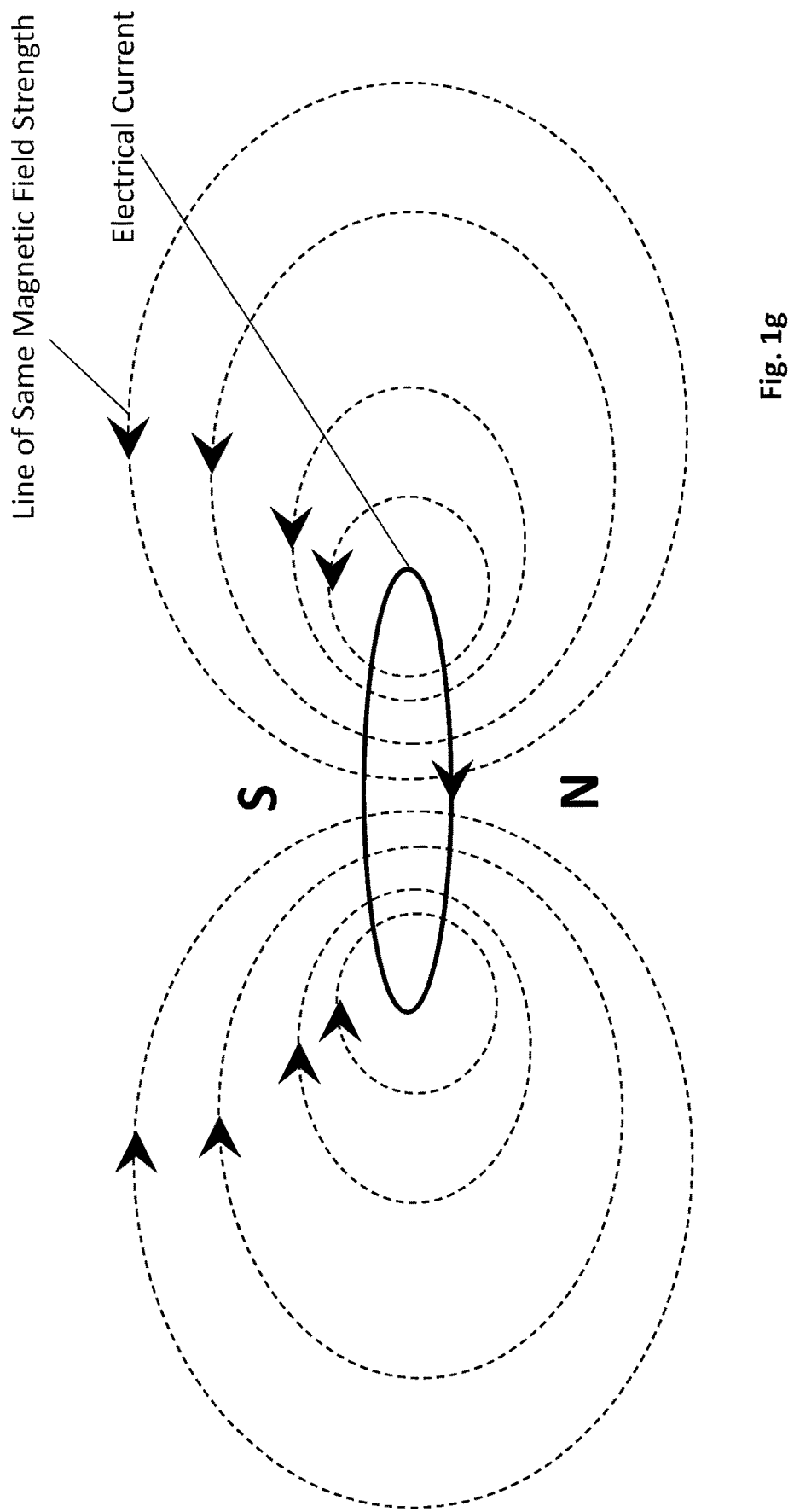

When current travels in a loop (i.e., a continuous path that closes upon itself) a magnetic "dipole" is created as observed in FIGS. 1f and 1g. The classic image of a magnetic dipole is a tight (smaller radius) circular flow of electrical current that creates magnetic fields that circulate around the current flow through its cross section radiating outward therefrom. Magnetic fields that emanate outwardly from the cross section of the current loop are recognized as the "north" end of the dipole while the returning magnetic fields that sink inwardly into the cross section of the current loop are recognized as the "south" end of the dipole. Which end of the dipole is the north end and which end is the south end depends on the direction of the current flow.

A classic expression for the magnetic field created by current flow in a long wire is $$\vec{B} = \frac{\mu I}{2\pi r}\vec{r}_\perp \qquad \text{Eqn. 2a}$$

where B is the magnetic field strength, I is the magnitude of the current flow, μ is the permittivity of the space where the magnetic field is present, r is the radial distance from the axis that the current flows along, and $\vec{r}_\perp$ is the unit vector in the direction perpendicular to r. In general, space having high permittivity, μ, (which is space that is highly magnetic in nature) will produce a larger magnetic field. In the case of a current loop (magnetic dipole), Eqn. 2a becomes:

$$\vec{B_r} = \frac{\mu I}{4\pi} \frac{2a}{r\sqrt{q}} \left[ E(\sqrt{m}) \frac{q - 2rR}{q - 4rR} - K(\sqrt{m}) \right] \vec{r} \qquad \text{Eqn. 2b}$$

$$\vec{B_a} = \frac{\mu I}{4\pi} \frac{2}{\sqrt{q}} \left[ E(\sqrt{m}) \frac{R^2 - r^2 - a^2}{q - 4rR} + K(\sqrt{m}) \right] \vec{a}$$

where r is the distance from the center of the loop, a is the axial (y) distance, R is the radius of the loop, $q = r^2 + R^2 + a^2 + 2rR$, and $$m = \frac{4rR}{q}. \quad E(\sqrt{m})$$

and $K(\sqrt{m})$ represent the elliptical integrals of the first and second kind (respectively). The field at any point will have both a radial component outward from the axis of the loop $\vec{r}$, and an axial component parallel to the axis of the loop ($\vec{a}$).

A magnet (e.g., a slab of magnetic material), as depicted in FIG. 1h, can be modeled as a number of magnetic dipoles that are tightly packed, e.g., in a three-dimensional array like structure. Here, the magnetic field generated by each dipole in the packed structure contributes to the magnetic field generated by the magnet as a whole. The more dipoles per unit volume and/or the greater the loop current per dipole, the more magnetic the magnet becomes (stronger magnetic fields emanate from the magnet).

Figure 1I:
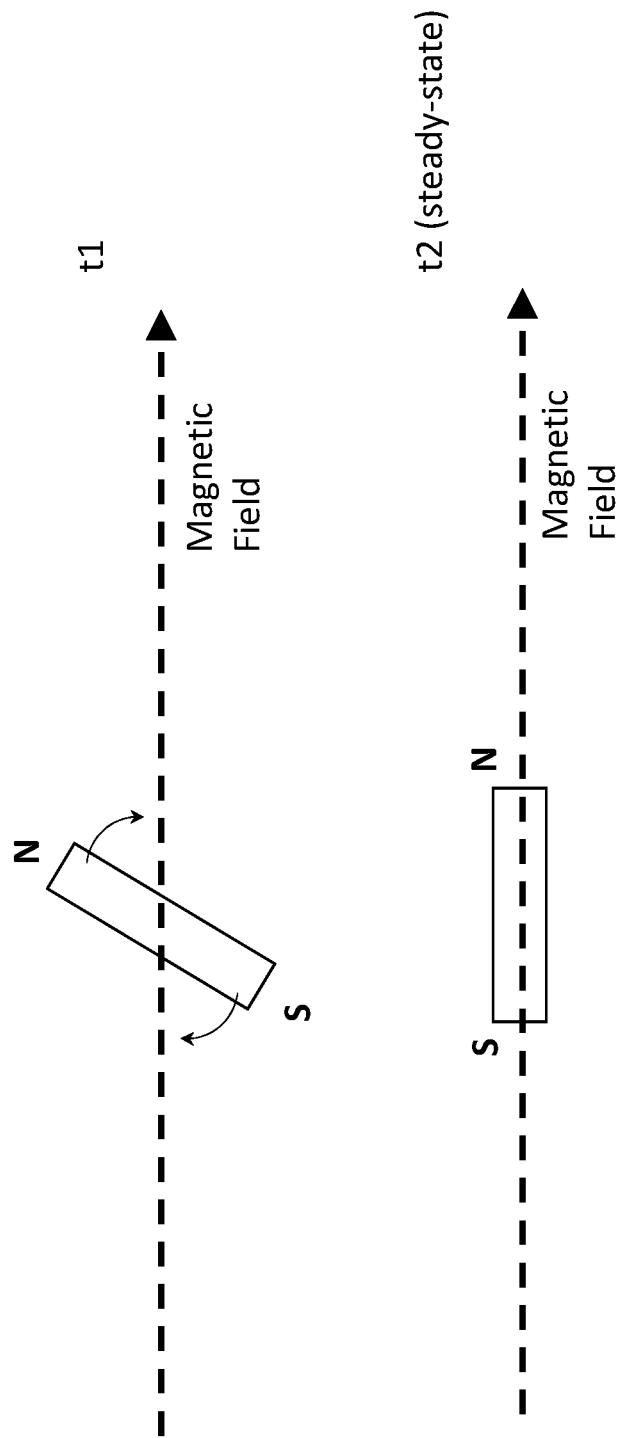

The N and S ends of a magnetic dipole or magnet can be modeled as a magnetic "moment". In the presence of a magnetic field, as depicted in FIG. 1i, the north end of a magnet or magnetic dipole tries to move in the direction of the magnetic field while the south end tries to move in the direction opposite that of the magnetic field. With the two ends "pulling" in opposite directions, the magnetic dipole will rotate or otherwise align itself with the magnetic field such that the north end is farther away from the north end of the source of the field and the south end is closer to the north end of the source of the field.

When a point charge is moving in a direction that is perpendicular to a magnetic field's orientation, as depicted in FIG. 1j, an effective electric field is created that causes the point charge to experience a torque. The torque, in turn, causes the point charge's direction of travel to rotate. The direction of rotation depends on whether the charge is positive or negative combined with the direction of the magnetic field. Essentially, the behavior of FIG. 1j can be seen as a corollary to the behavior described above with respect to the magnetic dipole described above with respect FIGS. 1f and 1g.

A simple expression for the effective electric field applied to the moving point charge is $$\vec{E} = \vec{v} \times \vec{B} \qquad \text{Eqn. 3}$$

Where v is the velocity of the moving point charge, "X" is a cross product operation and B is the magnetic flux density of the magnetic field.

Finally, as depicted in FIGS. 1k and 1l, when a magnetic field changes, or more specifically when magnetic flux lines that traverse through a same cross-sectional area change, an electric field is created that circulates around the changing magnetic flux lines. The direction/orientation of the electric field's circulation depends on the direction that the magnetic flux is changing through the cross-sectional area.

An expression for the electric field created by a changing magnetic field through a circular cross section is $$E = -(A/2\pi r)(\delta B/\delta t) \qquad \text{Eqn. 4}$$

where A is the area of the circular cross section, r is the radius of the circular cross section and ($\delta B/\delta t$) is the rate of change of magnetic flux intensity per unit area through the circular cross section.

2.0 Simulator for "Free Space" Electrical and/or Magnetic Systems

Summarizing from the above discussion, a particular point charge will have electric fields applied to it that are created by: i) other electrical point charges; ii) changing magnetic fields; and/or, iii) the traveling of the point charge through a magnetic field. The net summation of these fields at the point charge can result in a net electric field that is applied to the point charge. In turn, the net electric field results in a net force (F) that is applied to the point charge which causes the point charge to move. More specifically, the point charge will accelerate according to:

$$\vec{a} = \frac{\vec{F}}{m} = \frac{q\vec{E}}{m} \qquad \text{Eqn. 5}$$

where a is the acceleration, $\vec{F}$ is the net force from the various applied fields (which is re-expressed as $\vec{F} = q\vec{E}$ where q is the charge of the point charge and $\vec{E}$ is the net electric field experienced by the point charge) and m is the mass of the point charge. The acceleration can be expressed as a vector having a particular direction. The direction ultimately results from the direction(s) of the applied electric fields, their respective strengths and the polarity of the point charge (positive or negative).

Additionally, a particular magnetic dipole will have magnetic fields applied to it that are created by: i) other magnetic dipoles and/or magnets; and, ii) electrical currents (moving free charges). The net summation of these fields at the magnetic dipole can result in a net magnetic field that is applied to the magnetic dipole. In turn, the net magnetic field results in a net force that is applied to the dipole which causes the dipole to rotate or otherwise move its position. The movement can be expressed as a vector having a particular direction. The direction ultimately results from direction(s) of the applied magnetic fields, the magnetic fields' respective strengths and the orientation of the dipole's north and south ends.

From the above then, it should be clear that systems of electrical charges and magnetic dipoles involve complicated interactions. Here, for instance, electrical charges interact with one another (create fields resulting in applied forces), which causes the charges to move, which not only immediately affects/changes the applied fields/forces but also creates magnetic fields that apply additional forces that contribute to the net motion of the electrical charges, and so on. The interactions and the fields and forces that result from them can be made even more complicated in the presence of magnetic dipoles and/or magnets.

The aforementioned simulator not only resolves these complicated interactions for "free space" electro-magnetic systems but does so in "real time", with user interaction and need not rely upon high-end processor hardware. As such, the simulator is believed to possess significant utility as an educational tool. For example, the simulator may be installed on a tablet computer. A student/user may tap on the screen to add objects of a system to be simulated (e.g., one or more charges, dipoles, magnets, circuit structures, etc.). The simulator then simulates the system graphically on the tablet's display in real time, meaning, the movement of the charges and/or dipoles in response to their interactions with one another and any other externally applied potentials (e.g., a battery) is presented on the display.

The user is free to interrupt the simulation and change its state at any time. For example, the user may add more charges at a particular location, may remove some existing charges from a particular location, change a circuit arrangement, add a magnet, etc. The simulator is then able to immediately simulate and render the response of the new system with little/no loss of fluidity after the user's imposed change.

FIGS. 2a through 2m show a simplistic exemplary simulation with corresponding user interactions. More advanced simulation environments, such as simulation environments that include circuit structures, are presented in more detail further below.

Figure 2B:
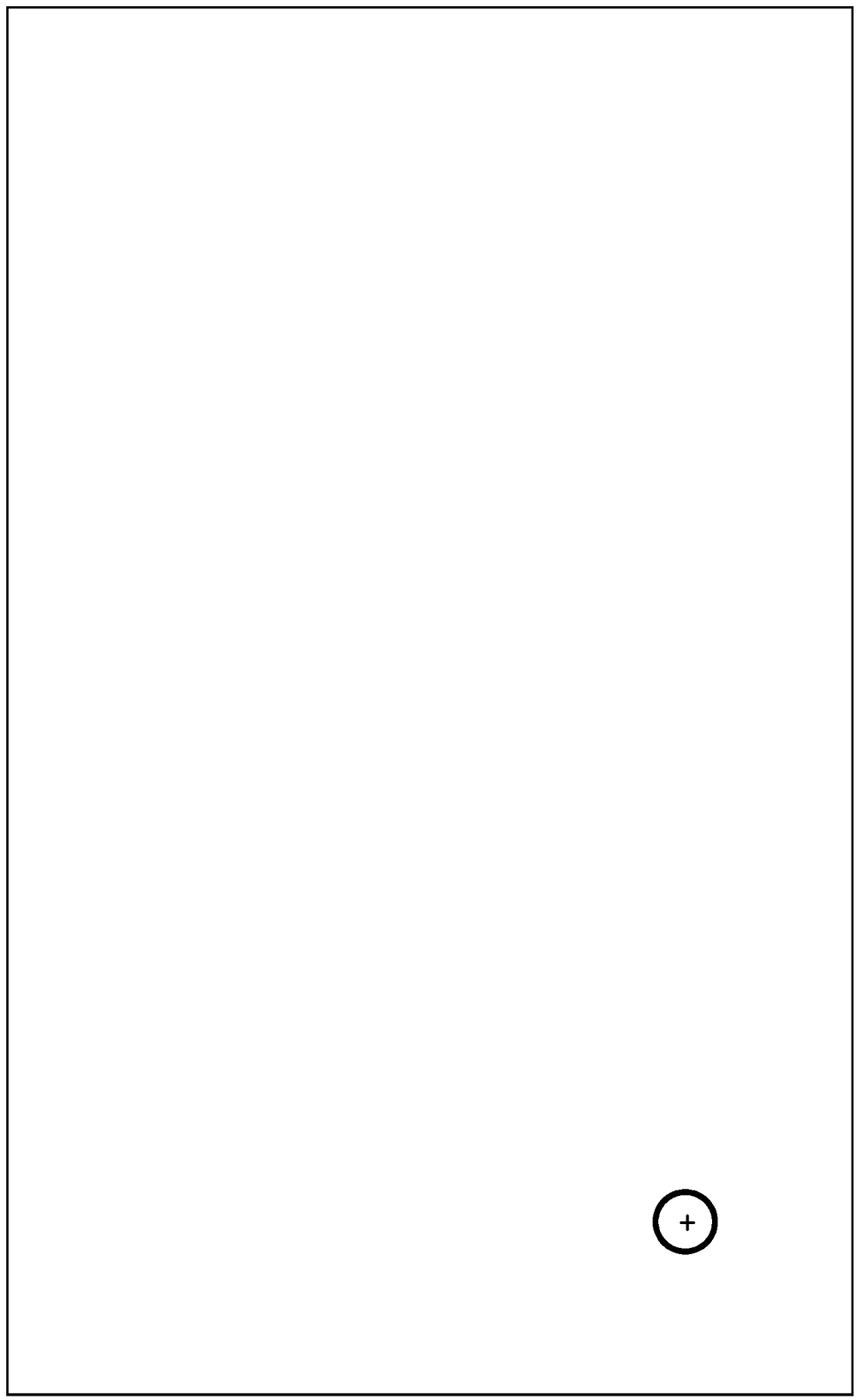
Figure 2D:
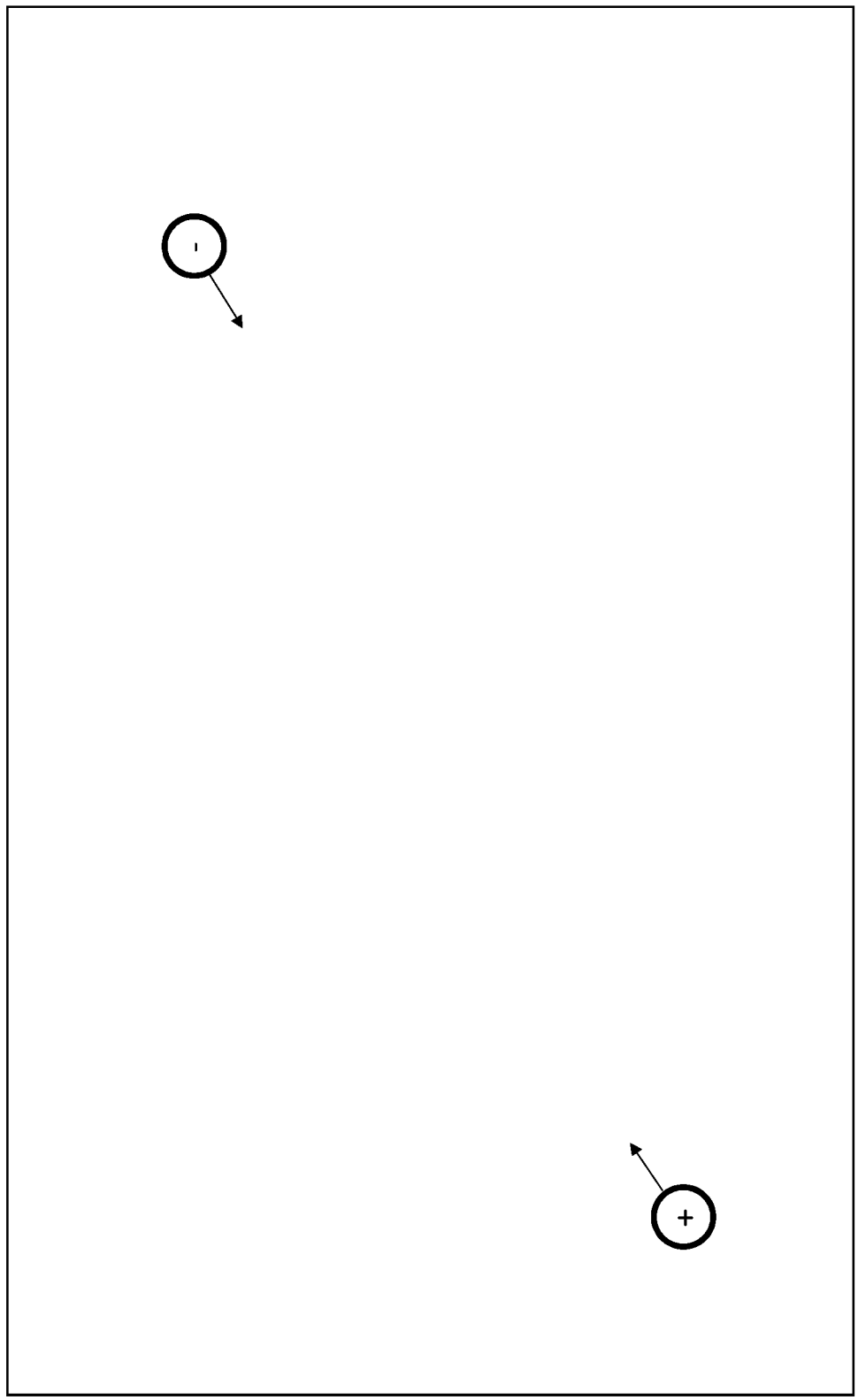

Referring to FIG. 2a user taps on the screen at a first location 201. Responsive to the tap, a menu appears (not shown) from which the user selects the addition of a single positive charge. FIG. 2b shows the screen display after the charge has been introduced into the system by the user. Here, the system consists of a single positive charge that is not subject to any applied fields (no other objects exist in the system). As such the positive charge does not experience any applied forces and remains in place.

Next, referring to FIG. 2c, the user taps on another screen location and adds a single negative charge. Here, the emanating fields of the positive charge (not shown) draw in (attract) the negative charge and, likewise, the sinking fields of the negative charge (also not shown) draw in the positive charge. As such, the two charges begin to move closer to one another as observed in FIG. 2d. From the electrostatic force equation of Eqn. 1, as the charges move closer to one another their attraction to each other increases resulting in an ever-increasing acceleration toward one another. Here, assuming equal time units from FIG. 2d through 2f, note that the charges remove increasing amounts of distance between them as they accelerate toward one another with non-linear acceleration.

Figure 2F:
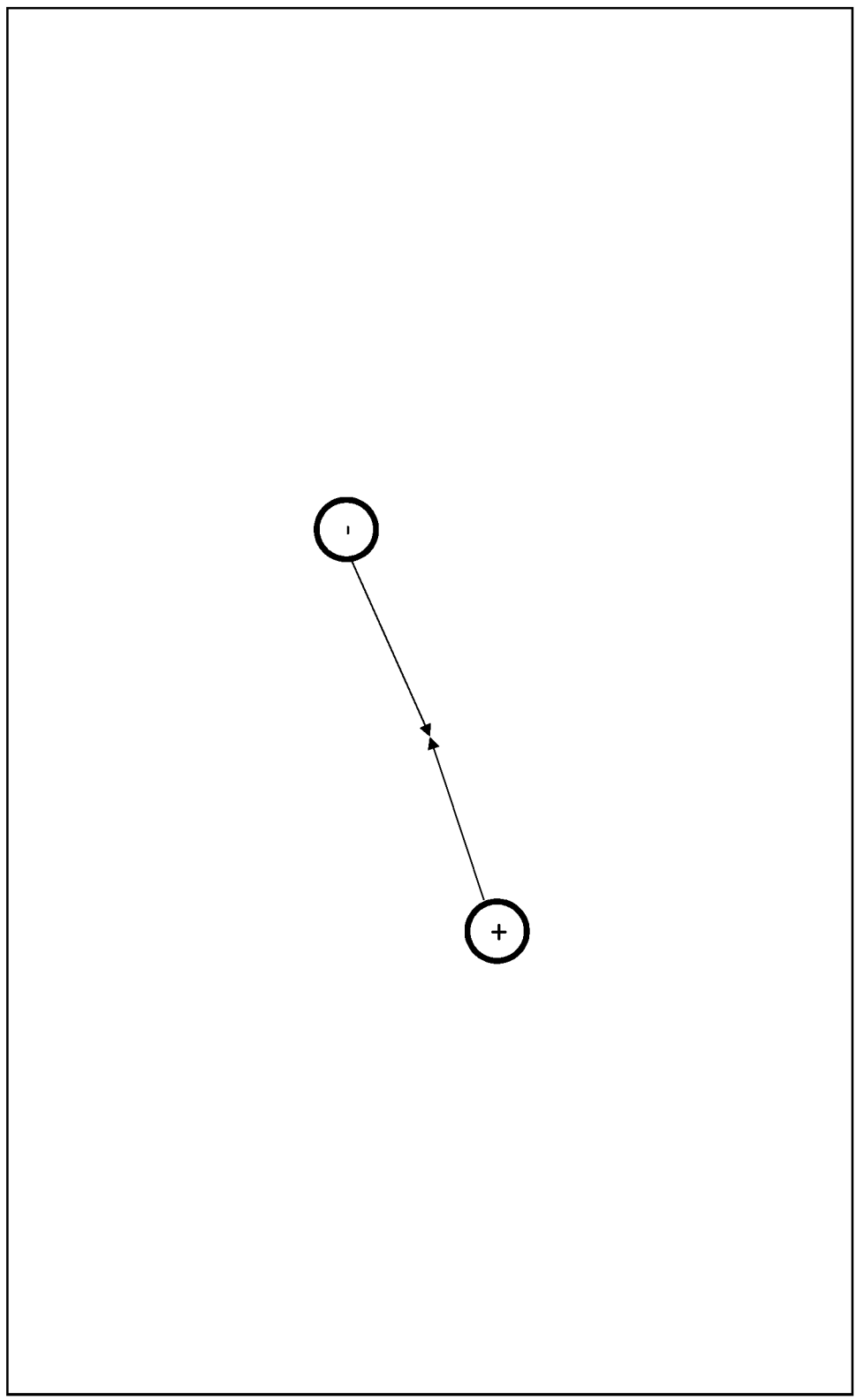
Figure 2G:
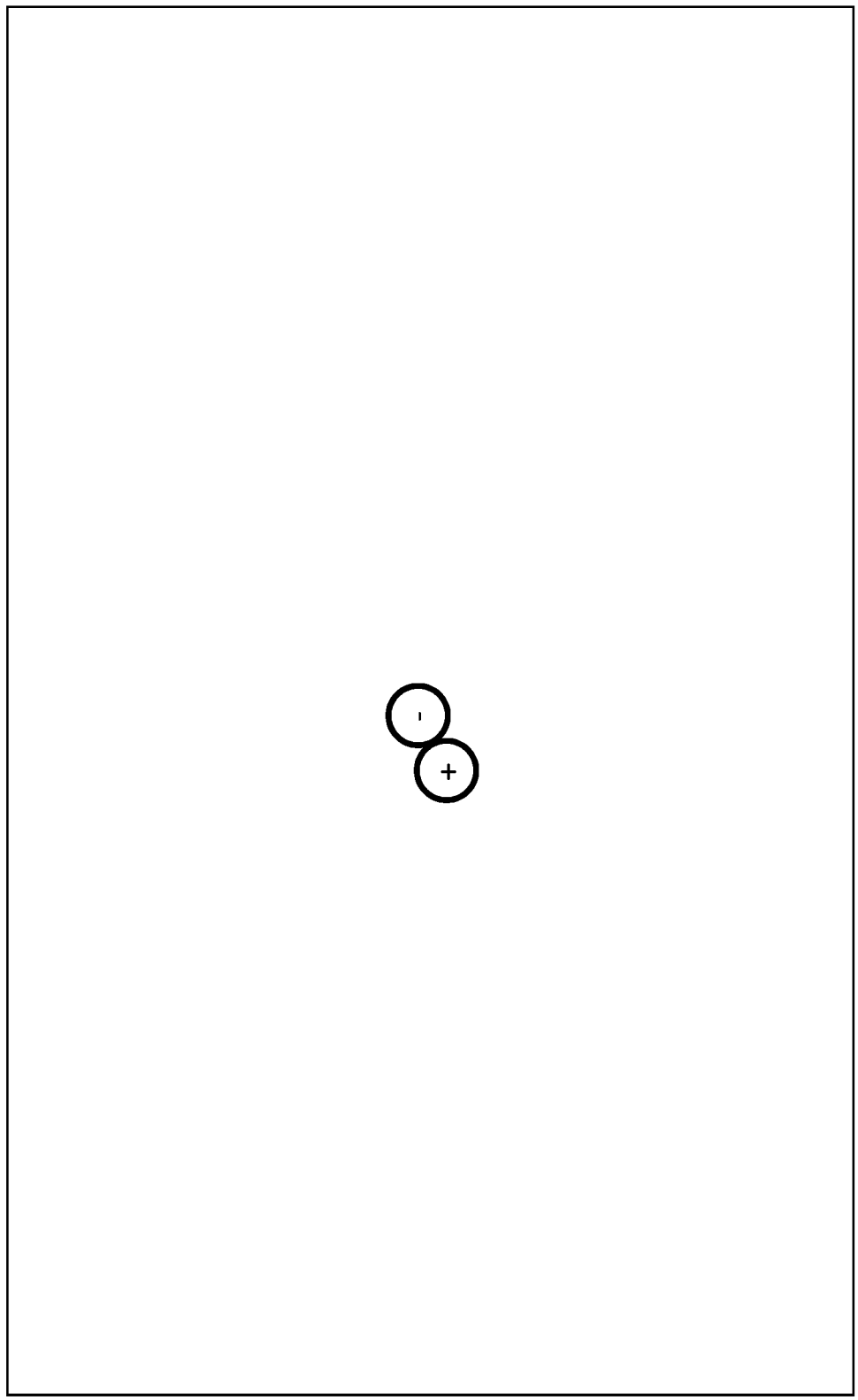

Eventually the pair of charges collide as observed in FIG. 2g. With both charges modeled as having some mass, they exhibit a mechanical collision (like billiard balls on a pool table). The elastic collision initially causes them to recoil from one another but the electrostatic attraction between them causes their acceleration back to one another as observed in FIG. 2h. They collide again, however the velocity of the collision is much less than the initial collision (the particles accelerate towards each other over a much shorter distance than the initial collision) so they do not recoil as much. Eventually, all collisions cease and the particles are electrostatically "stuck" together (and form an electrostatic dipole 202). As observed in FIG. 2i, the energy of the mechanical collision activity, however, is largely transferred to rotational energy (the electrostatic dipole spins) because the collisions occurred off axis from the direction of motion of the spherical charges (the charges did not collide "head on" with respect to their directions of motion).

Figure 2H:
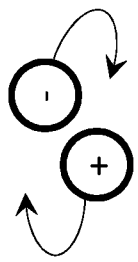
Figure 2I:
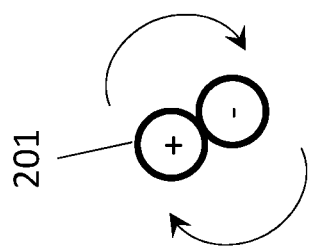
Figure 2J:
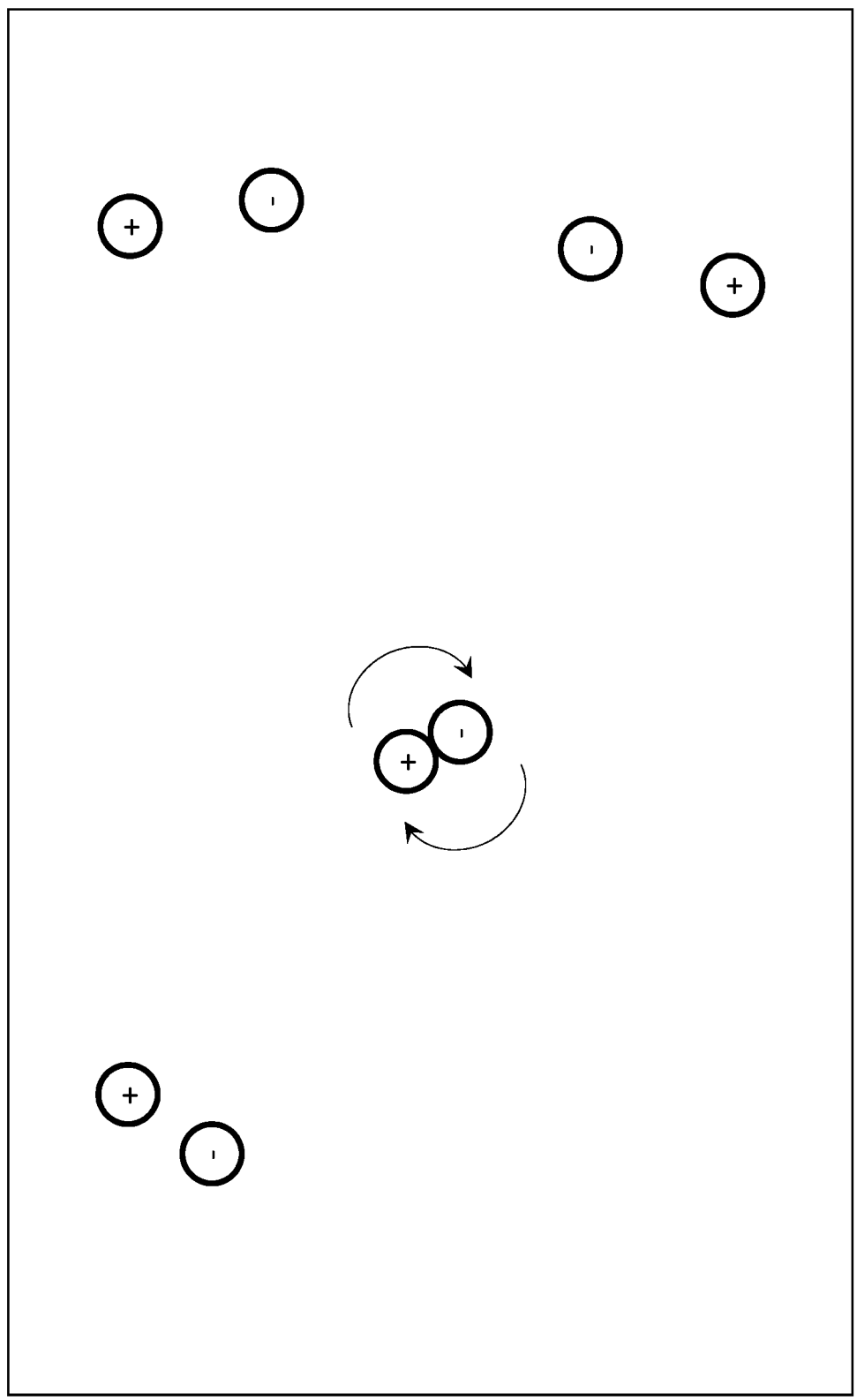

The user then taps again on the screen and adds additional positive and negative charges as observed in FIG. 2j. The electrostatic dipole emanates associated electric field lines like those of the magnetic dipole of FIG. 1f (except the field lines are electric field lines and not magnetic field lines). The field lines from the electrostatic dipole interact with the added charges, and the fields from each of the newly added charges interact with the electrostatic dipole and each of the other charges. In essence a complex arrangement of fields, forces from the fields and resulting motions of each of the objects (the electrostatic dipole and the newly added charges) is created.

The simulator calculates all of these and renders the resulting motion of the electrostatic dipole and newly added charges in real time (their interactions with one another are observed immediately after the user adds the new charges). To the extent the moving objects create their own magnetic fields from their movement, and such magnetic fields change owing to the motion of their respective charges and/or other charges move through such fields, additional electric fields may be created that additionally affect the motion of the charges and so on. The simulator additionally calculates all such fields, the resulting forces on the objects from such fields, and the resultant motion of each individual objects in response to its respective resultant force. The motion is rendered on the screen and the process continually repeats as observed in FIGS. 2k and 2l.

Figure 2K:
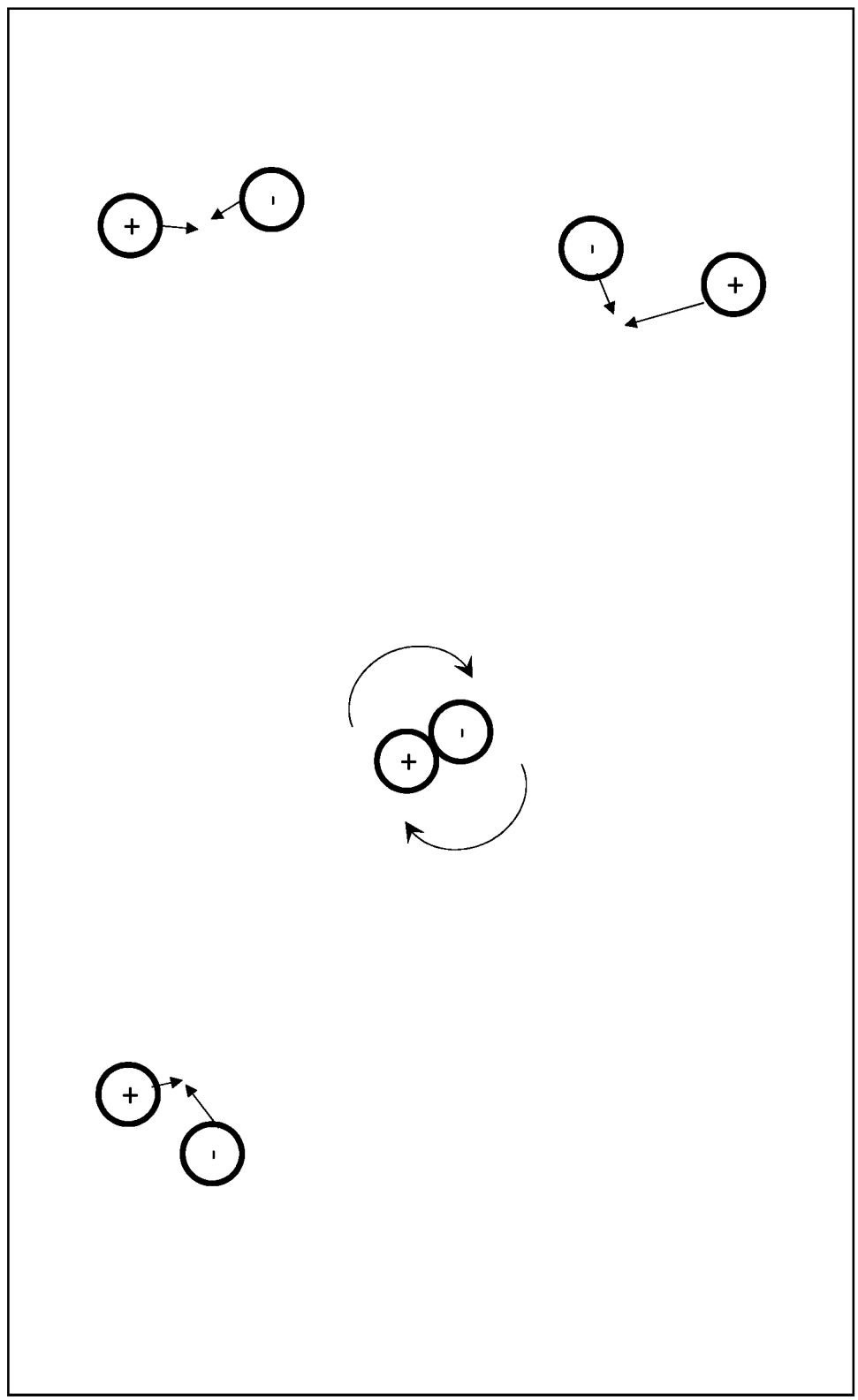
Figure 21:
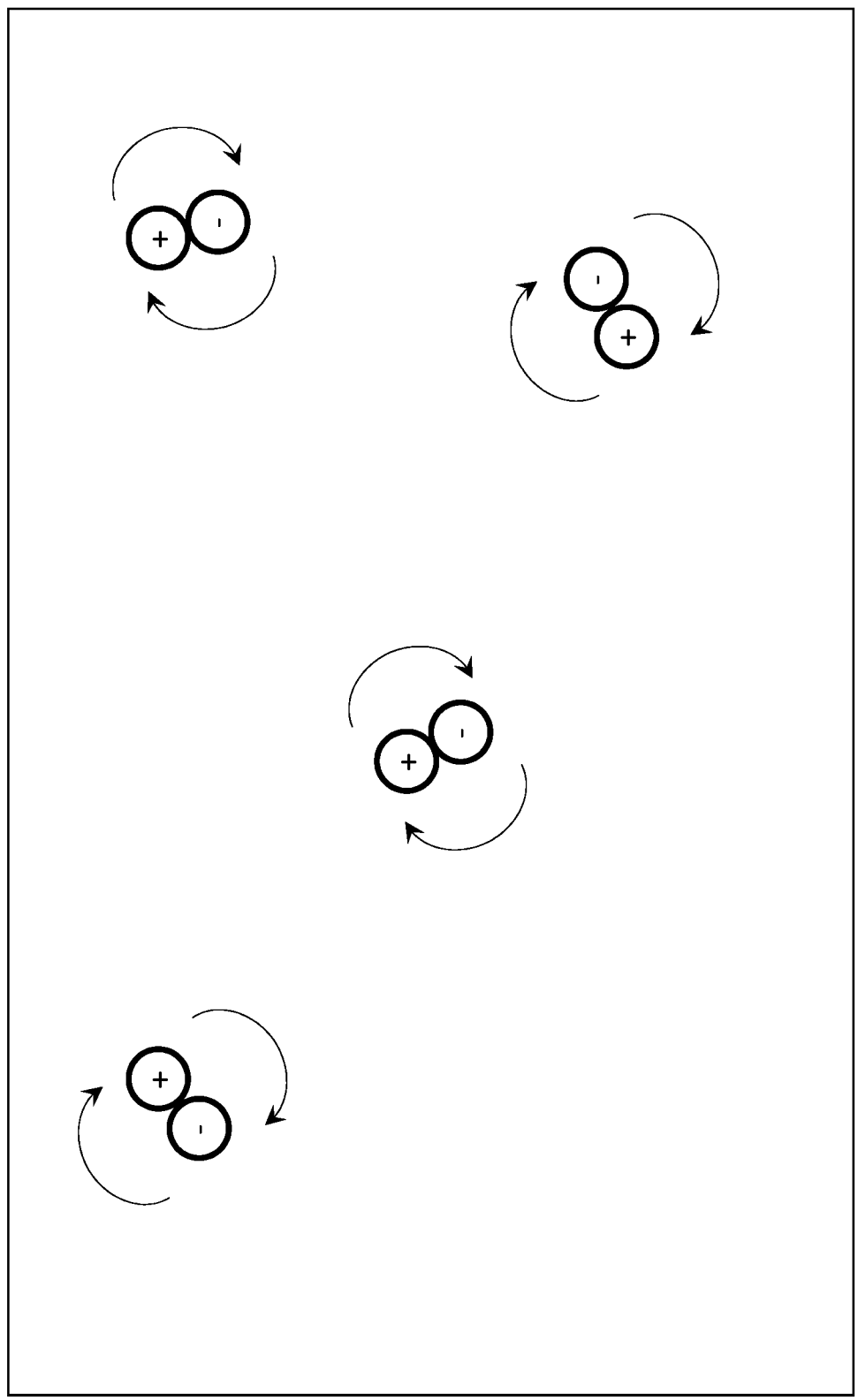
Figure 2M:
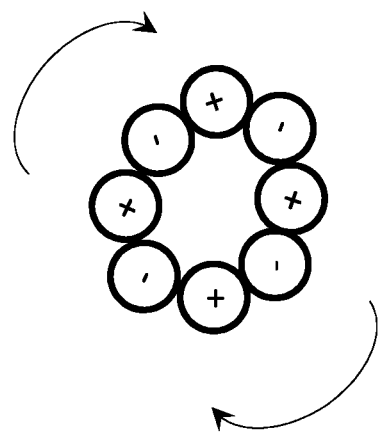

As observed in FIGS. 2k and 2l, nearest neighbor charges of opposite polarity are attracted most strongly to each other first forming multiple, spinning, electrostatic dipoles. The resulting dipoles then interact with one another into a final, lowest energy state electrostatic structure as observed in FIG. 2m which spins at some radial velocity that results from the complicated nature by which the collisions between charges and then between dipoles occurred.

For the sake of simplicity note that magnetic dipoles or magnets were left out of the simulated system of FIGS. 2a through 2m. Note, however, that if a magnetic dipole or magnet had been introduced to the system (e.g., by a user tapping on the screen and adding one at the location of the tap), the movement of any of the electrostatic objects through the respective magnetic fields generated by the magnetic object(s) could cause curvature in the motion of the moving electrostatic objects. Likewise, the resulting magnetic fields created by any moving electrostatic object could cause, e.g., rotation of the magnetic dipole or the magnetic dipole moments of the magnet. Again, the simulator would calculate the resulting fields/forces.

Figure 3:
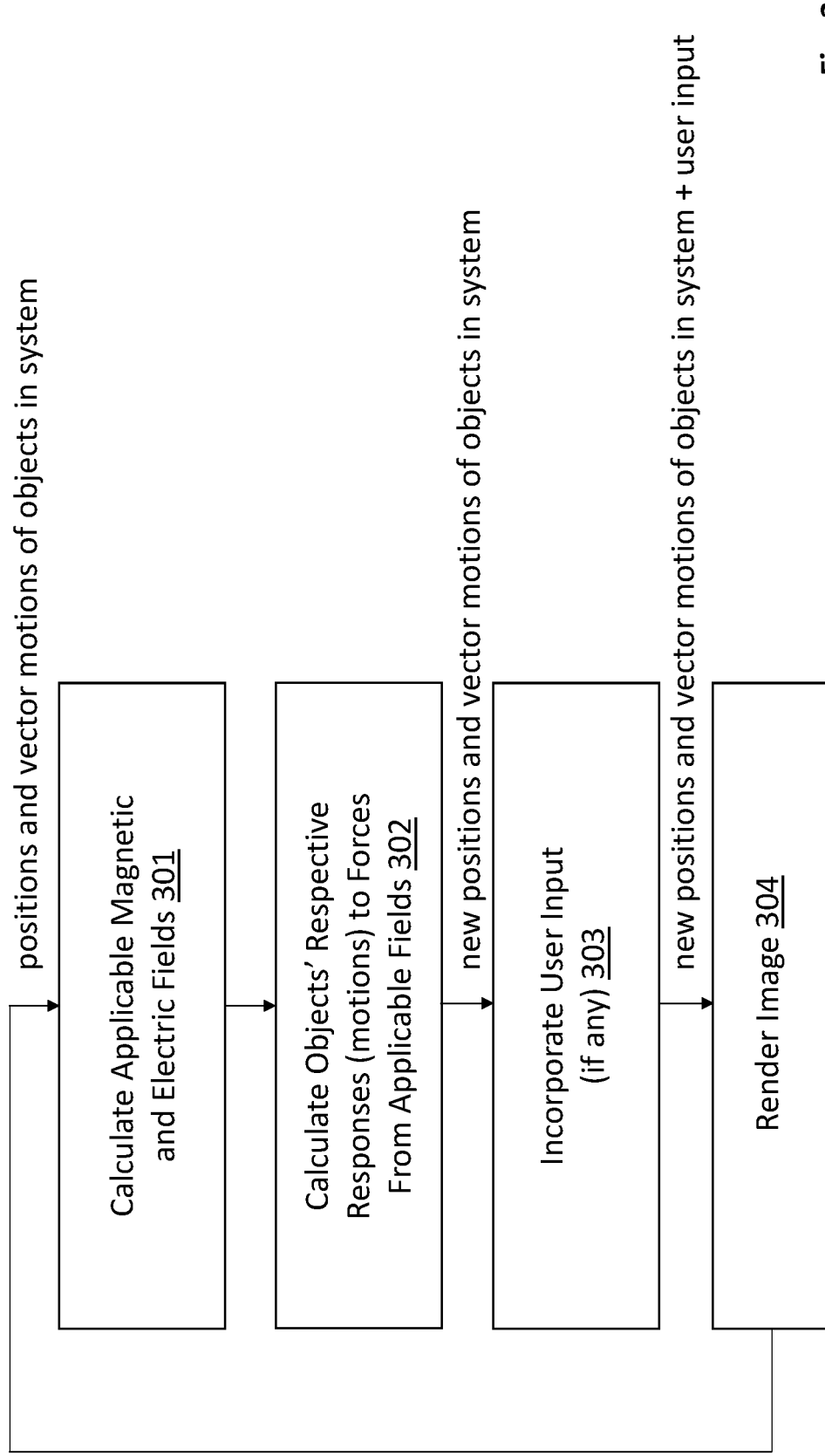
FIG. 3 depicts a first simulation method.

FIG. 3 shows a process flow to be executed by processing resources (e.g., central processing unit(s) (CPU(s)) and/or graphics processing unit(s) (GPU(s))) of the computing system (e.g., tablet computer) that is to implement the simulator. As observed in FIG. 3, initially, the identity of each of the objects in the system (e.g., positive charge, negative charge, etc.), the respective position of each such object (e.g., for a 2D simulation, their (x,y) location on the display screen) and the respective motion of each such object (if any) are taken in as input information.

In the case of a new environment to be simulated, the input information corresponds to the first object or objects that are initially added to the system. For example, using the simulation of FIGS. 2a through 2j as an example, the initial pair of charges of FIG. 2c may correspond to an input to the simulator. Here, a positive charge is identified and its position is provided, also, a negative charge is identified and its position is provided. Then, expressions for fields resulting from each of the objects are generated 301.

Again, using the example of the simulation of FIGS. 2a through 2j as an example, respective expressions for the fields generated by both the charges of FIG. 2c are generated. Referring back to Eqn. 1, the expression for the field generated by the positive charge would have a positive q term and the expression for the field generated by the negative charge would have a negative q term. In various embodiments, each charge has its own specific charge magnitude (e.g., +5q, +4q, etc.) but in various embodiments a default same charge (e.g., +/−1q) is used for both positive and negative charges.

The electric fields generated by each charge can be efficiently calculated in the CPU or GPU using equation 1. The magnetic field at any point in space from a current ring in equation 2b involves elliptical integrals that have no closed-form solution, and therefore cannot be calculated in a CPU or GPU. In an embodiment, the expressions for the magnetic field(s) generated by a current ring is implemented as a series expansion approximation (e.g., a Taylor or MacLaurin series expansion) of the classical equation for the particular field (e.g., a Taylor or MacLaurin series expansion is used to approximate Eqn. 2b for a current ring). Additionally, as a further approximation, only a few of the most significant terms of the expansion are included in the expression (higher order terms are not included). Thus, for instance, the expression as written in the code for the magnetic field generated from the current ring of FIG. 1f may take the form of:

$$\underline{B} = (a_0 + a_1(x - x_{ob}) + a_2(x - x_{ob})^2)\underline{x} + (b_0 + b_1(y - y_{ob}) + b_2(y - y_{ob})^2)\underline{y}$$ Eqn. 6a if only three terms of the expansion are used; or, $$\underline{B} = (a_0 + a_1(x - x_{ob}) + a_2(x - x_{ob})^2 + a_3(x - x_{ob})^3)\underline{x} + (b_0 + b_1(y - y_{ob}) + b_2(y - y_{ob})^2 + b_2(x - x_{ob})^2)\underline{y}$$ Eqn. 6b if four terms of the expansion are used.

In the above equations, the coefficients $a_i$ and $b_i$ directly derivable from the scalar/coefficient terms of the applicable classical expression (e.g. Eqn. 2b) and the manner in which the $a_i$ and $b_i$ terms are derived for the particular type of series expansion being utilized. The resultant field ($\underline{B}$) is expressed as a vector having both an $\underline{x}$ component and a $\underline{y}$ component and is thus applicable to a 2D simulation. A third vector component ($\underline{z}$) could be introduced to support simulations over three dimensions.

As observed above, the expression incorporates an offset to account for the position ($x_{ob}$, $y_{ob}$) of the object that generates the field. That is, the magnetic field $\underline{B}$ is the magnetic field that results from a current ring that is positioned at position ($x_{ob}$, $y_{ob}$). Similarly, the electric field $\underline{E}$ is the electric field that results from a charge that is positioned at position ($x_{ob}$, $y_{ob}$). Thus, referring back to the exemplary simulation of FIG. 2c, the simulator program code generates two electric field expressions: a first expression for the electric field created by the positive charge that incorporates the x,y position of the positive charge as its offset, and, a second expression for the electric field created by the negative charge that incorporates the x,y position of the negative charge as its offset.

The electric field at any point in space from a ring of charge, a circular disk of charge, or other charge configurations can be developed in a manner similar to equation 2b and approximated in a manner similar to equations 6a and 6b. The magnetic field from arbitrary current configurations can be handled in a similar manner. Although the mathematical result of a series expansion without its higher ordered terms has some error with respect to what a more thorough theoretical analysis would provide, the error is nonetheless negligible for purposes of the rendered animation (the motion of the objects as rendered is only slightly different from how the objects would move in an actual system).

Importantly, the reduction of each field expression to, e.g., a polynomial of only a few terms for each dimension greatly reduces the computational intensity of the simulation. Here, for instance, a typical CPU and/or GPU of a mobile device, such as a smart phone or table computer, can execute each field expression at the object code level in only a few, e.g., multiply-accumulate instructions. As an example, on a standard tablet CPU, over 10,000 electric field calculations can be handled in less than 16-milliseconds, which corresponds to over 100 charges being efficiently handled on-screen at a frame refresh rate of 60 frames-per-second. Similarly, over 3,600 magnetic field calculations can be handled in the same CPU at a fluid 60 frame-per-second refresh rate. Further improvements can be made moving these calculations to the GPU.

The execution of process 301 therefore entails determining new expressions for each of the applicable fields in response to the new position, velocity, etc. data of the various objects. In terms of the machinery of a computing system, this entails the calculation of new coefficient values for the series expansions for each of the fields at play in the simulation and preserving them within the system (e.g., in register space of a CPU and/or to system memory).

After expressions for each of the fields have been calculated, the simulator calculates the force applied to each object by the various fields that exist in the system and determines the resulting motion of each object 302. Here, again referring to the exemplary simulation of FIGS. 2a through 2j, during the initial iteration, the electric field applied to the positive charge is found by inserting the x, y position of the positive charge into the x,y terms of the expression for the electric field generated by the negative charge. Here, $$\underline{F} = m\underline{a}; \text{ or } \underline{a} = q\underline{E}/m$$ Eqn. 7 where $\underline{E}$ is the electric field applied to the positive charge, m is the mass of the positive charge (which may also be defined in the input description of the positive charge object) and $\underline{a}$ is the acceleration of the positive charge. Here, $\underline{a}$ is a vector having x and y components given that $\underline{E}$ is a vector having x and y components.

Thus, the motion that is induced upon the positive charge can be determined as $$\underline{v} = \underline{a}\Delta t + \underline{v_0} = (a_x \Delta t + v_{0x})\underline{x} + (a_y \Delta t + v_{0y})\underline{y}$$
$$= ((F_x/m)\Delta t + v_{0x})\underline{x} + ((F_y/m)\Delta t + v_{0y})\underline{y}$$ Eqn. 8 where v is the velocity of the positive charge, $a_x$ and $a_y$ are the x and y components of the positive charge's acceleration, $v_{0x}$ and $v_{0y}$ are the positive charge's initial velocity terms in the x and y directions respectively (both terms of which are zero during the initial "still" starting state of the system) and $\Delta t$ is the amount of time that transpires between rendered images of the simulation. The velocity equations above are incorporated into the following displacement equations (assuming constant acceleration)

$$x_{new} = x_{ob} + \frac{1}{2}(F_x/m)\Delta t^2 + v_{0x}\Delta t$$ Eqn. 9a $$y_{new} = y_{ob} + \frac{1}{2}(F_y/m)\Delta t^2 + v_{0y}\Delta t$$ Eqn. 9b where $x_{new}$ is the new x coordinate location of the positive charge and $y_{new}$ is the new y coordinate location of the positive charge. Thus, for a simulation that renders the real time motion of the objects in time units of Δt per rendered image, the next rendered image will draw the positive charge at position $x_{new}$, $y_{new}$ (instead of $x_{ob}$, $y_{ob}$) which will appear to the naked eye of the user as movement of the positive charge from position $x_{ob}$, $y_{ob}$ to position $x_{new}$, $y_{new}$. An identical calculation is also performed for the negative charge but where the electric field that is applied to the negative charge is determined from the expression of the electric field generated by the positive charge having its x,y terms set to the position of the negative charge. The velocities of the objects are kept along with the positions of the objects so they can be used as the initial velocities (vo) for the next iteration.

Thus, at the conclusion of the forces/motions calculations 302, new positions for both objects (both the positive and negative charge) are provided. The process then inquires whether the user has provided any input taps/touches since the rendering of the previous image (there were none after the initial setup of FIG. 2c) 303. The process then redraws the objects in their new positions 304. Here, for instance, the objects may be redrawn at the positions observed in FIG. 2d which depicts movement in relation to their initial positions of FIG. 2c. The rendering process 304 includes not only the "drawing" of the new picture (or frame) in software (e.g., writing the new image in memory that is local to a GPU), but also physically drawing the new image on a display (e.g., reading the new data from the memory that is local to the GPU and directing it to a display driver circuit which physically draws the new frame image on the display).

The process then continually "loops" (iterates) with the "new" object positions and velocities that were determined from a just completed iteration (and were most recently rendered on the display) being used as the input positions and velocities for the next set of calculations that are performed for the immediately following iteration that will determine the object positions for the next rendered image.

After multiple loops, e.g., that result in the rendering of the images of FIGS. 2e through 2g, the collision of the positive and negative charges eventually occurs. Here, e.g., in the loop that immediately precedes the display of FIG. 2h, the forces and object motion calculation 302 not only determines the velocities of the charges but also detects the collision between them and then executes, e.g., conservation of momentum equations (which may also be expressed as a series expansion approximation) to calculate the motion and resulting positions of the charges after the collision, which are rendered as depicted in FIG. 2h.

The process then continually iterates. After multiple loops, the electrical force and mechanical force (collision) calculations 302 settle and the pair of charges reach an electrostatically stable state as an electrostatic dipole (the electrostatic force calculations for the pair of charges demonstrate maximum attraction between them). The mechanical force calculations provide results that articulate the spinning of the dipole which are subsequently rendered as depicted in FIG. 2i.

During a subsequent loop, process 303 is triggered with the user's addition of the additional charges. Here, process 303 adds a description of each charge (its (x,y) position, it's mass, the polarity of its charge) to an overall description of the system being simulated. The new charges are then rendered as observed in FIG. 2j. When the next iteration starts, process 301 accepts as input information not only the description of the position and motion of the electrostatic dipole, but also the descriptions of the newly added charges.

As such, the electric field calculations 301 are expanded to include not only an expression for the electric field generated by the dipole, but also a respective expression for the electric field generated by each of the newly added charges. The subsequent electrical forces and mechanical calculations 302 determine the force applied to the dipole by the respective electric field of each of the newly added charges, and, determine the force applied to each newly added charge by the electric field created by the dipole and the respective electric field created by every other newly added charge. Again, however, the expansion of the calculations does not result in overly intensive numeric computations owing to how quickly each of the calculations can be made (e.g., a few instructions for each calculation). Ultimately the electrical and mechanical collision calculations 302 determine the resulting motions and positions of the dipole and each of the newly added charges from their electrostatic interactions. The newly calculated positions for each of the objects are then rendered on the display.

The program flow then continues to iterate, with each new iteration accepting the most recently calculated position and velocity of each object as input information, then, calculating the fields generated by the objects 301 from the input information and the electrical and mechanical forces applied to the objects and their resulting motions and positions in response thereto 302, and, rendering the objects in their newly calculated positions 304 (no user input happens after the charges of FIG. 2j are added). The results of these iterations are respectively depicted in FIGS. 2k through 2l.

In the aforementioned discussion of the rendered displays of FIGS. 2a through 2l in view of the iterations of the process of FIG. 3, for the sake of simplicity, magnetic forces and magnetic objects were ignored. Magnetic fields created by the movement of electric charges were not addressed and no magnetic dipole or magnet was added to the system by the user. According to various embodiments, even if no magnetic object is deliberately added to the system, magnetic fields may nevertheless exist owing to the movement of electrical charges (see, e.g., the discussions pertaining to FIGS. 1d through 1g).

Moreover, to the extent such magnetic fields change and/or charges pass through such magnetic fields, as discussed above in the preceding section, electric fields can be created that affect the motion of the electrical charges. Further still, if a magnetic object, e.g., a magnet, were added to the system by the user, it would interact with the other objects in the system. For example, its constituent magnetic dipoles might try to align themselves with a net magnetic field created by the motion of the electrical charges, the magnetic field created by the magnet might affect the motion of the electrical charges, etc.

In any/all of these scenarios, the incorporation of another field into the simulation is accomplished by merely adding a series approximation expansion with reduced terms for that field into the set of fields that are determined at process 301 (e.g., to account for any magnetic field induced by a moving charge, a separate expression for the magnetic field created by each charge is added to the set of field equations).

Figure 4:
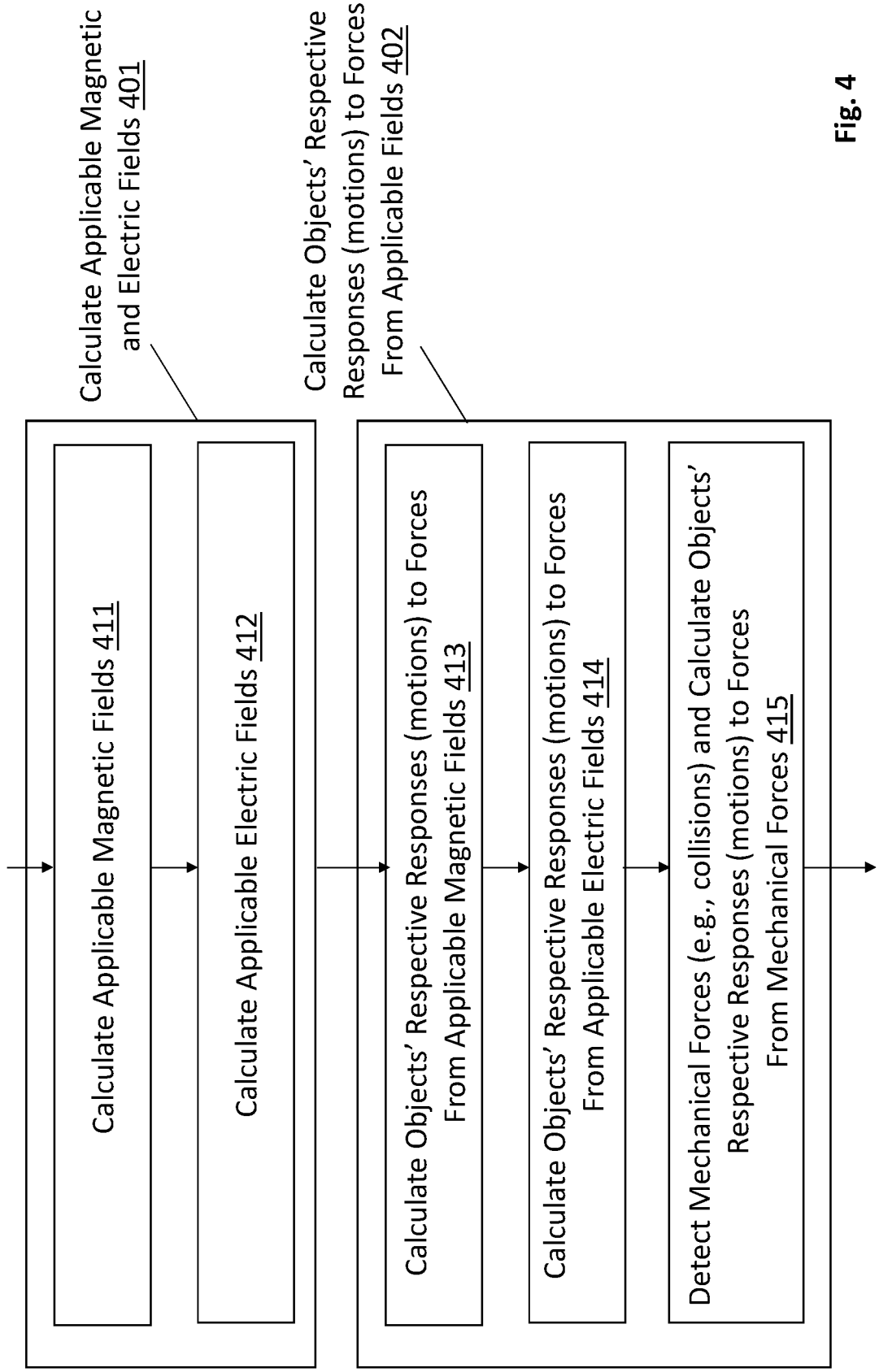
FIG. 4 depicts a second simulation method.

FIG. 4 shows a more detailed embodiment of the simulation approach of FIG. 3 that accounts for the presence of magnetic fields and/or objects in the system being simulated. As observed in FIG. 4, the fields calculations process 401 first calculates all magnetic fields 411 and then calculates all electric fields in the system 412 (as discussed above with respect to FIG. 3). The forces and responses process 402 of the simulation approach of FIG. 4 determines 413 all magnetic forces applied to magnetic objects in the system and any responsive motion to such force (e.g., magnetic dipole rotation) and then determines 414 all electrical forces applied to all electrical objects in the system and any responsive motion to such force (e.g., acceleration and/or change in direction of any electrical charge).

Here, as discussed above, magnetic fields can result from the presence of magnetic dipoles in the system (e.g., from one or more magnets) and/or from the motion of electrical charges. Thus, in an embodiment, the fields calculation process 401 first calculates each of the magnetic fields 411 in the system that are respectively created from the various sources of magnetic fields that exist in the system (e.g., a magnetic field is calculated for each moving charge in the system and each magnetic dipole and/or magnet in the system).

In an embodiment, in order to calculate the magnetic field that results from a moving electrical charge, the velocity of the charge that was determined by the immediately preceding iteration is used to calculate the electrical current of the charge (specifically, the current of the charge is the charge's charge multiplied by its velocity). The electrical current is then used to determine the magnetic field created by the moving charge as a function of distance from the electrical charge in accordance with, e.g., classical equation Eqn. 2a. The magnetic field created by any magnetic dipole in the system (including the dipoles of any magnet in the system) is determined in accordance, e.g., with classical equation Eqn. 2b.

In various embodiments, both classical equations are expressed as series expansion approximations where, like the magnetic field calculations discussed above, higher ordered terms are ignored to provide for fast calculation of each field. The expressions may be multi-dimensional (e.g., having x and y components for 2D simulations or x, y and z components for 3D simulations).

With the net magnetic field that is applied to each magnetic object in the system being determined at the conclusion of process 411, the field calculation process 401 then performs the electric field calculations 412, e.g., as described above at length with respect to FIG. 3. However, in various embodiments, the electric field calculation 412 is further enhanced to determine electric fields created by changing magnetic flux and determine electric fields applied to electrical objects in motion that pass through a magnetic field.

In the case of the former (electric field created by changing magnetic flux as expressed, e.g., in Eqn. 4), the expressions for magnetic field from each of the magnetic field sources that were determined in the immediately prior calculation are preserved and a respective difference is taken with the newly determined expression for each magnetic source to determine an expression for change in magnetic field from each magnetic field source. The expression for change in magnetic field from each magnetic field source is then used to determine an expression for change in magnetic flux and any resulting electric field that results from such change (e.g., as a function of distance from the source).

In the case of the later (electric field applied to electrical objects in motion as expressed in Eqn. 3), the position of each electrical charge in motion that was accepted as an input term is used to determine the magnetic field that exists at the object in motion. The magnetic field that exists at the electrical charge's location and the velocity of the electrical charge that was accepted as input information are used to determine the electric field experienced by the electrical charge.

Again, in various embodiments, one or both expressions are implemented as series expansion approximations where higher ordered terms are ignored to provide for fast calculation of each field. The expressions may be multi-dimensional (e.g., having x and y components for 2D simulations or x, y and z components for 3D simulations).

After all magnetic fields have been calculated 411 and all electric fields have been calculated 412, the respective forces applied to the objects in the system by these fields is determined 402. With respect to magnetic objects (e.g., magnetic dipoles, magnets, etc.), the net magnetic field at each magnetic object is determined 413 by inserting the position of the magnetic object into each of the magnetic field expressions in the system (other than the object's own expression). Summation of the resultant from each expression corresponds to the net magnetic field applied to the magnetic object (which is expressed as a vector). With the net magnetic field applied to the magnetic object being defined, the response of the magnetic object is readily calculated 413 (e.g., a rotation of a magnetic dipole moment to a new orientation). In an embodiment, the process is performed for each magnetic object in the system.

The response of each electrical object to its net electric field 414 is determined as described above with respect to FIG. 3 with the additional recognition of any electric fields that result from a magnetic source. That is, the net electric field at each electrical object is determined 414 by inserting the position of the electrical object into each of the electric field expressions in the system (other than the object's own expression). The set of expressions are enhanced to include electric fields resulting from changing magnetic fields and motion of the object through a magnetic field. Summation of the resultant from each expression corresponds to the net electric field applied to the electrical object (which is expressed as a vector). With the net electric field applied to the electrical object being defined, the response of the electrical object is readily calculated 414 (e.g., acceleration of the electrical object in a particular direction with a specific velocity to a new position). The process is performed for each magnetic object in the system.

Additionally, any mechanical collisions between objects is detected and their responses thereto (e.g., as a function of object mass and velocity, etc.) 415. Ultimately, a new set of positions and/or orientations (and associated velocity) is determined for each magnetic dipole in the system. Likewise, a new set of positions and velocities is determined for each electrical charge in the system.

2.1 Free-Space Simulator Handling of Charge Distributions, Current Distributions and Structures Thereof In the examples above, the charges are each point charges and the magnets are treated as a series of current loops (magnetic dipoles). A conductive structure (usually a metal disk or metal sphere) is a structure which can accumulate charge. In general, charges will redistribute around the surface of a conductive structure until the electric fields inside the conductive structure are zero. Any complex distribution of charge is possible on the surface the conductor, so long as the electric field inside the conductor is zero.

A challenge faced by the simulator is how to efficiently simulate free space environments having conductive structures within them. According to one approach, rather than "tracking" individual units of charge within a conductor and determining fields emanating to/from such charges on an individual charge-by-charge basis while keeping them confined to the conductive structure, instead, a charge distribution equation that is specific to the structure is called out by the simulator and executed over the amount of charge applied to the structure and the dimensions of the structure (a distribution of charge generally includes more than one unit of charge spread out over some surface area).

That is, for instance, the user (e.g., from a pull down menu) may introduce a particular type of structure to the free space environment (e.g., a metal disk or metal sphere), assign dimensions to the structure (e.g., by the user tapping on the screen and physically spreading its dimensions in/out on the screen with the user's fingertips) and assign an amount of charge to the structure. In response, the simulator calls up an equation for charge distribution that is specific to the particular structure called out by the user. The equation generally includes the dimensions of the structure and the amount of charge placed on the structure as input parameters which, again, are received from the user's input definition of the structure.

From the charge distribution equation, the fields that emanate from the structure (in the case of a positively charged conductive structure) or the fields that sink to the structure (in the case of a negatively charged conductive structure) are readily calculated with, e.g., a second equation that expresses electric fields from/to a distribution of charge (rather than individual charges on a charge-by-charge basis). Thus, the complex task of attempting to simulate fields to/from charged structures is very efficiently handled by simply executing a pair of equations rather than simulating over each of the individual charges within the structure. With this simplification, the computational intensity is greatly reduced allowing for fast and efficient field determinations and renderings per iteration.

Figure 2N:
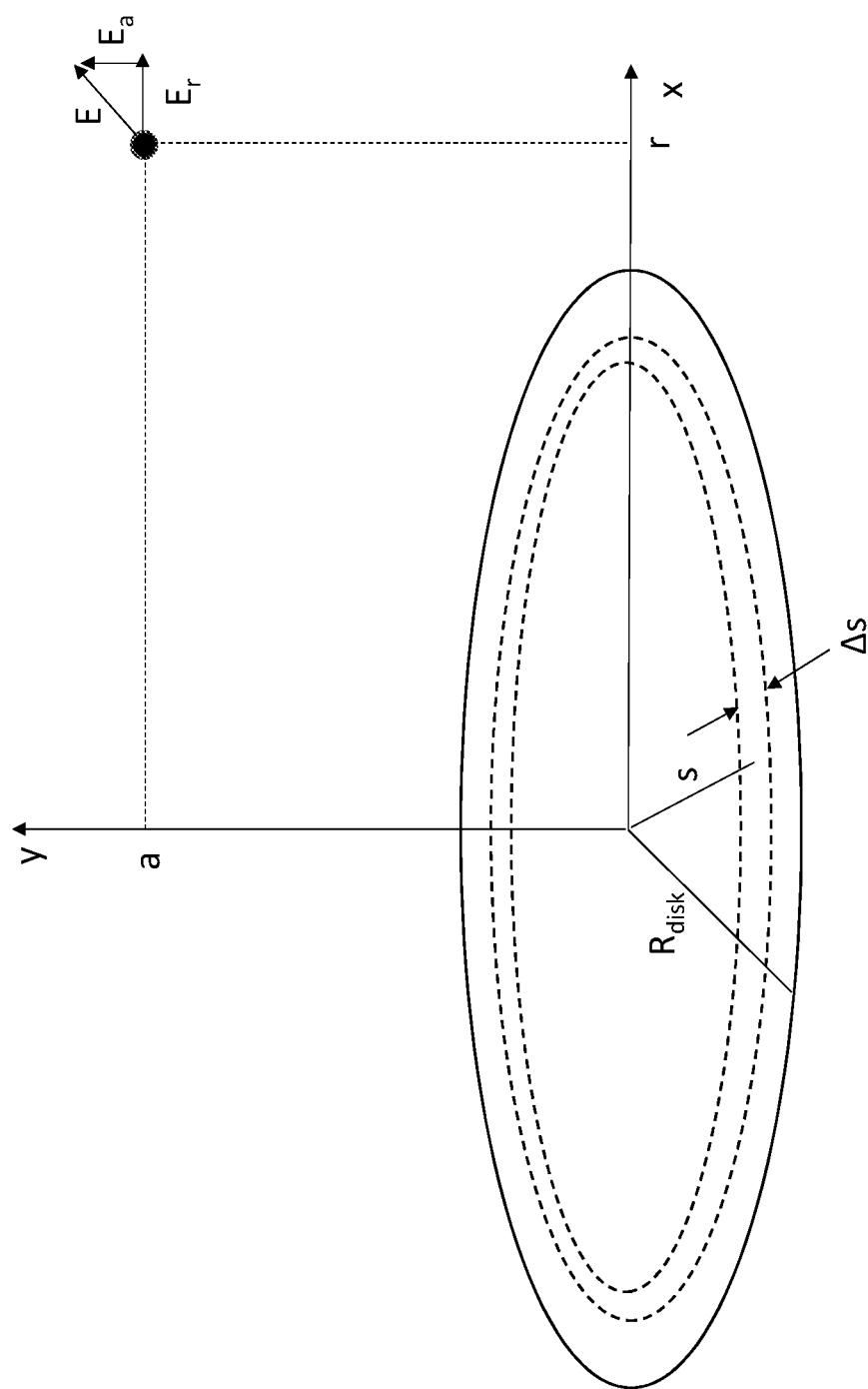

Referring to FIG. 2n, consider a circular disk conductor with a nearby free charge. At each simulation iteration, the simulator calculates the magnitude and direction of the electric field that emanates from or sinks to the disk at the location of the free charge in order to determine the force to apply to the free charge. Rather than model charges inside the circular disk conductor individually and independently, the circular disk in free space is assumed to have a non-uniform charge density, or charge per unit area ($\sigma_{disk}$) of:

$$\sigma_{disk}(s) = \frac{Q_{disk}}{2\pi R_{disk}}\left(\frac{1}{\sqrt{R_{disk}^2 - s^2}}\right) \qquad \text{Eqn. 10a}$$

where s is a position on the disk measured as its distance from the center of the disk, $R_{disk}$ is the disk's radius, and $Q_{disk}$ is the total charge placed on the disk. As illustrated in FIG. 2n, the electric field from a linear or "thin" ring of charge a distance s from the center of the disk can be calculated and approximated in a manner very similar to the magnetic field calculations in Equation 2b.

Specifically, the electric field, $\vec{E}$, at a location of the free charge is a vector which has components in both the radial direction (in general $\vec{r}$, but in this case, $\vec{x}$), and the axial direction, $\vec{a} = \vec{y}$. The components of this electric field, $\vec{E} = E_r\vec{x} + E_a\vec{y}$, are $$E_r = \frac{Q_{ring}}{4\pi\epsilon_0}\frac{2}{\pi q^{3/2}(1-m)} \qquad \text{Eqn. 10b}$$

$$\frac{1}{m}[2sK(\sqrt{m})(1-m) - E(\sqrt{m})(2s - m(r+s))]$$

$$E_a = \frac{Q_{ring}}{4\pi\epsilon_0}\frac{2}{\pi q^{3/2}(1-m)}[aE(\sqrt{m})]$$

where r is the distance to the free charge from the center of the ring, a is the axial (y) distance to the free charge, s is the radius of the ring, $q = r^2 + s^2 + a^2 + 2rs$, and $$m = \frac{4rs}{q} \cdot E(\sqrt{m})$$

and $K(\sqrt{m})$ represent the elliptical integrals of the first and second kind (respectively). Referring to FIG. 2n and using Eqn. 10a, $Q_{ring}$ is calculated using the area of the ring:

$$Q_{ring} = A_{ring} \cdot \sigma_{disk}(s) = \Delta s 2\pi s \cdot \frac{Q_{disk}}{2\pi R_{disk}}\left(\frac{1}{\sqrt{R_{disk}^2 - s^2}}\right) = \qquad \text{Eqn. 10c}$$

$$Q_{disk}\Delta s \cdot \frac{s}{R_{disk}}\left(\frac{1}{\sqrt{R_{disk}^2 - s^2}}\right)$$

Combining Eqns. 10b and 10c, and using a numerical series approximation for $E(\sqrt{m})$ and $K(\sqrt{m})$ similar to the approach explained above with respect to Eqn. 2b, the electric field from a ring of charge can be calculated in only a few instructions (e.g., a SUB instruction, a SQRT instruction, a DIV instruction and a MUL instruction to execute Eqn. 10c to determine $Q_{ring}$; one multiply accumulate instruction to determine $E_a$ of Eqn. 10b; two multiply accumulate instructions and a SUB instruction to determine $E_r$ of Eqn. 10b; and, some pre-cursor MUL instructions and other arithmetic instructions to determine the constant/coefficient terms in these equations) as all other quantities are known.

The electric field of several of these rings (several values of s in Eqns. 10a and 10c) can be numerically integrated (i.e., summed) to approximate the electric field for a complete disk. As an example, assuming the disk is made up of 8 rings, the code footprint of only a few instructions as described above are executed 8 times and the $E_r$ and $E_a$ components are summed to find an accurate approximation for the electric field $\vec{E}$ at the current location of the free charge, (r, a).

Traditional free-space simulators, or field solvers, would require many iterations (typically on the order of thousands) in order to find the exact charge distribution on a conductor, a process which often takes minutes to hours for simple structures. Utilizing structures for which the charge distribution and the resulting electric field can be accurately approximated in a few simple equations helps realize a real-time simulator on, e.g., a fairly low end processor platform (e.g., as is typical with tablet or personal computers). In fact, any distribution of charges (i.e., any charge density) can be used to calculate the electric fields, so long as the field calculation can be efficiently performed within one simulation iteration.

The similar approach can be taken for magnetic fields. The discussion of Eqn. 2b described a compute efficient approximation for the magnetic field at any point in space from a set of current loops. A set of current loops essentially corresponds to a current distribution. This, as with charges on conductor structures, a user may call-out a structure with a specific current distribution, such as a toroidal coil or a current sheet, and the simulator pulls up an equation for current density inside the structure. After calculating the current at a number of locations inside the structure from the current density equation, the simulator will be able to approximate the magnetic field from the structure as the summation of magnetic field calculations from the current densities from each of the different locations.

3.0 Work Sharing Between CPU and GPU

Most all computing systems include both a central processing resource (e.g., a processor having multiple central processing unit (CPU) cores) and a graphics processing resource (e.g., a graphics processing unit (GPU)). In general, the GPU is designed to execute animation or other computer generated graphics programs to off-load the burden of executing these tasks from the CPU (graphics processing programs tend to be numerically computation intensive). In various embodiments, referring back to FIG. 3, a CPU performs processes 301, 302 and 303, and, a GPU performs process 304.

For example, the overall program flow includes the CPU writing new object positions, velocities, etc. into system memory (or "main memory") after the CPU executes process 303. Then, the GPU reads the new positions, velocities, etc. from system memory, processes the data and causes a new frame image that incorporates the new data to be rendered on the display during process 304.

Here, some pipelining is possible between the GPU and CPU. That is, for example, after a set of new object positions, velocities, etc. have been read from system memory by the GPU for rendering, the CPU may then subsequently read the same data from system memory to begin the field calculations 301 for the next iteration. That is, over some instant of time or contiguous window of time, the GPU is executing process 304 for a prior iteration while, concurrently, the CPU is executing process 301 (and possibly even process 302) for the immediately following iteration.

In some embodiments, the simulator can show the user the electric and/or magnetic fields. That is, for instance, the user not only observes the motion of an electrical charge in response to an electric field and/or the motion of a magnetic dipole in response to a magnetic field, but also, the simulator draws for the user the electrical and/or magnetic fields (e.g., the user observes the field lines of any of FIGS. 1a through 1k).

At least in embodiments where the field lines are to also be drawn, the GPU may be configured to perform not only process 304 of the prior iteration, but also, process 301 of the immediately following iteration. Here, although the GPU and CPU are different types of processors, nevertheless, they typically share some common mathematical computation abilities such as the execution of basic arithmetic instructions and/or object code processes.

Thus, according to another pipelined load sharing approach, the GPU not only processes and causes the rendering of the data from a prior iteration (process 304) but also calculates the fields 301 for the immediately following iteration (process 301).

Here, the GPU reads from main memory the new positions, velocities of the prior iteration and loads them into its local memory. From the GPU's local memory, process 304 of the prior iteration and process 301 of the immediately following iteration are performed by the GPU (process 301 accepts as input data the positions, velocities, etc. of objects generated from the prior iteration). The GPU then writes values for the new field equations (e.g., the GPU writes new coefficient values (e.g., for a series expansion that approximate each of the fields or other field expression)) into system memory while keeping a copy of these coefficients in its local memory. When the GPU next reads the new object positions, velocities, etc. from main memory to render the image for the immediately following iteration, the coefficients or other values for the applicable fields are already resident in its local memory and the CPU can process their rendering commensurate with the rendering of the updated object positions, velocities of the immediately following iteration. The process then repeats.

According to this approach, for example, the CPU may additionally perform process 302 and possibly even process 303 (or portion thereof) while the GPU is performing process 304 for the prior iteration and/or the data from the prior iteration is being rendered. Here, to implement the pipeline more efficiently, the GPU may first determine the fields for the next iteration and make them available to the CPU (e.g., by writing them into memory). Then, the GPU begins the task of processing the data 304 for the prior iteration and then causing the same to be rendered. By determining values for the fields for the next iteration first, the CPU has data to operate on (to determine forces/motions 302 of a next iteration) at approximately the same time the GPU has data to operate on (graphics processing and rendering 304 of the prior iteration). The two processors can then operate concurrently on their respective input data to effect a pipeline.

4.0 Simulation of Electrical Circuits

Figure 5:
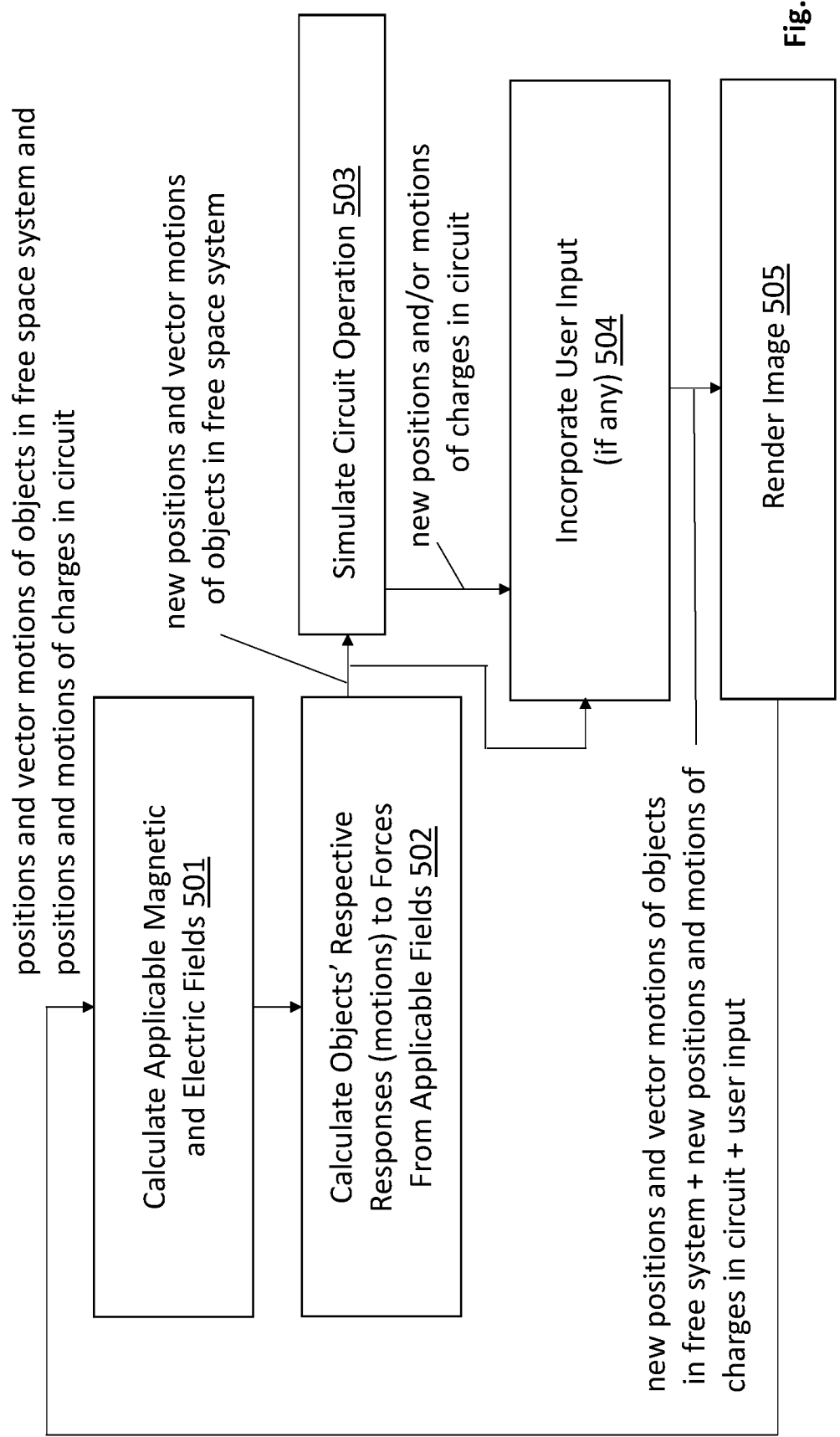
FIG. 5 depicts a third simulation method.

The simulator described above in the preceding sections emphasized the simulation of freely moving electrical charges and/or magnetic dipoles ("free space" simulations). FIG. 5 shows another simulation approach that extends the simulation processes of FIGS. 3 and 4 to further include simulation of electronic circuit structures 503. Here, as will be described in more detail below, the simulator is not only capable of simulating a free space system by itself or an electrical circuit system by itself, but also, a single system that includes both free space and electrical circuit elements and the interactions between them.

For example, in the case of the later, the current flowing through the wire of an electrical circuit will generate a magnetic field in free space that can affect the position of a magnet that sits in free space in proximity to the wire. Here, electrical circuits can affect the behavior of surrounding free space charges and/or magnetic dipoles and vice-versa (the movement of charges and/or dipoles in free space can affect the currents and/or voltages in a proximately located electrical circuit). The simulator is capable of simulating any/all of free space and electrical circuit systems including simulation environments that include both systems and the interactions between them.

FIG. 5 shows an embodiment of a process flow for an embodiment of a complete simulator that is capable of simulating free space electric and/or free space magnetic systems, electrical circuits and interactions between free space system(s) and electrical circuit systems. The simulator embodiment of FIG. 5 corresponds to the simulator of FIG. 3 but with a circuit simulation block 503 inserted between the free space simulation (301/501, 302/502) and the incorporation of user input (303/504). Here, note that the circuit simulation 503, like the free space simulation of free electrical charges, provides new positions and motions of charges in the circuit being simulated with each next iteration.

These are combined with the new positions and motions of the objects (e.g., free charge(s), dipole(s)) in the free system that were calculated by the free space simulation calculations 501, 502). Thus, after any user input 504 is accounted for, the rendering apparatus (e.g., a GPU) is provided with a description of the new positions and motions of the free space objects and the new positions and motions of the electrical charges in the circuit. The free space objects and circuit charges are then rendered on the display so the user can observe their motions in accordance with the system being simulated. Note that in environments where no circuit is present, process 503 is not performed and overall simulation operation is as described above with respect to FIG. 3. Contra-wise, in the case where no free space objects exist and only a circuit structure exists, processes 501 and 502 are not performed and the overall process reduces to just performing a circuit simulation 503.

Figure 6:
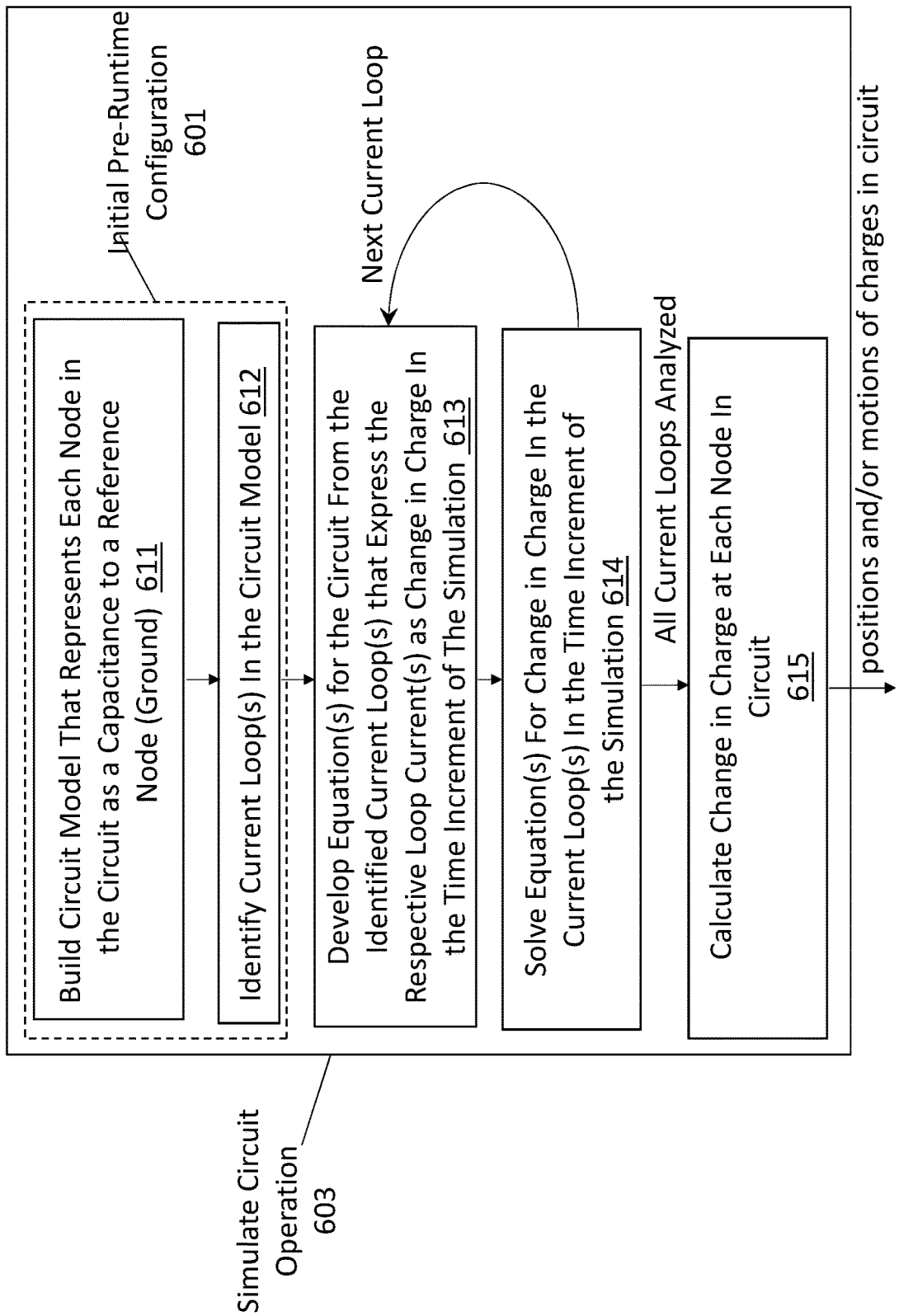
FIG. 6 depicts a fourth simulation method.

FIG. 6 shows an embodiment for the circuit simulation 503, 603 itself. The details of the process described by FIG. 6 are explained more thoroughly immediately below with respect to an example, presented in FIGS. 7a through 7f, that pertains to a current driven through an inductor of an electrical circuit that causes a free space magnet to rotate and a free space charge to move.

Referring to FIG. 7a, a circuit structure 701 is shown in the proximity of a free space magnet 702 and a free space charge 703. Here, the depiction of FIG. 7a can be viewed as the presentation on the computer display after the user has, e.g., made a screen tap at each location where a structure appears and selecting from a menu each specific structure that is observed at its respective location. The circuit includes two charged spheres A, B which represent the nodes of the circuit (that is, the circuit only has two nodes A and B). The user has placed five units of positive charge (+5q) on sphere A and five units of negative charge (−5q) on sphere B. The charge spheres A, B are each connected to respective wires that are in turn connected to different ends of an inductor L. Each of the spheres, the wires and the inductor are fixed in their positions (they cannot move).

A magnet 702 exists in free space in proximity to the inductor L. The magnet 702 is fixed to the position of its midpoint, however, it can rotate about the midpoint. A free charge 703 having one unit of positive charge (+q) also exists in free space between the conducting spheres A, B of the circuit.

Referring to FIGS. 5 and 7a, from the initial "still" state of FIG. 7a, during the initial iteration of the simulator flow, the free space calculations will first determine 501 respective expressions for the electric fields that emanate from the positive sphere A and the free charge 703, the electric fields that are sunk by the negative sphere B and the magnetic fields of the magnet. From these field expressions the free space calculations will determine the forces 502 that are applied to the free charge 703 and the magnet 702, from which, in turn, a new position and vector motion for the free charge 703 is determined (the free charge 703 will move "down" toward the negative sphere B as it is repelled from the positive sphere A and attracted to the negative sphere B). There is no motion of the magnet 702 as there are no magnetic fields in the "still" system of FIG. 7a other than those from the magnet 702. Thus, at the conclusion of process 502 during the first iteration, a new position and motion for the free charge 703 will have been determined.

The process then flows to the circuit simulation 503. With respect to the circuit simulation 503, referring now to FIGS. 6 and 7b, during the initial iteration of the simulator (which is the present situation), the circuit simulation will perform an "initial pre-runtime" configuration 601 of the circuit simulator. This entails building 611 a model of the circuit 704 including introducing a capacitance to a same reference (e.g., ground) for each node in the circuit and then identifying 612 different loops of current (or "current loops") within the circuit (generally, at least one current loop must flow through every component in the circuit).

Here, the exemplary circuit of FIGS. 7a-f is simplistic and includes only one current loop 705 (which flows out of one sphere, through the inductor and into the other sphere). It is pertinent to point out that more complex circuit structures can be simulated by the simulator. Thus, more generally, referring to FIG. 6, once the capacitances have been added 611 and the current loops have been identified 612, the simulator develops expressions 613 from the identified current loop(s) that expresses their respective current(s) as change in charge in the time increment of the simulation iteration. The equation(s) are then solved 614 for the respective change in charge in the time increment of the simulation for each of the identified current loop(s).

According to one approach that is consistent with Kirchoff's Voltage Law (KVL), or more generally, Faraday's Law, an expression is developed for each identified current loop that expresses the voltage drop across each component along a current loop as a function of the change in charge in the time increment of the simulator that flows through the component, where, the sum of the voltage drops along a same current loop must equal the induced EMF from any changing magnetic fields in the circuit. In the case of more complex circuit structures having multiple current loops, more than one current loop may flow through a same component and the expression for the voltage drop across the component includes the change in charge in the time increment of the simulator for each current loop that flows through the component.

According to another approach that is consistent with Kirchoff's Current Law (KCL), expressions for the currents of the various identified current loops that flow into various nodes of the circuit are developed, where, the net sum of all loop currents flowing in or out of a same node must equal zero. Again, the current of each current loop is expressed as a change in charge in the time increment of the simulator. According to one approach, the number of nodes that an expression is developed for is equal to the number of identified current loops. For the sake of simplicity, only a KVL approach is considered in the following discussions.

Figure 7C:
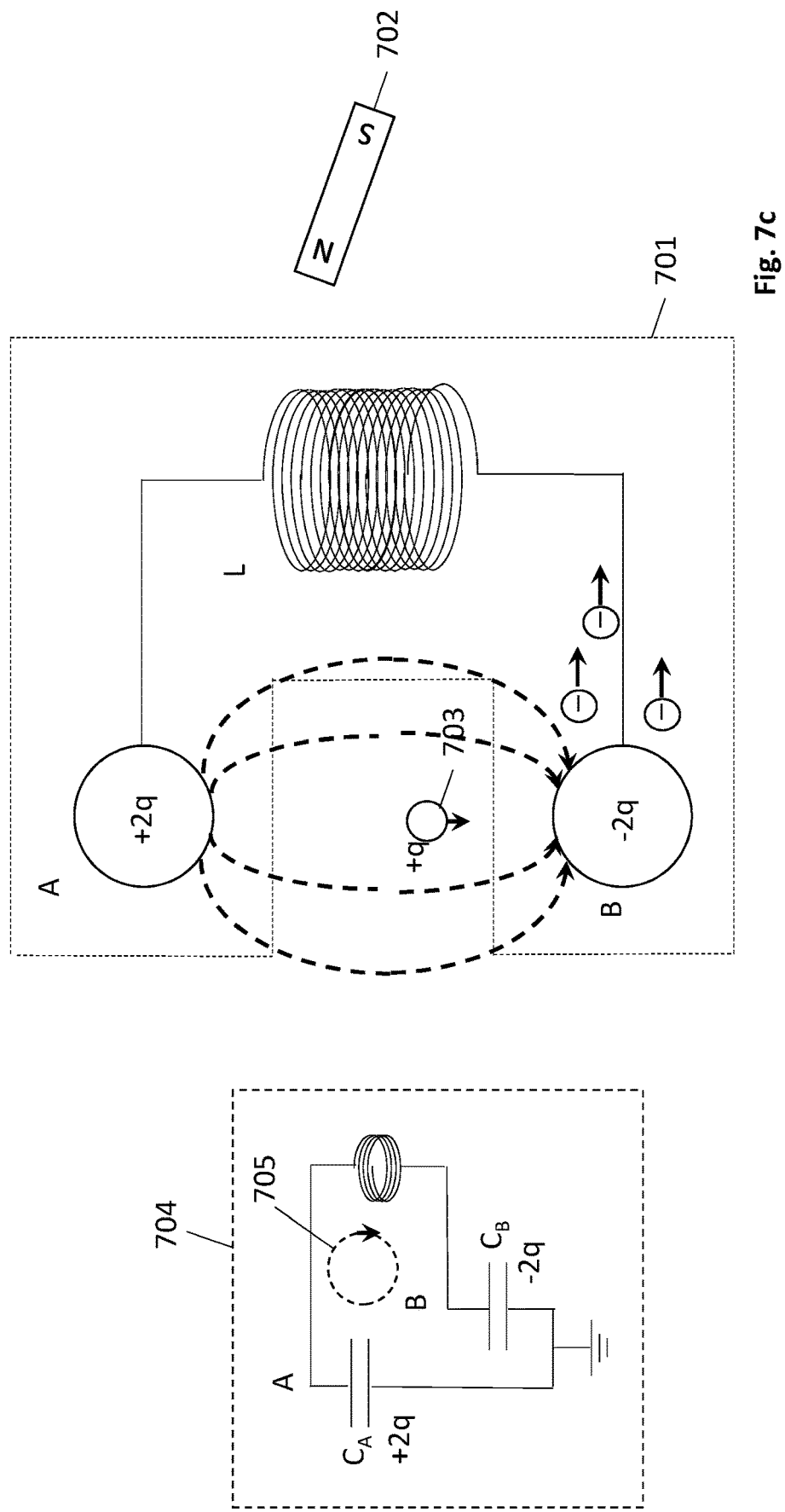

Returning then to the more simplistic example of FIGS. 7a-f, note that both the added capacitances $C_A$, $C_B$ and the identified current loop 705 are drawn in FIG. 7b at inset 704. In various embodiments, the user does not actually observe the circuit model of inset 704 (its presence is only contemplated internally within the simulator flow). Rather, the user only observes the circuit structures and free space objects that the user entered on the display.

Eqn 13 (presented further below) provides the expression that is developed for the single loop current 705 of the example of FIGS. 7a-e. Eqns 11 and 12a-c provide theoretical insight into the development of Eqn. 13. According to a KVL analysis of the single current loop 705, $$V_{C_A} - V_{C_B} - \varepsilon_L = 0, \text{ or } V_{C_A} - V_{C_B} = \varepsilon_L \qquad \text{Eqn. 11}$$

where $V_{CA}$ is the voltage of node/port A; $V_{CB}$ is the voltage of node/port B; and, $\varepsilon_L V$ is the EMF induced across the inductor. Each of these voltage terms can be respectively expressed as a function of current through the current loop. More specifically, $V_{CA}$ can be expressed as:

$$V_{C_A} = \frac{q_{A,i}}{C_A} = \frac{-\Delta q_{AB,i} + q_{A,i-1}}{C_A} \qquad \text{Eqn. 12a}$$

where: 1) $q_{A,i}$ is the charge on capacitor $C_A$ for the present iteration; 2) $C_A$ is the capacitance of capacitor $C_A$; 3) $-\Delta q_{AB,i}$ is the loss in positive charge at node A (from the gain of negative charges at node A) for the present iteration; and, 4) $q_{A,i-1}$ is the charge at node A from the prior iteration (which is the initial condition of +5q for the first iteration). Likewise, $V_{C_B}$ can be expressed as:

$$V_{C_B} = \frac{q_{B,i}}{C_B} = \frac{\Delta q_{AB,i} + q_{B,i-1}}{C_B} \quad \text{Eqn. 12b}$$

where: 1) $q_{B,i}$ is the charge on capacitor $C_B$ for the present iteration; 2) $C_B$ is the capacitance of capacitor $C_B$; 3) $\Delta q_{AB,i}$ is the gain in positive charge at node B (from the loss of negative charges from node B) for the present iteration; and, 4) $q_{B,i-1}$ is the charge at node B from the prior iteration (which is the initial condition of −5q the first iteration).

Notably, because a same, single current loop 705 is being considered, the loss of negative charge from node B must equal the gain of negative charge at node A. As such, $\Delta q_{AB,i}$ is the same value in both equations 12a and 12b with each equation including the appropriate polarity for the term in view of the direction charges will flow based on the initial charge allocation (i.e., current will flow from node A to node B because positive charges have been placed at node A and negative charges have been placed at node B).

Additionally, $\Delta_{AB,i}/\Delta t$ can be viewed as the current flow (I) from node A to node B for the current iteration where $\Delta t$ is the time increment of each iteration. The change in current from the prior iteration to the present iteration can therefore be expressed as $$\frac{\delta I}{\delta t} = \frac{\Delta q_{AB,i} - \Delta q_{AB,i-1}}{\Delta t^2} \quad \text{Eqn. 12c(i)}$$

where $\Delta t$ is the time increment of the simulation, and, again, $\Delta q_{AB,i}$ is minus the flow of negative charge from node B to node A during the present iteration, and, $\Delta q_{AB,i-1}$ is minus the flow of negative charge from node B to node A during the prior iteration. The induced EMF across the inductor, $\varepsilon_L$, can therefore be expressed as:

$$\varepsilon_L V = L\frac{\delta I}{\delta t} = L\frac{\Delta q_{AB,i} - \Delta q_{AB,i-1}}{\Delta t^2} \quad \text{Eqn. 12c(ii)}$$

where L is the inductance of the inductor.

From Eqns. 12a, 12b and 12c(ii), Equation 11 can be expressed as:

$$\left[\frac{1}{C_A} + \frac{1}{C_B} + \frac{L}{\Delta t^2}\right][\Delta q_{AB,i}] = \left[\frac{q_{A,i-1}}{C_A} - \frac{q_{B,i-1}}{C_B} + L\frac{\Delta q_{AB,i-1}}{\Delta t^2}\right]. \quad \text{Eqn. 13}$$

Here, in the above Eqn. 13, all terms are known except $\Delta q_{AB,i}$. As such, Eqn. 13 can be solved for $\Delta q_{AB,i}$. Thus, for the exemplary circuit of FIGS. 7a-7e, referring to FIG. 6, in an embodiment, Eqn. 13 corresponds to the expression that is developed 613 by the simulator from the identified current loop. The solving of Eqn. 13 for $\Delta q_{AB,i}$ corresponds to the solving 614 for the current in the current loop 705, for the present iteration, as its change in charge in the time increment of the simulator iteration.

$\Delta q_{AB,i}$ literally determines how many negative charges leave node B for node A during the present iteration. For instance, if $\Delta q_{AB,i}$=−2q and each charge in the circuit is assumed to have a magnitude of 0.1 units of charge, twenty negative charges are to flow from node B to node A.

Thus, note that the per iteration "output" of the circuit simulator is very comparable to the per iteration output of the free space simulator for free electrical charges. That is, a number of charges are defined, the polarity of these charges are defined, and the directions of motion of these charges are defined.

Finally, the change in charge at each node is calculated 614. Thus, again, if $\Delta q_{AB,i}$=−3q for the first iteration, the change in charge for node A is $\Delta q_{A,i}$=−3q and the change in charge for node B is $\Delta q_{B,i}$=+3q. The example values for $\Delta q$ used here are chosen to illustrate the qualitative behavior of the circuit. Note that in an actual simulation, the values may be different than those illustrated in this example. Referring then back to FIG. 5, at the completion of the circuit simulation process 503 for the first iteration, new positions and corresponding motions for free objects (the magnet 702 and free charge 703 in the example of FIGS. 7a-7e) are defined, and, the number of charges in the circuit, the polarity of such charges and their motion within the circuit is defined. Any user input 504 is accounted for (assume none is entered for the first iteration) and the new state is rendered 505 on the display. Here, the new state corresponds to the motion of the free charge 703 towards the negative sphere B, and, the motion of the charges within the circuit.

FIG. 7c presents an exemplary depiction of the rendered display of the results of the first iteration (the circuit model at inset 704 is shown for the reader's reference and in various embodiments is not rendered on the display). Here, the user will observe the free charge 703 moving to sphere B and will observe a number of negative charges flowing from sphere B to sphere A through the wire. For the sake of example, node A is assumed to lose three units of positive charge and node B is assumed to lose three units of negative charge resulting in +2q remaining charge on sphere A and −2q remaining charge on sphere B. Changing charge/voltage levels on circuit nodes can be rendered, e.g., by changing colors (e.g., the more positive a node, the brighter red it becomes and the more negative a node the brighter blue it becomes, or by adding positive or negative charges to the node). FIG. 7c also depicts the electric field between spheres A and B that was calculated by the free space simulation for the first simulation. In an embodiment, imagery like that observed in FIG. 7c for the fields is able to be rendered so the user can view them. Optionally (e.g., based on user preference) the fields are not rendered.

Referring back to FIG. 5, the process then begins a new (second) iteration. Here, with respect to the circuit, the change in charge for both of nodes A,B that was determined 614 at the end of the circuit simulation is used to determine a new charge for each of spheres A and B. That is, each new iteration starts with a new amount of charge for each node in the circuit. In the case of the present example, assuming $\Delta q_{A,i}$=−3q and $\Delta q_{B,i}$=+3q from the prior (first) iteration, the next (second) iteration starts from an initial state of the charge on sphere A=+2q and the charge on sphere B=−2q. The initial state also includes the motions of the free charge 703 and the charges in the circuit.

From this initial state, the free space simulation 501, 502 determines: 1) the electric fields between the spheres A, B; and, 2) the magnetic field from the flow of charges in the circuit (for ease of explanation, the force on the moving charges in the circuit from the magnet 702 is ignored as is the magnetic field created by the moving free charge 703). With respect to the former, because there is less charge difference between the spheres, the electric field between the spheres will not be as strong and the acceleration of the free charge's motion toward sphere B will diminish. The new position and vector motion that is calculated for the free charge 703 for the second iteration will reflect the slowing acceleration (e.g., its new position will reflect a distance traveled between iterations that corresponds to slowing acceleration).

With respect to the magnetic field generated by the current flow in the circuit, the inductor essentially creates a magnetic field because its physical construction consists of multiple loops of current. Here, as each loop creates a magnetic field, the strength of the magnetic field that is created by the inductor is a function of the current through the circuit (which flows through each loop of the inductor) and the number of current loops in the inductor. The free space simulation 501, 502 will also determine the rotational motion of the magnet 702 in response to the magnetic field that is generated by the inductor.

Thus, at the conclusion of the free space simulation 502, 502 of the second iteration, the respective new position and motion of both the free charge 703 and the magnet 702 will have been determined. When the circuit simulation 503 is executed, Eqn. 13 is resolved for $\Delta q_{AB,i}$. Because the potential difference between the spheres is less than the initial iteration (the charge difference was +10q prior to the first iteration and is +4q for the second iteration), less current will flow through the circuit. For the sake of example, assume $\Delta q_{AB,i}$ for the second iteration is −2q for sphere A and +2q for sphere B.

FIG. 7d shows the rendered image from the second iteration (again, the circuit model at inset 704 is shown for the reader's reference and in various embodiments is not rendered on the display). Here, the weaker electric fields between spheres A and B are shown as is the magnetic field generated by the moving charges within the circuit from the first iteration (again, in various embodiments, the rendering of these fields is optional). The rotation of the magnet 702 in response to this magnetic field is shown. The moving charges in the circuit are also shown.

Referring back to FIG. 5, the process then begins the third iteration. Here, with respect to the circuit, the change in charge for both of nodes A, B that was determined 614 at the end of the circuit simulation is again used to determine a new charge for each of spheres A and B. In the case of the present example, assuming $\Delta q_{A,i}=-2q$ and $\Delta q_{B,i}=+2q$ from the second iteration, the third iteration starts from an initial state of the charge on sphere A=0q and the charge on sphere B=0q. The initial state also includes the motions of the free charge 703, the motions of the charges in the circuit and the rotation of the magnet 702.

From this initial state, the free space simulation 501, 502 determines: 1) the electric fields between the spheres A, B; 2) the magnetic field from the flow of charges in the circuit; and, 3) the electric field (or electro-motive force, EMF) that is induced in the inductor from the current in the circuit (again, for ease of explanation, the force on the moving charges in the circuit from the magnet 702 is ignored as is the magnetic field created by the moving free charge 703).

With respect to the electric fields between the spheres, note that there is no charge difference between the spheres at the start of the third iteration. As such there is no electric field between the spheres and the free charge will no longer accelerate toward sphere B. The new position and vector motion that is calculated for the free charge 703 by the free space calculations 501, 502 for the third iteration will therefore reflect ceased acceleration (e.g., a new position that reflects constant velocity toward sphere B from the prior iteration).

With respect to the magnetic field that is created by the flow of charges in the circuit, note that the magnet rotated a maximum amount during the second iteration and practically aligned itself with the magnetic field that was generated by the inductor. Moreover, the flow of current after the second iteration is less than the flow of current after the first iteration resulting in a somewhat weaker magnetic field being created in the third iteration as compared to the second. As a consequence of already being substantially aligned with the magnetic field and being subjected to a weaker magnetic field, the free space magnet will hardly rotate in the third iteration. As such, the free space calculations 501, 502 for the third iteration will generate a new position for the magnet that is hardly changed from its position from the prior (second) iteration.

With respect to the induced EMF that is generated in the inductor by the current that flows through the circuit, the third iteration will base its induced EMF calculation from the amount of magnetic flux change within the inductor. Here, with a maximum magnetic field having been generated by the inductor in the second iteration, the third iteration will determine that a maximum change in magnetic field occurred between the second and first iterations (a maximum magnetic field was determined from the second iteration and no magnetic field was determined from the first iteration). As such, the free space simulations of the third iteration 501, 502 will determine that a maximum EMF is generated across the inductor.

Thus, when the circuit is simulated 503 for the third iteration, even though there is no net charge difference across the spheres A, B which would otherwise cease generation of electrical current in the circuit, the large EMF that is generated across the inductor will nevertheless cause charges to continue to flow through the circuit such that sphere A continues to receive negative charge and sphere B continues to receive positive charge. Here, the simulator has essentially simulated an inductor's propensity to sustain its current flow (said another way, a voltage is generated across the inductor that counteracts the voltage that was originally placed across it). For the sake of example, assume the circuit simulation for the third iteration determines that the induced EMF current flow corresponds to $\Delta q_{A,i}=-4q$ and $\Delta q_{B,i}=+4q$.

FIG. 7e shows the display after the results of the third iteration are rendered. Here, Sphere A has a net charge of −4q and sphere B has a net charge of +4q. Charges are moving in the circuit in accordance with the induced EMF that was calculated for the inductor. The magnet has rotated a negligible amount and the free charge has stopped accelerating toward sphere B.

With the start of the fourth iteration, the free space simulation 501, 502 will determine that an electric field exists between spheres A and B but the direction of the field is opposite that of the electric field that initially existed between the spheres. That is, whereas the initial electric field ran from positive sphere A to negative sphere B, by contrast, the free space simulation 501, 502 of the fourth iteration will determine that the electric field runs from positive sphere B to negative sphere A. As such, the free space simulation 501, 502 for the fourth iteration will determine that the free charge 703 will presently reverse direction and begin accelerating toward sphere A.

Also, recalling that the third iteration determined that a somewhat weaker magnetic field was generated by the inductor due to the reduction in current flow that occurred in the second iteration. Nevertheless, the difference between the somewhat weaker magnetic field of the third iteration and the maximum magnetic field of the second iteration corresponds to considerably less change in magnetic flux as compared to the difference between the first and second iterations (maximum magnetic flux and no magnetic flux). As such, the fourth iteration will calculate a noticeably reduced EMF across the inductor.

For the sake of example, assume that the circuit simulation 503 for the fourth iteration determines that the induced EMF adds only one unit of positive charge to node B and one of negative charge to node A for the circuit simulation so that sphere B has +5q units of charge and sphere A has −5q units of charge. Here, with positive charge still flowing into sphere B, in an embodiment, the circuit simulation will delay calculation of circuit currents driven by the difference in charge on the spheres until the EMF current has reduced to zero (the induced EMF current charges spheres A and B until no more EMF current exists, after which, spheres A and B are permitted to drive current through the circuit).

FIG. 7f shows the rendered display after the fourth iteration. At this point, the state of the system is "opposite" that of the initial state of the system of FIG. 7a (where sphere A had +5q units of charge and sphere B had −5q units of charge).

Subsequent iterations will demonstrate a flow of current from sphere A to sphere B and generation of a magnetic field and induced EMF that is opposite to those described above with respect to iterations one through four. Ultimately, with no energy loss the state of FIG. 7a will again be reached so that the simulated circuit will be observed to behave as an oscillator. However, energy is needed to accelerate the free charged conductor and rotate the magnet, therefore, the simulation of FIG. 7a would ultimately reach a resulting state with slightly less charge per node so that the simulated circuit would behave as an oscillator with decaying currents/charges/fields per oscillation cycle.

The coupling between the accelerating free charge 703 and the rotating magnet 702 and the circuit behavior can also be simulated. Here, any change in the magnetic field in the loops of the inductor due to the spinning magnet will create an induced EMF (i.e., voltage) across the inductor. Therefore, we can expand the expression for the EMF in equation 11 to include this effect.

$$\varepsilon = L\frac{\delta I}{\delta t} - \frac{\delta\left(\int \vec{B}\cdot\vec{\delta A}\right)}{\delta t} = L\frac{\Delta q_{AB,i} - \Delta q_{AB,i-1}}{\Delta t^2} - \frac{\varphi_i - \varphi_{i-1}}{\Delta t} \quad \text{Eqn. 14}$$

where $\varphi_i = \int \vec{B_i}\cdot\vec{\delta A}$ is the total magnetic flux through the loops of the inductor at iteration i. This flux can be calculated by numerically integrating the magnetic field over the area of each loop. The change in flux determines the induced voltage, so that in this example anytime the magnet spins (either because of the magnetic field from the inductor, or from the user spinning the magnet), there will be a voltage induced across the inductor. Thus, the link between the circuit and the magnetic field in physical space is bi-directional.

Eqn. 11 (and ultimately Eqn. 13) can be readily expanded to include the terms of Eqn. 14 (and therefore account for the physics described by Eqn. 14). That is, with respect to the simulator's operation, $\varphi_i$ of Eqn. 14 is determined during the free space magnetic field calculations 501, 502 of the current iteration leaving $\Delta q_{AB,i}$ as the only unknown that is solved for by the following circuit behavior calculations 503 for the current iteration ($\varphi_{i-1}$ and $\Delta q_{AB,i-1}$ are known from the prior iteration).

Similarly, the free charge 703 will electrically induce a voltage on both the top A and bottom B conductors. This can be modeled by including a voltage term in $V_{C_A}$ and $V_{C_B}$. Similar to Eqn. 1 which describes the electric field in free space due to a point charge, we can define the voltage at any point in space due to a point charge:

$$= \frac{q}{\epsilon r},$$

where q is the charge and r is the distance from the point charge to the point in space. To sufficient approximation, the free charge 703 will therefore induce a voltage at the top conductor of $$V_{FA} = \frac{q_F}{\epsilon r_{FA}},$$

where $q_F$ is the charge on the free charge 703, and $r_{FA}$ is the distance between the free charge and the top conductor A. Similarly, the bottom conductor B will have an induced voltage of $$V_{FB} = \frac{q_F}{\epsilon r_{FB}}.$$

These voltages can be included in the conductor voltages as shown in Eqn. 15:

$$\sum V_{loop} = \left(\frac{q_{A,i}}{C_A} + \frac{q_F}{\epsilon r_{FA}}\right) - \left(\frac{q_{B,i}}{C_B} + \frac{q_F}{\epsilon r_{FB}}\right) = \quad \text{Eqn. 15}$$

$$L\frac{\Delta q_{AB,i} - \Delta q_{AB,i-1}}{\Delta t^2} - \frac{\varphi_i - \varphi_{i-1}}{\Delta t} = \varepsilon$$

Because $q_F$ and $r_F$ are known, $\Delta q_{AB,i}$ is the only unknown and can be solved for by the following circuit behavior calculations 503 for the current iteration. Thus, Eqn. 15, like Eqn. 14 is easily incorporated into Eqn. 13.

The simulator can also be extended to handle other common circuit components. A parallel plate capacitor can be handled as two circular disks. If the disks are close together, the charge density described by Equation 10a can be approximated as uniform and the electric field at any point in space can again be efficiently calculated. Similar to the conducting spheres in FIG. 7a, these plates can be included in both the free-space and circuit portions of the simulator.

A two-terminal resistor can be modeled as a parallel plate capacitor with a partially conductive (semi-conductive) material inside. The free-charges inside the resistor move in response to the electric field between the two plates of the resistor, but their motion is impeded (resisted) by the material. In various embodiments, voltage and current are the independent variables, and a function is defined for the resistor model that links the voltage/current behavior. In an embodiment, this function is the well-known V=IR, where R is the resistance.

The simulator uses a charge-based approach, and models how the charges move through the semi-conductive material. The electric field accelerates ($\vec{F}=m\vec{a}$) the free charges until they hit an obstacle. If the resistive material is semi crystalline, like a metal or semiconductor, this obstacle may be a crystal lattice edge or an impurity. The kinetic energy of the charge in converted into heat or light, slowing and scattering the charge. Thus, the classical Drude approximation of a resistor is simulated and visualized. Note that this classical model is used to illustrate the behavior. Other, more accurate illustrations could be used, perhaps involving the quantum behavior of real resistors. Once a charge contacts either of the two conducting disks, the charge is transferred to that conductor, and the change on that node is taken into account during the next simulation cycle (process 503 of FIG. 5). In many ways, this model is more accurate than a constant resistance as the stochastic nature of the charges inside the resistor and the temperature dependence can both be included and visualized. Similar, multi-terminal models can be constructed for transistors, diodes, and other semi-conducting components.

A battery can be modeled as a parallel plate capacitor with a reservoir of neutral charges inside and something supplying energy to separate those neutral charges against the electric field. In most simulators, a battery is defined as a constant voltage source (V equals some fixed amount, and the current can take on any value). In various embodiments, the simulator uses a charge-based approach instead of voltage. At each update cycle, the battery model checks if the desired charge difference, $\Delta Q$, appears across its two terminals. If $\Delta Q < \Delta Q_{desired}$, one of the neutral charges from the reservoir is separated with an initial velocity (kinetic energy can be used to illustrate the chemical work done by the battery to overcome the electric field between the two conductors). Note that this kinetic energy is only a substitute used to illustrate the chemical work function, and other illustration methods could be used. If the reservoir of neutral charges is not infinite, once that reservoir is depleted, the battery is "dead". If $\Delta Q > \Delta Q_{desired}$, the electric field would overcome the intrinsic chemical work function of the battery. Any excess charges ($\Delta Q - \Delta Q_{desired}$) would be re-combined. The newly combined neutral charge could be re-added to the reservoir, effectively recharging the battery.

5.0 Computer Implementations Revisited

Section 3.0 described at length some work sharing that can exist between a CPU and GPU in a computing system (such as a tablet computer). Here, substantially all the comments made above in Section 3.0 are applicable to a system that includes circuit simulation. That is, although the discussion of Section 3.0 made significant reference to processes 301, 302 and 304 of FIG. 3, these same statements can equally apply to processes 501, 502 and 505, respectively of FIG. 5. In essence, the points made in Section 3.0 are equally applicable to a system in which the CPU is also performing circuit simulation. Generally the CPU performs the circuit simulation calculations, although various embodiments may include the GPU calculating some or all circuit simulation calculations to off load the task from the CPU.

6.0 Education of Electro-Magnetic Systems with the Simulator

With the structure and operation of various simulator embodiments having been described above, it is pertinent to point out that the combination of user interaction and real time simulation effected on, e.g., a low-end tablet processor result in a useful tool for comprehending or learning complex laws of physics that have traditionally been taught only through complex mathematics. That is, traditional education of electro-magnetics has focused on derivation of complex mathematical expressions, which, in turn, has resulted in the overall subject matter being extremely difficult to comprehend for many, and/or, elusive or difficult to comprehend, at least at first, for those who ultimately are successful comprehending the material.

Instead, the instant simulator is able to provide the user with an "intuitive feel" as to how electro-magnetic systems behave. With an early/initial intuition of electro-magnetic systems behavior, it is believed that the overall subject matter will be more easily comprehended and/or less intimidating at first. That is, it is believed that the instant simulator eases the difficulty of learning the subject matter which, in turn, results in more students learning the material faster or more efficiently as compared to traditional teaching methods, and, possibly, ultimately, more students overall who successfully comprehend the material.

For instance, recalling the above described example of a circuit with an inductor and external magnet, in real time, a student can continually increase the charge on the spheres over multiple successive iterations resulting, as immediately observed on the screen by the student, increasingly stronger currents flowing through the inductor (the student will see more and more charges flowing through the circuit), and, an increasingly faster spinning magnet (the student will see the magnet spinning faster and faster as the student adds more charge to the spheres).

As another example, a student can continually change the dimensions of a resistor over successive iterations, such as increasing its width, and immediately observe in real time the electrical current increasingly flow faster through the resistor (because the increase in width increases the resistor's surface area which decreases its resistance). Similarly, over successive iterations, a student can continually add more and more charge to a node, or to a battery, and visually observe in immediate real time in response the current increasing within the circuit (more and more charges will flow through the circuit). As alluded to above, such increasing currents will, e.g., cause any proximate magnets to increase their respective speeds of rotation as observed by the student in immediate real time response.

Thus the simulator permits the student to instantaneously change the environment being simulated and the simulator will immediately, in real time, render on the screen the behavior of the system as it would behave with the newly introduced change. The student is therefore free to "experiment" over a range of, e.g., extremes, directions, polarities, sizes, magnitudes, etc. By comprehending, through immediate real time observance of the system's behavior in response to such experimentation, the student is able to intuitively comprehend how electric and magnetic objects interact with one another, thus bringing an intuitive sense and feel for such systems to the student.

Industrial applications are also conceivable. For example, early stages of electric motor and/or electric generator designs may make use of the simulator, configured with, e.g., specific conductive structures, magnet shapes, etc. to quickly test, observe and evaluate different design choices (including extremes) as to the physical/mechanical layout structure of the motor. Here, for instance, more efficient designs will yield greater torques/EMFs, etc. for a same input current/rotation that should be immediately observable on the display as, e.g., a design engineer "tweaks" the dimensions/sizes/placements of specific motor components.

6.0 Closing Comments

Figure 8:
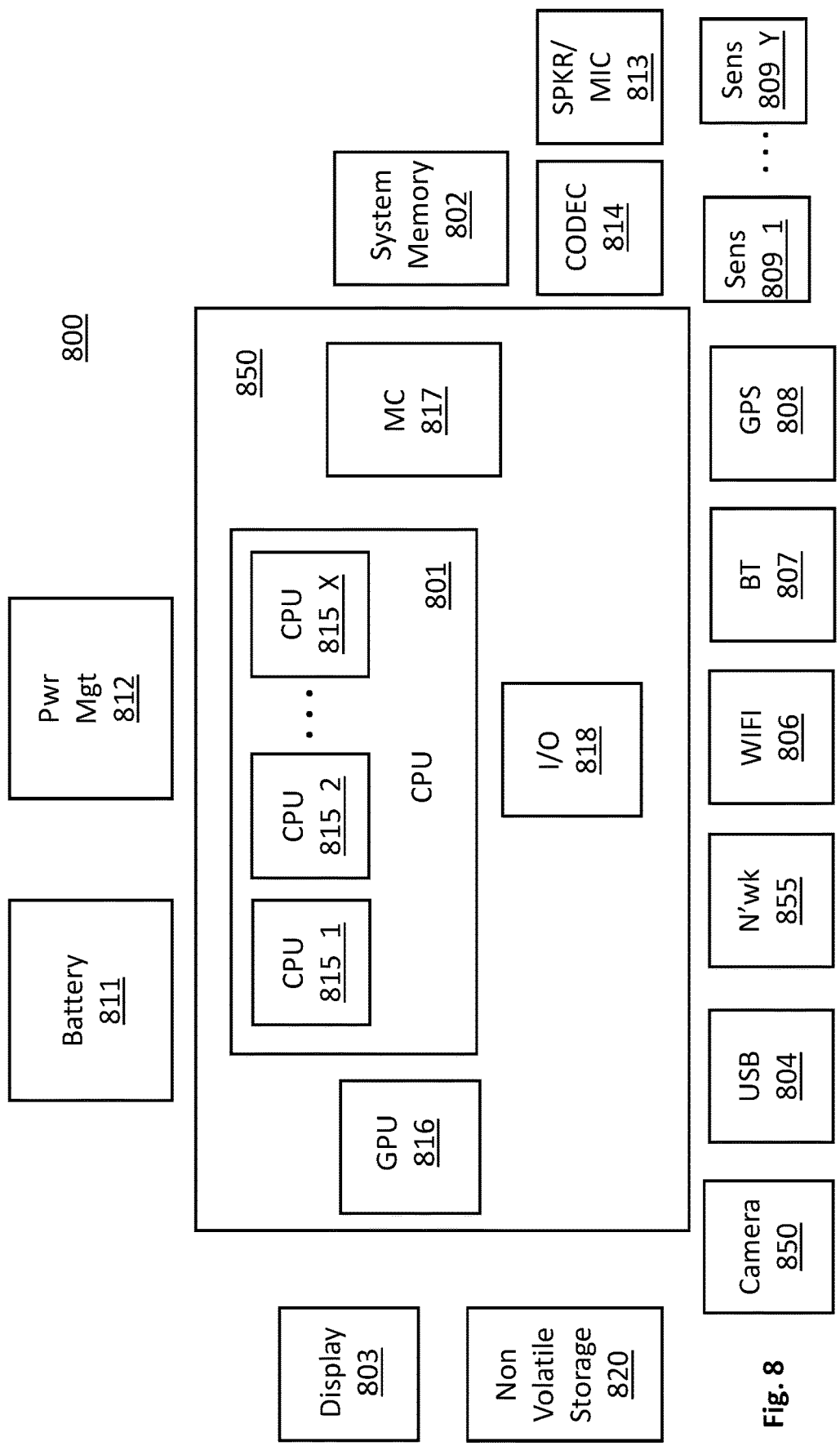
FIG. 8 depicts a computing system.

FIG. 8 provides an exemplary depiction of a computing system 800 (e.g., a smartphone, a tablet computer, a laptop computer, a desktop computer, a server computer, etc.). As observed in FIG. 8, the basic computing system 800 may include a central processing unit 801 (which may include, e.g., a plurality of general purpose processing cores 815_1 through 815_X) and a main memory controller 817 disposed on a multi-core processor or applications processor, system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_Y, one or more cameras 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units (GPUs) 816, a memory management function 817 (e.g., a memory controller) and an I/O control function 818. The general purpose processing cores 815 typically execute the operating system and application software of the computing system. The graphics processing unit 816 typically executes graphics intensive functions to, e.g., generate graphics information that is presented on the display 803. The memory control function 817 interfaces with the system memory 802 to write/read data to/from system memory 802. The power management control unit 812 generally controls the power consumption of the system 800.

Each of the touchscreen display 803, the communication interfaces 804-807, the GPS interface 808, the sensors 809, the camera(s) 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850. The computing system also includes non-volatile storage 820 which may be the mass storage component of the system.

The computing system 800 may include application software (e.g., stored on the computing system's non volatile mass storage hardware) that performs free space and/or circuit simulations as described at length above in the preceding sections. Here, for instance, the display 803 of the computing system may be touch screen that a user taps on to define simulation environments that are subsequently rendered on the display 803. User input can also be readily accepted through a keyboard and/or mouse device.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A machine readable storage medium, and not a carrier wave signal, containing program code that when processed by one or more processors of a computing system causes a method to be performed, the method comprising:
   calculating electric and/or magnetic fields in free space in response to:
   i) respective positions and motions of one or more charges and/or one or more current loops in the free space;
   ii) charges on nodes in the electrical circuit in the free space;
   iii) charge motions in the electrical circuit;
   calculating new respective positions and motions of the one or more charges and/or one or more current loops in the free space in response to respective forces applied to the one or more charges and/or the one or more current loops by the electric and/or magnetic fields;
   calculating new charges on nodes within the electrical circuit and new charge motions within the electrical circuit in response to the new positions and motions of the one or more charges and/or the one or more current loops in the free space, the charges on the nodes in the electrical circuit and the charge motions in the electrical circuit;
   concurrently rendering on a display of the computing system respective images of the one or more charges and/or the one or more current loops according to the new respective positions and motions and the new charge motions within the electrical circuit; and,
   repeating the above to fluidly render on the display respective inter-active behaviors of the one or more charges and/or the one or more current loops in the free space and the charge motions in the electrical circuit.

2. The machine readable storage medium of claim 1 wherein the method further comprises accepting input from a user that defines the electrical circuit's structure and initial positions and/or velocities of the one or more charges and/or one or more current loops.

3. The machine readable storage medium of claim 1 wherein the method further comprises rendering respective images of the electric and/or magnetic fields on the display.

4. The machine readable storage medium of claim 3 wherein a GPU of the computing system generates display data for the rendering and performs the calculating of the electric and/or magnetic fields in free space.

5. The machine readable storage medium of claim 4 wherein a CPU of the computing system performs the calculating of the new charges on nodes within the electrical circuit and new charge motions within the electrical circuit.

6. The machine readable storage medium of claim 4 wherein the calculating of the electric and/or magnetic fields further comprises executing a multiply accumulate instruction of a processor, the multiply accumulate instruction structured to implement a numerical series expansion approximation of an electric or magnetic field without highest ordered terms.

7. The machine readable storage medium of claim 1 wherein if the electrical circuit includes an inductor and the one or more current loops define a magnet, the method will calculate a magnetic field created by the inductor from the circuit's charge motions, and, calculate a force applied to the magnet from the magnetic field.

8. The machine readable storage medium of claim 7 wherein if the method calculates a motion of the magnet the method will also calculate an effect on the charge motions of the circuit from the motion of the magnet.

9. The machine readable storage medium of claim 1 wherein the method will calculate affects on charges on nodes in the circuit from charges in the free space, and, calculate affects on motions of the charges in the free space from charges on nodes and/or charge motions in the circuit.

10. The machine readable storage medium of claim 1 wherein the one or more charges include a charge distribution on a conductive structure in the free space.

11. The machine readable storage medium of claim 10 wherein the method further comprises:
calculating electric fields from the conductive structure from an electric field expression and charge distribution expression that are both specific to the conductive structure.

12. The machine readable storage medium of claim 1 wherein the one or more current loops include a current distribution on a structure in the free space.

13. The machine readable storage medium of claim 1 wherein the electrical circuit includes any of:
an inductance;
a capacitance;
a battery;
a resistor.

14. A machine readable storage medium, and not a carrier wave signal, containing program code that when processed by one or more processors of a computing system causes a method to be performed, the method comprising:
calculating electric and/or magnetic fields in free space in response to respective positions and motions of one or more charges and/or one or more current loops in the free space, wherein, the calculating of the electric and/or magnetic fields further comprises executing instructions of the one or more processors, the instructions structured to implement numerical approximations of the electric and/or magnetic fields;
determining a charge distribution on a conductive structure in the free space and calculating electric fields from/to the conductive structure from an electric field expression and charge distribution expression that are both specific to the conductive structure;
calculating new respective positions and motions of the one or more charges and/or one or more current loops in the free space in response to respective forces applied to the one or more charges and/or the one or more current loops by the electric and/or magnetic fields and/or the electric fields from/to the conductive structure;
concurrently rendering on a display of the computing system respective images of the one or more charges and/or one or more current loops according to the new respective positions and motions; and,
repeating the above to fluidly render on the display respective inter-active behaviors of the one or more charges and/or the one or more current loops in the free space.

15. The machine readable storage medium of claim 14 wherein the method further comprises accepting input from a user that fluidly introduces on the display additional one or more charges and/or additional one or more current loops while the inter-active behaviors of the one or more charges and/or the one or more current loops are being fluidly rendered in the free space.

16. The machine readable storage medium of claim 14 wherein the method further comprises rendering respective images of the electric and/or magnetic fields on the display along with the respective images of the one or more charges and/or one or more magnetic loops in free space.

17. The machine readable storage medium of claim 14 wherein the conductive structure is a disk or sphere.

18. The machine readable storage medium of claim 14 wherein a number of the one or more charges is able to exceed one hundred and the fluid inter-active behaviors of the more than one hundred one or more charges is fluidly render-able on the display at 60 fps.

19. The machine readable storage medium of claim 14 wherein a central processing unit (CPU) of the computing system performs the calculating of the electric and/or magnetic fields and the calculating of the new respective positions and motions, and, a graphics processing unit (GPU) of the computing system performs the rendering, and wherein the CPU and GPU operate in a pipelined fashion.

20. The machine readable storage medium of claim 14 wherein a GPU of the computing system generates display data for the rendering and performs the calculating of the electric and/or magnetic fields.

21. An apparatus, comprising:
one or more processors; and,
one or more storage devices, the one or more storage devices containing program code that when processed by the one or more processors causes a method to be performed, the method comprising:
calculating electric and/or magnetic fields in free space in response to:
  i) respective positions and motions of one or more charges and/or one or more current loops in the free space;
  ii) charges on nodes in the electrical circuit in the free space;
  iii) charge motions in the electrical circuit;
calculating new respective positions and motions of the one or more charges and/or one or more current loops in the free space in response to respective forces applied to the one or more charges and/or the one or more current loops by the electric and/or magnetic fields;
calculating new charges on nodes within the electrical circuit and new charge motions within the electrical circuit in response to the new positions and motions of the one or more charges and/or the one or more current loops in the free space, the charges on the nodes in the electrical circuit and the charge motions in the electrical circuit;

concurrently rendering on a display of the computing system respective images of the one or more charges and/or the one or more current loops according to the new respective positions and motions and the new charge motions within the electrical circuit; and, repeating the above to fluidly render on the display respective inter-active behaviors of the one or more charges and/or the one or more current loops in the free space and the charge motions in the electrical circuit.

22. The apparatus of claim 21 wherein the method further comprises accepting input from a user that defines the electrical circuit's structure and initial positions and/or velocities of the one or more charges and/or one or more current loops.

23. The apparatus of claim 21 wherein the method further comprises rendering respective images of the electric and/or magnetic fields on the display.

24. The apparatus of claim 23 wherein a GPU of the computing system generates display data for the rendering and performs the calculating of the electric and/or magnetic fields in free space.

25. The apparatus of claim 24 wherein a CPU of the computing system performs the calculating of the new charges on nodes within the electrical circuit and new charge motions within the electrical circuit.

26. The apparatus of claim 24 wherein the calculating of the electric and/or magnetic fields further comprises executing a multiply accumulate instruction of a processor, the multiply accumulate instruction structured to implement a numerical series expansion approximation of an electric or magnetic field without highest ordered terms.

27. The apparatus of claim 21 wherein if the electrical circuit includes an inductor and the one or more current loops define a magnet, the method will calculate a magnetic field created by the inductor from the circuit's charge motions, and, calculate a force applied to the magnet from the magnetic field.

28. The apparatus of claim 27 wherein if the method calculates a motion of the magnet the method will also calculate an effect on the charge motions of the circuit from the motion of the magnet.

29. The apparatus of claim 21 wherein the method will calculate affects on charges on nodes in the circuit from charges in the free space, and, calculate affects on motions of the charges in the free space from charges on nodes and/or charge motions in the circuit.

30. The apparatus of claim 21 wherein the one or more charges include a charge distribution on a conductive structure in the free space.

31. The apparatus of claim 30 wherein the method further comprises:
calculating electric fields from the conductive structure from an electric field expression and charge distribution expression that are both specific to the conductive structure.

32. The apparatus of claim 21 wherein the one or more current loops include a current distribution on a structure in the free space.

33. The apparatus of claim 21 wherein the electrical circuit includes any of:
an inductance;
a capacitance;
a battery;
a resistor.

34. An apparatus, comprising:
one or more processors; and,
one or more storage devices, the one or more storage devices containing program code that when processed by the one or more processors causes a method to be performed, the method comprising:
calculating electric and/or magnetic fields in free space in response to respective positions and motions of one or more charges and/or one or more current loops in the free space, wherein, the calculating of the electric and/or magnetic fields further comprises executing instructions of the one or more processors, the instructions structured to implement numerical approximations of the electric and/or magnetic fields;
determining a charge distribution on a conductive structure in the free space and calculating electric fields from/to the conductive structure from an electric field expression and charge distribution expression that are both specific to the conductive structure;
calculating new respective positions and motions of the one or more charges and/or one or more current loops in the free space in response to respective forces applied to the one or more charges and/or the one or more current loops by the electric and/or magnetic fields and/or the electric fields from/to the conductive structure;
concurrently rendering on a display of the computing system respective images of the one or more charges and/or one or more current loops according to the new respective positions and motions; and,
repeating the above to fluidly render on the display respective inter-active behaviors of the one or more charges and/or the one or more current loops in the free space.

35. The apparatus of claim 34 wherein the method further comprises accepting input from a user that fluidly introduces on the display additional one or more charges and/or additional one or more current loops while the inter-active behaviors of the one or more charges and/or the one or more magnetic current loops are being fluidly rendered in the free space.

36. The apparatus of claim 34 wherein the method further comprises rendering respective images of the electric and/or magnetic fields on the display along with the respective images of the one or more charges and/or one or more magnetic loops in free space.

37. The apparatus of claim 34 wherein the conductive structure is a disk or sphere.

38. The apparatus of claim 34 wherein a number of the one or more charges is able to exceed one hundred and the fluid inter-active behaviors of the more than one hundred one or more charges is fluidly render-able on the display at 60 fps.

39. The apparatus of claim 34 wherein a central processing unit (CPU) of the computing system performs the calculating of the electric and/or magnetic fields and the calculating of the new respective positions and motions, and, a graphics processing unit (GPU) of the computing system performs the rendering, and wherein the CPU and GPU operate in a pipelined fashion.

40. The apparatus of claim 34 wherein a GPU of the computing system generates display data for the rendering and performs the calculating of the electric and/or magnetic fields.

41. A method executed by a computing system, comprising:
- calculating electric and/or magnetic fields in free space in response to:
  - i) respective positions and motions of one or more charges and/or one or more current loops in the free space;
  - ii) charges on nodes in the electrical circuit in the free space;
  - iii) charge motions in the electrical circuit;
- calculating new respective positions and motions of the one or more charges and/or one or more current loops in the free space in response to respective forces applied to the one or more charges and/or the one or more current loops by the electric and/or magnetic fields;
- calculating new charges on nodes within the electrical circuit and new charge motions within the electrical circuit in response to the new positions and motions of the one or more charges and/or the one or more current loops in the free space, the charges on the nodes in the electrical circuit and the charge motions in the electrical circuit;
- concurrently rendering on a display of the computing system respective images of the one or more charges and/or the one or more current loops according to the new respective positions and motions and the new charge motions within the electrical circuit; and,
- repeating the above to fluidly render on the display respective inter-active behaviors of the one or more charges and/or the one or more current loops in the free space and the charge motions in the electrical circuit.

42. A method executed by a computing system, comprising:
- calculating electric and/or magnetic fields in free space in response to respective positions and motions of one or more charges and/or one or more current loops in the free space, wherein, the calculating of the electric and/or magnetic fields further comprises executing instructions of one or more processors of the computing system, the instructions structured to implement numerical approximations of the electric and/or magnetic fields;
- determining a charge distribution on a conductive structure in the free space and calculating electric fields from/to the conductive structure from an electric field expression and charge distribution expression that are both specific to the conductive structure;
- calculating new respective positions and motions of the one or more charges and/or one or more current loops in the free space in response to respective forces applied to the one or more charges and/or the one or more current loops by the electric and/or magnetic fields and/or the electric fields from/to the conductive structure;
- concurrently rendering on a display of the computing system respective images of the one or more charges and/or one or more current loops according to the new respective positions and motions; and,
- repeating the above to fluidly render on the display respective inter-active behaviors of the one or more charges and/or the one or more current loops in the free space.

* * * * *